United States Patent [19]

Kaiser et al.

[11] Patent Number: 4,970,664

[45] Date of Patent: Nov. 13, 1990

[54] CRITICAL PATH ANALYZER WITH PATH CONTEXT WINDOW

[76] Inventors: Richard R. Kaiser, 10810 NW. La Cassel Crest La., Portland, Oreg. 97229; Robert W. Bartel, Rte. 2, P.O. Box 107, Gaston, Oreg. 97119

[21] Appl. No.: 206,184

[22] Filed: Jun. 10, 1988

[51] Int. Cl.$^5$ ............................................. G06F 15/20
[52] U.S. Cl. .................................. 364/521; 364/488; 364/518
[58] Field of Search ................ 364/518, 521, 488–491, 364/443, 444; 340/721, 723

[56] References Cited

U.S. PATENT DOCUMENTS

| | | | |
|---|---|---|---|
| 4,615,011 | 9/1986 | Linsker | 364/491 |
| 4,722,064 | 1/1988 | Suzuki | 364/518 |
| 4,821,220 | 4/1989 | Duisberg | 364/491 X |

OTHER PUBLICATIONS

Product Description from SDA Systems, "TA Timing Analyzer", (4 pages).
Advertisement from SDA Systems, "Timing Analyzer Fast, Programmable Critical Path Analysis", (2 pages).
"AIDA Timing Verifier Technical Spec", (4 pages).
Chiang et al., "Timing Verification for System—Level Designs", SLSI Systems Design, pp. 46–53 (Dec. 1987).
Hara et al., "Timing Analysis Improves Efficiency of ASIC Design", EDN, pp. 195–201 (May 26, 1988).

Primary Examiner—Gary V. Harkcom
Assistant Examiner—H. R. Herndon
Attorney, Agent, or Firm—Klarquist, Sparkman, Campbell, Leigh & Whinston

[57] ABSTRACT

A screen display includes a path context window for displaying a signal path in its entirety apart from the schematic sheets on which the path portions appear. The window contains multiple display portions each graphically displaying a path portion appearing on a separate schematic sheet. The multiple display portions are arranged adjacent to each other to display the entire signal path as continuous. The screen display also includes a path list window and may include view sheet windows each showing a schematic sheet of a path portion in the path context window. A user selects a path from the path list window, which causes a path context window containing the selected path to appear. Selecting a path portion from the displayed signal path causes a view sheet window containing the corresponding schematic sheet to appear. The means for producing the various windows and other features of the screen display is also disclosed.

28 Claims, 4 Drawing Sheets

CRITICAL PATH ANALYZER WITH PATH CONTEXT WINDOW

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

This invention generally relates to electronic design automation apparatus and, more particularly, to an improved critical path analyzer, also referred to as a timing analyzer or timing verifier.

Logic simulation is now an important tool in the design and verification of electronic circuits, including transistor level, gate level, and block level designs. Simulation tests the function of a design by exercising and evaluating circuit logic with a set of input patterns called test vectors. Logic simulators available today have simplified the generation of test vectors and made simulation a time- and cost-efficient method of uncovering many circuit-behavior problems before test-program development or production. A thorough simulation can reveal a variety of errors such as reversed polarities, missed clock periods, or incorrect logic implementation.

Simulation, however, cannot provide complete information about timing errors that occur in circuits employing sequential logic. Signal propagation in sequential logic circuits is not simultaneous. Propagation delays, for example, may influence the arrival time of signals at the several inputs of a single gate. If a signal misses a clock period as the result of such delay, simulation might show an error, but it may not report the signal path that introduced the critical delay. Moreover, if the delay occurs under conditions not exercised by the test vectors, simulation might miss the timing error entirely.

Timing analyzers provide the timing analysis lacking in logic simulators and allow a designer to identify signal paths whose timing is of concern. A signal path is considered to be a sequence of pins through a design that a signal will follow. Although path analysis approaches vary, at the heart of any path-analysis method is the concept of the critical path—the slowest of all signal propagation paths during a given cycle of circuit operation. A timer analyzer that provides critical path analysis typically searches for and identifies the fastest and slowest paths to a destination register in the circuit such as a clocked circuit element.

Prior timing analyzers, nevertheless, suffer from a number of drawbacks that limit their ease of use. One drawback is the difficulty in collecting information on different critical paths in the design. Information on each path is typically found in separate locations throughout the output from the analyzer, either on separate sheets of a printout or on separate terminal screen displays. A designer wanting to gather the different path information together must spend considerable time searching the output for the desired information and then record it.

Another drawback is the difficulty in visually tracing the critical path across the schematic sheets of the circuit. Most timing analyzers merely provide a textual description of the critical path, identifying the path by source and destination pins. It is left to the designer to trace the critical path across one or more schematic sheets to determine the path's circuit components and related signal delays. This process is not only time-consuming, but prone to error. Recognizing this, a timing analyzer available from Silicon Design Automation of San Jose, Calif., is constructed to highlight all critical paths directly on the schematic sheet when viewed on a terminal screen and to indicate delays for each component along path. But this analyzer still requires the designer to page through several screen displays of schematic sheets to view the entire signal path if the path crosses more than one schematic sheet.

SUMMARY OF THE INVENTION

An object of the invention, therefore, is to provide an improved apparatus for displaying paths along which signals propagate through a circuit.

Another object of the invention is to provide such an apparatus that displays in a screen display a signal path entirely, the signal path having portions that appear on separate schematic sheets.

Yet another object of the invention is to provide an apparatus that displays a list of critical signal paths in a screen display.

Still another object of the invention is to provide such an apparatus that displays in a screen display both the list of critical signal paths for selection of a critical path and, upon selection, the entire signal path that may cross several schematic sheets.

In accordance with the invention, a screen display is described for displaying a signal path in its entirety in isolation from the schematic sheets on which the path portions appear. The screen display comprises multiple display portions, each portion graphically displaying in isolation a path portion appearing on a separate schematic sheet. The multiple display portions are arranged adjacent to each other to display the signal path in its entirety in isolation from the schematic sheets.

The screen display includes other features to assist the user in viewing the signal path. Sheet identifiers are included in each display portion for identifying the schematic sheet for the path portion. Separators are shown between path portions for indicating a transition from one schematic sheet to another. A path list display shows a list of signal paths that can be selected for display. Separate schematic sheet displays may also appear in the screen display upon selection of a path portion from the displayed signal path.

Apparatus for displaying the signal path comprises means for accepting data defining signal paths in a circuit and display generator means for producing a display of the signal path entirely in a screen display. In particular, the apparatus may include analyzing means for determining which of the defined signal paths are considered critical. The display generator means responds to the selection of a critical path for producing a display of the selected critical path. Path list generator means may also be included in the apparatus for displaying in the screen display the list of the signal paths for selection.

In the present embodiment, the invention is described and shown in the context of a critical path analyzer for analyzing the timing of signal paths in a circuit design. The screen display includes a path context window that contains the entire signal path across multiple schematic sheets. Accompanying the path context window is a path list window that contains a list of the critical paths. A designer selects a critical path from the list in the window via conventional control means such as a keyboard or mouse. The selected path then appears in the path context window. To view the schematic sheet of a portion of the displayed path, the designer selects the path portion. A view sheet window appears in the screen display in response, displaying the schematic sheet corresponding to the selected portion.

The foregoing and other objects, features, and advantages of the invention will become more apparent from the following detailed description of a preferred embodiment which proceeds with reference to the accompanying drawings.

DETAILED DESCRIPTION

Figure 1:
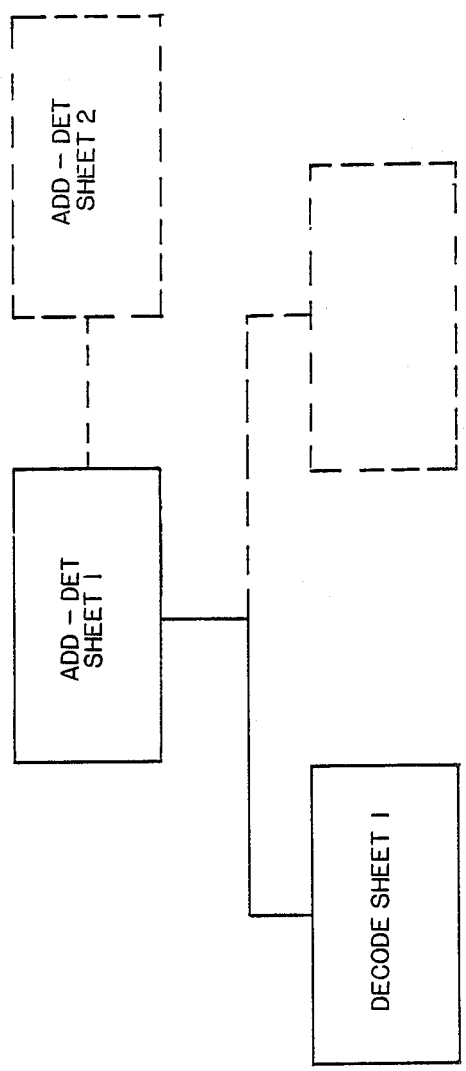
FIG. 1 is a hierarchial view of schematic sheets for a circuit design, each level of the hierarchy representing a different level of hardware modeling.

Referring now to FIG. 1 of the drawings, there is shown a hierarchial view of schematic sheets for a circuit design. These "sheets" are created by a designer on a computer using a computer program known as a schematic editor or schematic capture package. Schematic editors are known in the art and are available from a number of sources including Mentor Graphics of Beaverton, Oreg.; Daisy Systems of Mountain View, Calif.; and Valid Logic Systems of San Jose, Calif. With a schematic editor, a designer can create a hierarchy of design levels, with each level representing a different level of hardware modeling. For example, in FIG. 1, the top level of schematic sheets is the most general design. The lower level is more specific, with each sheet corresponding to an individual component which the designer wishes to model. Each level of design is given a filename, and the sheets within each filename are individually numbered. For purposes of describing the present invention, it will be assumed that a designer has designed a circuit with two levels of modeling. The top level is labeled with the filename ADD_DET and includes at least one sheet and possibly more as indicated by the adjacent sheet shown in dashed lines. The lower level is labeled with the filename DECODE, referring to a component within sheet 1 of ADD_DET and includes at least one sheet. Other components may also be shown more explicitly on schematic sheets at the second level, as indicated by the dashed box at the lower level in the figure. The circuit data entered graphically by the designer via the schematic editor includes component symbols taken from a library and connections between the components to create the circuit. The components so entered are referred to in the art as "instances" and the wire connections between instances as "nets." As will be described, this data is placed by the schematic editor in various data structures where it can be accessed by other design automation packages such as fault simulator, logic simulators, and timing analyzers.

The present invention is described in the context of a timing analyzer, in particular, a critical path analyzer. The critical path analyzer accepts data from a schematic editor or equivalent apparatus, defines signal paths from that data, and determines which of the defined signal paths are considered critical in terms of timing. It should be understood, however, that the present invention is not limited to use with a timing analyzer. The invention as described and claimed herein may be practiced in any electronic design automation apparatus where signal paths are an object of interest.

THE SCREEN DISPLAY

Figure 2:
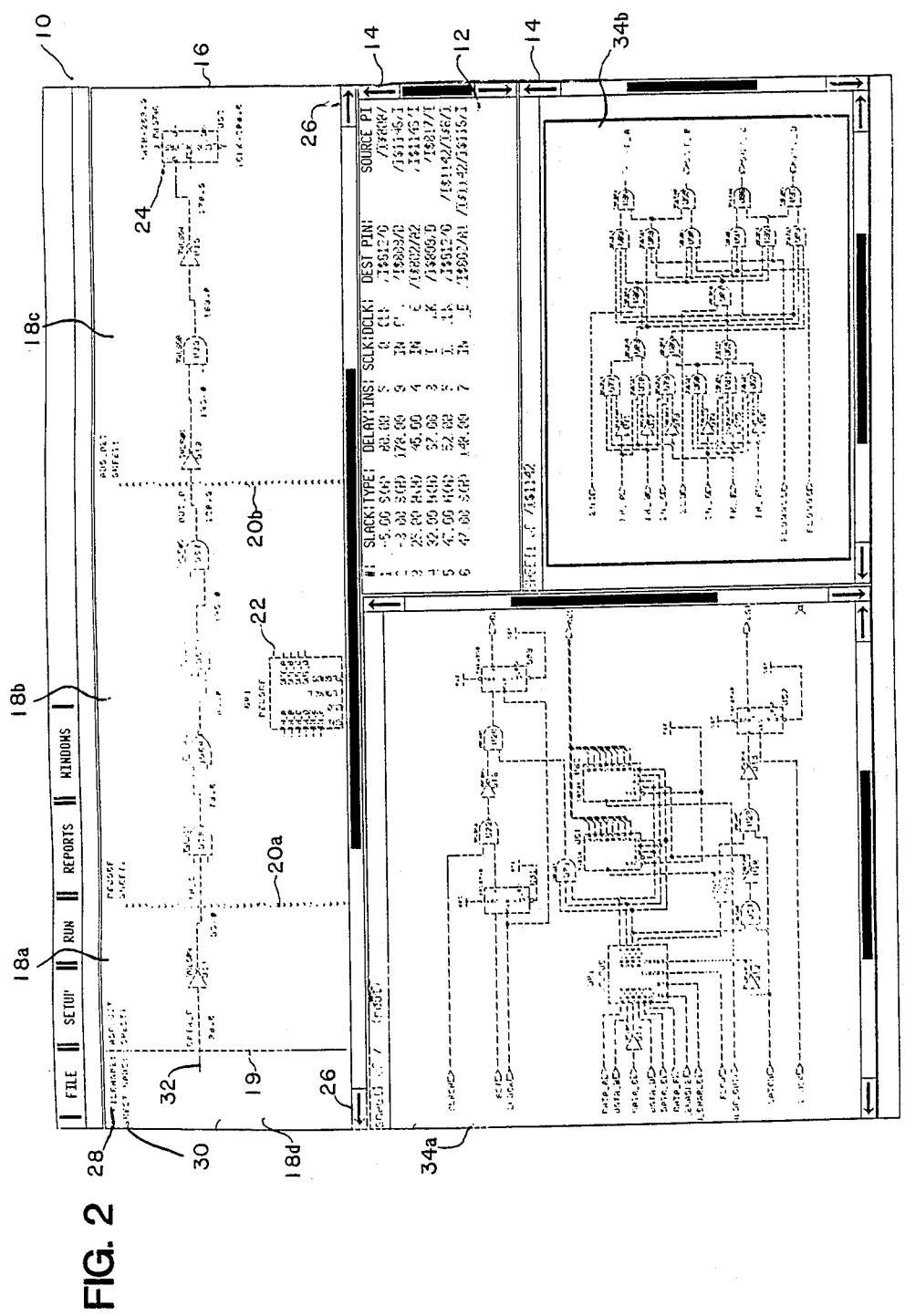
FIG. 2 is a screen display generated by apparatus according to the invention, the screen display including a path context window, path list window, and view sheet windows.

Referring now to FIG. 2 of the drawings, there is shown a screen display 10 generated by apparatus according to the present invention. The screen display 10 appears on terminal screen after the designer/user has run a critical path analysis with a critical path analyzer running on an associated computer. An equivalent permanent copy of the display 10, of course, may be produced from the display 10 with the use of a printing device. In the right portion of the display 10 appears a path list window 12 for displaying a list of signal paths determined to be critical by the analyzer. The paths are indicated by numbered rows and include data such as the source and destination pins for the path, whether the path signal arrived early or late relative to the clock signal for the destination register, the delay through the path, the number of instances in the path, etc. Unlike prior analyzers, however, all the critical paths are collected in this common location, window 12, for view by the user. If more paths exist than are shown in the window 12, the window may be expanded by selecting and moving arrows 14 via conventional control means such as a touch screen, pointer and mouse, or cursor and keyboard, etc.

A critical path may be selected from the path list window 12 via the control means for display of the path in its entirety apart from the schematic sheets. Upon its selection, a critical path is displayed in a path context window 16. As shown in FIG. 2, the path context window has a number of display portions of variable width for displaying path portions from separate schematic sheets. Together these display portions display a signal path in its entirety in a screen display such as window 16. For exmple, with path 2 selected from window 12, a first display portion 18a graphically displays in isolation a path portion appearing on sheet 1 of filename ADD_DET apart from the schematic sheet, as indicated by a sheet identifier in the upper left corner of the display portion. The display portion 18a is defined by a path boundary 19 indicating the beginning of the path and a separator 20a indicating a transition to another schematic sheet. Within the display portion 18a are shown the instances and nets comprising the path portion. Also included is other data for the user, such as the name of the primary input, the circuit and commercial designations for the instance and the cumulative signal delay along the path after each instance.

A second display portion 18b adjacent to the first portion 18a continues the signal path 2 by displaying a second path portion in isolation apart from its schematic sheet. Separator 20a, situated between the two display portions, is constructed of "down" arrows to indicate a transition to another sheet at a lower design level. A sheet identifier in the upper left corner of the display portion indicates that the path portion is found on sheet 1 of filename DECODE. This schematic, as will be described, shows the internal design of a decoder found in sheet 1 of filename ADD_DET. To assist the user in determining that this chip is the source of the path portion, a symbol 22 for the component is displayed in the display portion 18b adjacent to the path portion. Display portion 18b is bounded on its right by separator 20b. Because the following path portion continues on a higher level schematic sheet, separator 20b is constructed of "up" arrows to indicate the upward transition. If the following path portion had continued on an equal level schematic sheet, separator 20b would have indicated so with a vertical, line.

A third display portion 18c adjacent to the second portion continues the signal path 2 and displays the final path portion in isolation apart from its schematic sheet up to the path's termination at a destination register 24. The information displayed within the final display portion is of similar type to the information displayed in the other display portions. Also displayed is the cumulative signal delay tPath through the path relative to a reference and the clock delay tCLK for register 24 relative to the reference. As shown in display portion 18c, tPath equals 203.0 nanoseconds and tCLK equals 200.0 nanoseconds. The signal in path 2 thus arrives late, 3 nanoseconds after the clock signal for register 24. This information is also shown in the path list window 12 as the slack time.

The number of display portions depends on the number of schematic sheets crossed in the arrangement of components on each schematic sheet. The width of each display portion depends upon the number of instances within each portion and the length of each net between each instance. The entire signal path, regardless of the number of display portions, may be displayed within the path context window 16. If the signal path exceeds the size of the window 16, the control means can be employed for actuating arrows 26 to scroll the path horizontally.

The path window 16 also includes a prolog display portion 18d adjacent to the left side of the path boundary 19. Display portion 18d includes filename and sheet name headers 28 and 30, respectively, and a stub net 32 that connects to the input pin of the selected path.

Prior analyzers, by contrast, can only show one path portion at a time, highlighted within its respective schematic sheet. To view the entire path, the user must search through each schematic sheet at each relevant design level to trace the entire path.

To view the actual schematic sheets that contain the selected signal path in context, the user selects a path portion from path context window 16, again via conventional control means. Upon selection of a path portion, the corresponding schematic sheet is displayed in a separate schematic sheet display such as view sheet window 34. In FIG. 2, view sheet window 34a shows sheet 1 of ADD_DET that includes the first and final path portions of path 2. View sheet window 34b shows sheet 1 of DECODE and displays the internal gate circuitry of the decoder chip, represented by symbol 22. The decoder chip, it can now be seen, is represented in sheet 1 of ADD_DET as a functional block. At the lower design level in sheet 1 of DECODE, the individual gates, input pins, and output pins of the decoder chip are displayed.

To assist the user in detecting the selected path in the view sheet windows, the selected path is displayed in contrasting indicia to the screen display by highlighting the path against the background of the schematic sheet. The highlighting may be done both in the path context window 16 and in view sheet windows 34a, 34b if either is open for view.

Figure 3:
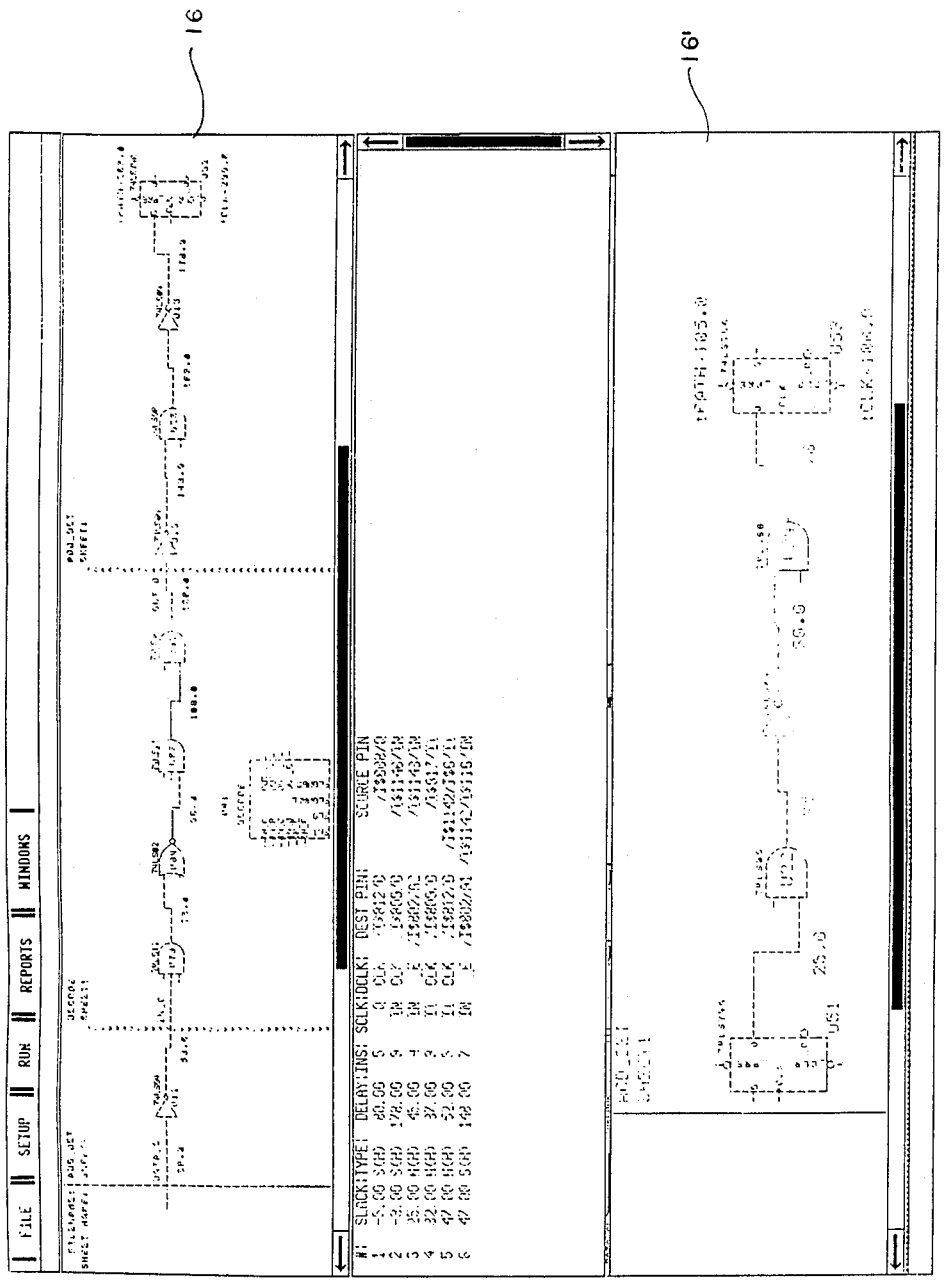
FIG. 3 is a second screen display generated by the apparatus which shows multiple path context windows.

FIG. 3 illustrates that multiple path context windows 16 and 16' can be simultaneously displayed if so desired. A path context window is closed and the displayed path removed by the user via the control means.

THE DISPLAY SCREEN GENERATOR

The screen display 10 and its features heretofore described is generated by source code written in C++. A copy of the code is attached as Appendix A. The source code uses data from graphics, connectivity, and path data structures, to be described, to generate the screen display. The source code refers to many ancillary functions and classes for data access and drawing functions. Although the source code for these functions is not included to maintain a focus on the invention, one skilled in the art could easily generate such code from each function's name. For example, the function new_picture creates a window to draw in; the function init_point marks an initial point for drawing; the function terminal_point terminates a line for drawing, etc.

The algorithm employed in the source code for generating the screen display 10 is best understood by reference to the following pseudo-code. It will be recognized by those skilled in the art that equivalent algorithms could be so employed for generating the screen display 10. In reading the pseudo-code, the following should be noted. The operators!=, ==, =, represent "not equal to,""equal to," and "is assigned," respectively. Constant values are capitalized. The string "//" precedes comments. Procedure invocations are identified by the suffix "( )." All procedures are found in an explicit procedure block. Parameters to a procedure are found within the "( )." Indentation within a procedure block is significant. The procedures include the following:

path_list produces the path list window 12 (also referred to as the graphical context window);

path_context produces the path context window 16;

drawProlog produces the prolog to the path within window 16, including the filename and sheet name headers 22 and 24;

drawSheetBoundary draws boundaries between path portions;

drawInst draws instances within the selected path;

drawNet draws nets within the selected path;

view_selected_sheet creates a view of the schematic sheet that contains the selected object, i.e., component;

select places the supplied object into the list of selected objects;

hilite changes the indicia against the background of the screen display to highlight the object as displayed in various windows on the display; and identify_object returns the object that is represented by the graphics that are closest to the graphical point provided to it in the provided window.

Figure 4:
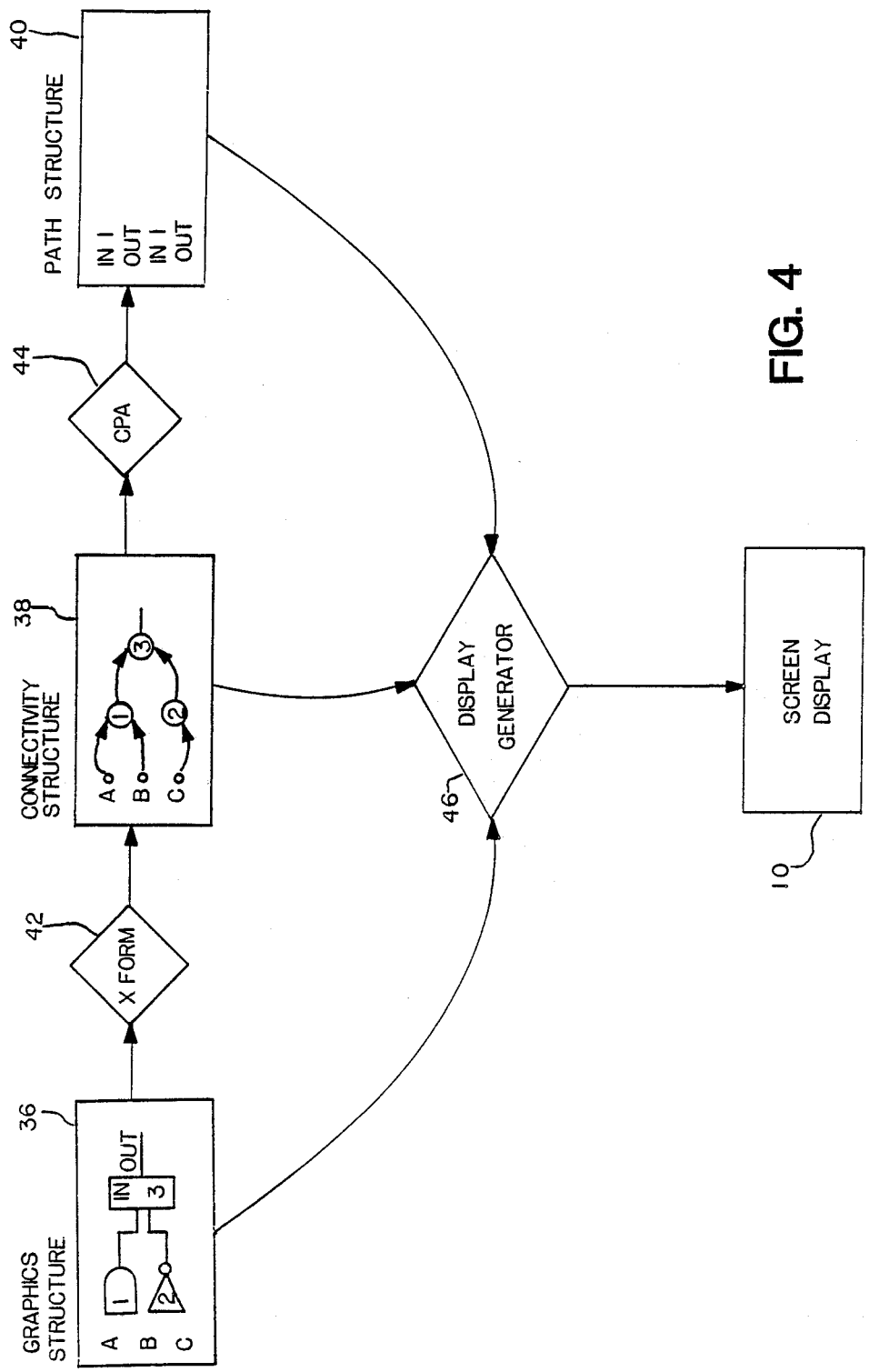
FIG. 4 is a block diagram showing the relationship between various data structures and the apparatus, which enables the apparatus to generate the path context window and other features of the invention.

Referring now to FIG. 4, both the pseudo-code and source code assume the existence of three data structures: a graphics structure 36, a connectivity structure 38, and a path structure 40. The graphics structure 36 and connectivity structure 38 are generated by means such as a schematic editor previously described in response to the input from the designer. A transform program 42 within the schematic editor transforms the data from the graphics structure 36 into data for the connectivity structure 38. A critical path analyzer 44 communicates with the connectivity structure 38 to define paths and determine which paths are critical. Path means such as path structure 40 then accept data from the analyzer 44 defining critical signal paths and stores the paths by reference to input-output pin pairs. All of the above data structures 36, 38, 40, the transformer 42 and analyzer 44 are known and understood in the art. A display generator 46 communicates with each of the data structures to obtain data for generating the path context window 16, the path list window 12, and other features of the display screen 10.

Considering the data structures in more detail, the path structure 40, also referred to as thePath, serves as a source of data for the procedure path_context( ). The connectivity structure 38 stores data describing the instances and nets connected to each pin. In the pseudocode, this structure is referred to as theCKT and is the source of data for the function inst( ). This function returns the instance connected to the supplied pin from the connectivity structure. The graphics structure 28 contains data on the location and graphic appearance of each instance, net, and pin in the circuit. In the pseudocode, this structure is referred to as theCKTinfo and serves as the source of data for several functions. The function sheet( ) returns a identifier for the sheet on which the supplied instance or pin appears. The function location( ) returns the x,y location of the supplied pin relative to the symbol origin. The function symbol( ) returns the graphics for the symbol of the supplied instance.

The following functions also exist for generating the view sheet windows such as 34a and 34b from data within the graphics structure 36. The function owning_inst(object) returns the parent instance in the hierarchy for this object, i.e., the instance which contains the sheet that contains the object. An object is an instance, net, or pin. The function net_object(net, sheetId) returns a graphical object identifier for the given net on the given sheet. This graphical object highlights the net in the view window. The function object(graphical objectId, inst, sheetId) returns the object that is represented on the display by the supplied graphical objectId. The instance and sheetId parameters are required because the given graphical object can represent many different instances, nets, or pins if the sheet is part of a component that is used more than once in the circuit design.

The procedure path_list is a means for producing in the screen display 10 a list of the critical signal paths, as determined by the critical path analyzer 36. For each critical path, a single text line is built describing the path and displaying the textual description as the net line in the window 12. From window 12, a critical path such as path 2 can be selected for display in its entirety in path context window 16.

The procedure path_context is the main procedure of the display generator and generates the path context window and associated features by invoking the procedures drawProlog, drawInst, and drawNet. These procedure blocks comprise the display generator 46 for producing a display of the signal path contained entirely within path context window 16.

Initially, the procedure path_context seeks a value for the variable next_entry_point upon selection by the user of a critical path. This variable tracks the point for boundaries such as path boundary 19 or separators 20a or 20b, or the leftmost point at which a net or instance in the path is drawn. The assignment statement containing the variable invokes the procedure drawProlog in order to obtain the initial point value, picture_origin. The procedure drawProlog initially draws the filename and sheet name headers 22 and 24 at a predetermined distance to the left of the picture origin point. DrawProlog in turn invokes the procedure drawSheetBoundary which evaluates the x coordinate of picture_origin for a boundaryType. The procedure drawSheetBoundary is a separator generator means for producing the boundaries and separators for display portions and also is a sheet identifier means for generating the sheet identifiers or labels for identifying each new sheet. If the boundaryType equals PROLOG, a path boundary 19 to the prolog is drawn. If the boundaryType equals DOWN, UP or SAME, the appropriate separator 20 is drawn. The sheet and filename labels are also drawn for a new sheet. On the initial pass through drawSheetBoundary, the boundaryType is equal to PROLOG and boundary 19 is drawn. The procedure drawProlog continues by drawing the stub net 32 if the first pin in the path is the input pin. Procedure drawProlog then returns the variable picture_origin as the value for next_entry_point. Next_entry_point now contains the point at which the prolog net exited the prolog segment.

After initializing the variables prevPin and prevInst to identifiers NOPIN and NOINST, the procedure path_context enters a for loop that checks each pin in the selected path to determine which separators 20, instances, and nets should be drawn. The for loop includes a first if statement that determines if the present path pin and the previous path pin are connected to the same instance or if the previous pin equals NOPIN. If either condition is satisfied, an instance is drawn according to the procedure drawInst and the variable next_entry_point is assigned a new value equal to exit_point. The next if statement determines if the present instance and previous instance are on separate schematic sheets and if the previous instance is not equal to NOINST. If both conditions are satisfied, a boundary is drawn according to the procedure drawSheetBoundary and new labels for the filename and sheet name are drawn on the new schematic sheet.

The procedure DrawNet draws nets between instances. It first sets a variable exit_point equal to the net's desired length. The net is then drawn from the entry_point to the exit_point, named if desired, and the signal delay information from the net is illustrated. The net information is also placed in a highlight table to provide a means of contrasting the net with the background of the screen display when the corresponding net is selected. The value of variable exit_point is then returned to the procedure path_context for next_entry_point. Each following pin is now evaluated in the for loop. Where the schematic sheet for the next instance is different, the procedure SheetBoundary is invoked.

The procedure drawInst draws instances. It is similar in operation to drawNet. The variable exit_point is set equal to a desired width for the instance. The procedure then draws a symbol for the instance centered between the entry and exit points. Net stubs are added to the entry and exit points and label information for the instance, such as a circuit description and commercial designation, are added. This data is also stored in a highlight table for contrasting it with a background of the screen display 10. The procedure then returns the value of the variable exit_point to the procedure path_context as the next_entry_point.

In subsequent passes through the for loop in procedure path_context, the instances, nets, and boundaries are drawn as set forth in the procedure. Invocations to the procedure drawSheetBoundary, drawInst, and drawNet continue, with the labels for each new sheet drawn in drawSheetBoundary. When the last instance is encountered in drawInst, the total path delay information is added to the path context window 16.

The procedure view_selected_sheet(object) is a schematic sheet generator means responsive to a selection of a portion of the displayed signal path for producing displays such as view sheet windows 34a and 34b. It creates a window in the display that contains a schematic sheet, such as 34a, with representations of the nets, instances, and pins of the design. The procedure first stores the value of the sheet identifier and the parent instance such as component 22 of the sheet into a structure called theView. It then creates a window to display the schematic sheet and saves the sheet identifier in theView. The procedure then displays the schematic sheet in the window and returns theView structure to a standard calling procedure. The calling procedure is not outlined here, since it is a standard command processing procedure, known in the art and its description would only detract from focus on the invention.

The procedure select tells the display generator 46 which object, such as a path, path portion or component, has been selected by the user for display. It maintains a list of selected objects and provides for highlighting their displayed representation(s). The procedure first adds the object to the list of objects that are currently selected. Then it enters the first of two for loops. The first loop crosses all displayed view windows and calls the procedure hilite( ) to highlight the displayed representation of the object in the view window. The second for loop highlights the selected path in the path context window.

The procedure hilite( ), as described, causes the displayed representation of an object to stand out from the background of the screen display. There are two versions of the procedure, one for the view window and one for the path context window. They are different in implementation, but their functions are similar. The path context window version highlights the path within the path context window. It assumes that a structure is available from the window itself (the highlight table referred to in the path_context procedure) that can return a list of graphical objects that are the displayed representation of the objects. The for loop then loops across each of the objects and changes their display.

The view window version obtains its information on objects to highlight from different sources, depending upon the type of the object that is to be highlighted. If it is a net, the procedure calls the net_object( ) function of theCktInfo. If it is an instance, the procedure calls the symbol( ) function. If it is a pin, the procedure calls the location( ) function.

The identify_object procedure is used to convert a point on the display screen into a design object. This supports the selection operation that allows positioning a cursor on the displayed representation of a design object in order to select it. It also has a view window version and a path context window version. The view window version communicates with a function in theCktInfo that correlates graphical object identifiers to design objects. As described in the pseudo-code, the version determines which of the graphical objects on the sheet is closest to the point and then asks for the corresponding design object.

The path context window version works differently. The path context window is a concatenation of vertical segments as can be seen in examining the source code. The left and right x coordinates of each segment of the path context are known. The procedure includes a for loop that loops across each of the segments of the path context window 16. For each segment, an if statement tests to see if the x coordinate of the supplied point is within the boundaries of the segment. If the x coordinate is within the boundaries, then a second if statement tests to see if this is an instance segment or a net segment. If it is a net segment (the else clause of the if), the associated net is chosen as the object to return. If it is an instance segment, a further test must be done. This further test is required because an instance segment contains both a symbol for the instance and possibly two net stubs that connects its entry/exit points with the pins of the symbol. In this particular algorithm, if the x coordinate is to the left of the symbol, it will return the input net; if it is to the right of the symbol, it will return the output net; otherwise it returns the instance associated with the segment. Finally, if the for loop completes without returning anything then the NULL_OBJECT is returned signaling that no object could be identified at the provided location.

Having illustrated and described the principles of the invention in a preferred embodiment, it should be apparent to those skilled in the art that the invention can be modified in arrangement and detail without departing from such principles. We claim all modifications coming within the spirit and scope of the following claims.

We claim:

```
procedure path_list
    // This procedure produces the path list window
    foreach critical path
        build a single text line describing the path and
        display it as the next line in a window
    end foreach
end procedure path_list
```

```
procedure path_context
   // This procedure produces the path context window
   next_entry_point = drawProlog()
   // next_entry_point now contains at which the prolog net exited
   // the prolog segment
   prevPin = NOPIN;
   prevInst = NOINST;
   foreach pin in thePath
       if (theCkt.inst(pin) == theCkt.inst(prevPin) or prevPin == NOPIN)
           if (theCktInfo.sheet(inst) != theCktInfo.sheet(prevInst)
           and prevInst != NOINST)
               drawSheetBoundary(next_entry_point)
           next_entry_point = drawInst(next_entry_point)
       end if
       else
           next_entry_point = drawNet(next_entry_point)
       prevInst = theCkt.inst(pin)
       prevPin = pin
   end foreach
end procedure path_context procedure drawProlog()
   draw filename and sheet name headers to left of picture origin
   drawSheetBoundary(picture_origin)
   if first pin in path is input pin
       draw stub net to connect to input pin
   return picture_origin // where to start the first segment
end procedure drawProlog procedure drawInst(entry_point)
   exit_point = entry_point + width()
   draw theCktInfo.symbol(inst) centered between entry and exit
   draw net stub from entry point to theCktInfo.location(inputPin)
   draw net stub from theCktInfo.location(outputPin) to exit point
   draw instance label information if requested
   if this is the last instance
       draw total path delay information
   put this instance and graphics information into selection hilite
   table
   // The foregoing line will allow for hiliting this instance in this
   // window whenever the instance is slected.
   return exit_point
end procedure drawInst
```

```
procedure drawNet(entry_point)
   exit_point = entry_point + width()
   draw net between entry and exit point
   draw net name if desirable
   draw path delay informtion associated with net
   put this net and graphics information into selection hilite table
   // The foregoing line will allow for hiliting this net in this window
   // whenever the net is selected.
   return exit_point
end procedure drawNet procedure drawSheetBoundary(point)
   if boundaryType == PROLOG
      draw prolog boundary at x location of point
   else if boundaryType == DOWN
      draw down indicator at x location of point
   else if boundaryType == UP
      draw up indicator at x location of point
   else if boundaryType == SAME
      draw same component indicator at x location of point
   draw labels for the new sheet
end procedure drawSheetBoundary procedure view_selected_sheet(object)
   // This procedure creates a window that is a view of the schematic
   // of the selected object.  It returns a structure that contains the
   // window and sheet data.
   theView.sheetId = theCktInfo.sheet(object)
   theView.parent = theCktInfo.owning_inst(object)
   theView.window = create a window on the display
   put the schematic picture associated with the sheetId in the window
   return theKView
end procedure path_list procedure select(object)
   add object to the list of selected objects
   foreach view window
      hilite(object, window.theView)
   end foreach
   foreach graphical context window
      hilite(object, theContext)
   end foreach
end procedure
```

```
procedure hilite(object, theContext)
   // This procedure is the hilite procedure as associated with the
   // graphical context window.  The 'graphical_object_list' function
   // is supported by a data structure, typically a hash table, created
   // at the time the graphical path context is built.  See the
   // graphical path context enabling description for more information
   // on this.
   grobj_list = theContext.graphical_object_list(object)
   foreach grobj in grobj_list
      change display of 'grobj' to call attention to it
   end foreach
end procedure procedure hilite(object, theView)
   // This procedure is the hilite procedure as associated with the
   // view window.
   case (object.type) of
      net : grobj = theCktInfo.net_object(object.net, theView.sheetId)
      pin : grobj = theCktInfo.location(object.pin)
      instance : grobj = theCktInfo.symbol(object.inst)
   end case
   change display of 'grobj' to call attention to it
end procedure procedure identify_object(x, y, theContext)
   // This procedure takes a point in the context window and returns
   // an object that the point identifies.
   foreach segment in theContext
      if (x > = segment.leftX) and (x < = segment.rightX) then
         if (segment.is_instance) then
            if (x < segment.symbol.leftX) then
               return segment.incoming_net
            else if (x > segment.symbol.rightX) then
               return segment.outgoing_net
            else
               return segment.inst
            end if // segment is an instance segment
         else // segment is a net segment
            return segment.net
         end if // location is in this segment
   end foreach
```

```
    // if we get to here then the point was not in any segment, return
    // nothing
    return NULL_OBJECT
end procedure procedure identify_object(x, y, theView)
    // This procedure takes a point in the view window and returns an
    // object that the point identifies.
    grobj = smallest graphical object on the sheet that contains point
    (x,y)
    return theCktInfo.object(grobj, theView.parent, theView.sheetId)
end procedure
```

APPENDIX A

```
/*
 * HEADER
 *    pcarea.h - Declare class Pcarea
 *
 * COPYRIGHT
 *    Copyright (C) 1988 Mentor Graphics Corporation
 *
 * DESCRIPTION
 *    The area defined and managed by this is the Path Context area of
 *    Quickpath.
 */ ifndef INCLUDED_PCAREA
define INCLUDED_PCAREA ifndef INCLUDED_QPBASE
include <qpbase.h>
endif ifndef INCLUDED_HILITE_QPAREA
include <hilite_qparea.h>
endif ifndef INCLUDED_GEOM
include <geom.h>
endif ifndef INCLUDED_PCAREA_CONSTS
include <pcarea_consts.h>
endif ifndef INCLUDED_REFS
include <refs.h>
endif ifndef INCLUDED_FE
include <fe.h>
endif

// **************************************************************************
// *                                                                        *
// *                    Miscellaneous enums, structs, etc.                  *
// *                                                                        *
// **************************************************************************

//--------------------------------------------------------------------------
// Declaration of struct Pc_text_info
//--------------------------------------------------------------------------
struct Pc_text_info {
    coord           ht;         // Height of the text in coord's
    Pc_text_align   align;      // Alignment, declared in pcarea_consts.h
    short           color;      // color map level to use, if color node.
};
```

```
// *********************************************************************
// *                                                                   *
// *                          Class Pcarea                             *
// *                                                                   *
// *********************************************************************

//---------------------------------------------------------------------
// Declaration of class Pcarea
//---------------------------------------------------------------------
class Status;
class Qpcmd;
class Pcsheet_list;
class Pcsheet;
class Wcpath_scanner;
class Dlypath_scanner;
class Lngtable;
class Pcnet;
class Pcinst;
class Ciinst;

class Pcarea : public Hilite_qparea {
    // This is the definition of a Path Context area.  Pcarea's are constructed
    // in response to a command from Fe.  The constructor takes a Path_ref
    // and builds and draws the Pcarea from that.

friend class Undo_pc_config;

private:     // data
    Heap                    *heap_p;        // the heap this one is made in
    Heap                    *hilite_heap_p; // heap where Hilite_grobjs go
    Gss_image               *picture;       // The picture in this window
    Pcsheet_list            *sheets;        // list of sheets in this path
    Qp_slack_t              slack_type_d;   // QP_INVALID_SLACK if this is a dlypath
    Point                   origin;         // baseline (horiz and vert) for the
                                            // path context.
    coord                   top_d;          // coordinate of top of graphics + text
    coord                   bot_d;          // coordinate of bottom
    coord                   uplabel_base;   // baseline of labels above the path
                                            // (All text is above this)
    coord                   downlabel_base; // baseline of labels below the path
                                            // (All text below this)
    Boolean                 locked;         // picture is locked
    GROBJ                   prolog_sheet_title_grobj;
    GROBJ                   prolog_inst_title_grobj;
    GROBJ                   prolog_net_stub_grobj;
    Pc_config_data          config_d;       // window configuration data
    static                  Point stub[10]; // Some space to use for creating
                                            // polylines public:      // functions
//---------------------------------------------------------------------
    // Storage management of Pcareas.
    // When Pcarea's are constructed they create a window and the picture to
    // put in them, draw the path context, and are prepared for selection and
    // hiliting in themselves.  They are a highlevel class, and as such are
    // not passed around by copy, are not assigned, and are not initialized
    // from another Pcarea.  Hence the construct by copy, and assignment
    // constructors are not provided.

Pcarea();
        // This constructor creates Pcareas, including drawing the area on the
        // screen.  After this constructor exits the area is available for the
        // user.  The constructor depends upon there being exactly one path
        // selected!  Strange goings on will happen if zero or more than one
        // are selected.  It is the responsibility of the Fe (who creates these
        // things) to ensure this.

//
        // Note that this constructor can take a long time if the schematic files
        // have to be read before the picture can be drawn.  Also, since the
        // schematics may have to be read there may be Status error messages
        // reported in the process of running the constructor.  However, a
        // picture will always be drawn with whatever information is available,
        // whether all sheets could be read or not.

~Pcarea();
        // The destructor for Pcarea deletes the window and the picture
        // as well as the internal data structures.

//---------------------------------DATA INQUIRY------------------------
    Gss_image *grapic_image()
        { return picture; }

Heap *heap()
        { return heap_p; }
```

```
Boolean wc()
    // Is this a worst case path context or a delay path context?
    { return slack_type_d != QP__INVALID_SLACK; }

Point path_origin()
    { return origin;} coord top()
    { return top_d; } coord bottom()
    {return bot_d;} coord top_label_baseline()
    // Returns the baseline for the top labels.  All label text is above this
    // line.
    { return uplabel_base;} coord bottom_label_baseline()
    // Returns the baseline for the bottom labels.  All labels on the bottom
    // are below this point
    { return downlabel_base;} coord sheet_label_baseline();
    // Returns the baseline for the sheet labels.

coord inst_label_baseline();
    // Returns the baseline for the inst labels.

// The following functions are functions instead of constants so I can
// accomodate drawing more than one path on a page, or having configurability
// of these things in the future.

coord label_separator_ht();
    // Returns the separation between two labels.

Point cur_path_origin();
    // Returns the current path origin coord desired_exit(
    Pcsheet         *sheet
    );
    // Returns the preferred y coordinate of the entry point of this sheet.

Pc_config_data &config()
    { return config_d;}

Qp__slack_t slack_type()
    { return slack_type_d;}

//-----------------------------DATA INSERTION----------------------------------
void insert_inst_into_hash(
    Ciinst          *ciinst,
    Pcinst          *inst
    );

void insert_net_into_hash(
    Net_ref         &nref,
    Pcnet           *net
    );
    // These two functions insert nets and instances into the hashtable that
    // correlates instances and nets to their graphical display objects in
    // this area.

//-------------------------CAUSING THINGS TO HAPPEN----------------------------
void application_cmd(
    const Qpcmd     &cmd
    );
    // This function is called (by Fe or Qp_ui) to execute a command that
    // belongs to the Pcarea void rebuild_path_context();
    // Rebuild the picture of the path context.
    // The current picture is deleted and rebuilt.  This is not simply a
    // redraw().

Point build_prolog(
    Point           entry
    );
    // Builds the graphics for the first segment of the path context.  This
    // is mostly the label titles and a stub net to get things going.
    // 'entry' is the location at which the prolog segment should route its
    // 'net' (if any) from.  It returns the point at which the adjoining
    // segment should route from.  'entry' is trivial today (i.e. the
    // path_origin()), but may become more interesting in the future.

//----------------------------GRAPHICS FUNCTIONS-------------------------------
void lock();
```

```
void unlock();
    // While the lock is set the area will not be updated on the display
    // (to prevent flashing, etc) unless a debug function specifies otherwise // The following hilite/unhilite functions overload the base class in order
// to be able to lock() and unlock() the picture during each type of
// item that is being hilited.  The actual hilite is still performed by the
// base class
void hilite(
    Ciinst      *inst
    );
    // Hilite the given instance, if it is in this area.  This function is
    // provided since there is not an Inst_ref for non-primitive instances.

void hilite(
    Inst_ref    &inst
    );
    // Hilite the given instance, if it is in this area.

void hilite(
    Net_ref     &net
    );
    // Hilite the given net, if it is in this area.

void unhilite(
    Ciinst      *inst
    );
    // Unhilite the given instance, if it is in this area.  This function is
    // provided since there is not an Inst_ref for non-primitive instances.

void unhilite(
    Inst_ref    &inst
    );
    // Unhilite the given instance, if it is in this area.

void unhilite(
    Net_ref     &net
    );
    // Unhilite the given net, if it is in this area.

void unhilite_all(
    Selmgr_type     type
    );
    // unhilite every hilited thing in this area.

GROBJ build_sheet_separator(
    coord               x_location,     // height is known by the pcarea.
    Pc_sheet_sep_type   type
    );
    // Draws the sheet separator and returns a grobj for it.

GROBJ copy_cache_grobj(
    GROBJ       cache_grobj,
    Boolean     flip,           // Should it be flipped on the vertical axis?
    Point       loc,            // origin point point for the grobj
    Inst_ref    iref,           // Inst_ref whose selection
                                // will cause this grobj to hilite
    short       to_level = PC_INST_SYMBOL_LEVEL  // what picture level?
    );
    // Copies an object from the instance grobj cache to this Pcarea.  Returns
    // the identifier for it.

GROBJ copy_cache_grobj(
    GROBJ       cache_grobj,
    Boolean     flip,           // Should it be flipped on the vertical axis?
    Point       loc,            // origin point point for the grobj
    Ciinst      *ciinst = NULL, // Ciinst* whose selection
                                // will cause this grobj to hilite
    short       to_level = PC_INST_SYMBOL_LEVEL  // what picture level?
    );
    // Copies an object from the instance grobj cache to this Pcarea.  Returns
    // the identifier for it.

GROBJ build_polyline(
    Point       points[],       // Array of points
    int         npoints,        // number of points in the above array.
    Net_ref     nref            // Net which, when selected, will hilite
                                // this. !valid() means none.
    );
    // Makes a polyline grobj, drawing a line from each point to the next.

GROBJ build_text(
    coord               baseline,   // baseline of the text.
    coord               x_loc,      // x location of the text.
    const char          *str,       // string to make the text out of
    const Pc_text_info  &info       // drawing parameters
    );
    // Draws the text at the indicated location, and associates it with a
    // hilitable object that hilites when the given Net_ref is selected.
```

```
    GROBJ build_text(
        coord               baseline,   // baseline of the text.
        coord               x_loc,      // x location of the text.
        const char          *str,       // string to make the text out of
        const Pc_text_info  &info,      // drawing parameters
        Net_ref             nref        // Hilite when this net is selected
                                        // if !valid() then none
        );
        // Draws the text at the indicated location GROBJ build_sheet_label(
        coord               x_loc,      // x location of sheet separator for this
                                        // sheet
        const char          *filename,
        const char          *sheetname,
        const char          *instpname, // full instance pathname
        Boolean             right_justify = FALSE // Justify labels to right
                                        // (for prolog)
        );
        // Draws the sheet label object as indicated for this Pcarea.

GROBJ build_inst_label(
        coord               x_center,   // x center of the instance
        const char          *instname,  // leafname of the instance
        Boolean             right_justify = FALSE   // If this is true then it will be
                                        // right justified (for the prolog)
        );
        // Draws the instance label as indicated for this Pcarea.

Point text_ext(
        const char          *str,       // string to make the text out of
        const Pc_text_info  &info       // drawing parameters
        );
        // Returns the extent of the text. (Point is upper left, lower right is 0
        // Note the alignment is ignored Point sheet_labels_ext(
        const char          *filename,
        const char          *sheetname,
        const char          *instpname  // full instance pathname
        );
        // Returns the extent of the sheet label.

Point inst_labels_ext(
        const char          *instname   // leafname of the instance
        );
        // Returns the extent of the inst label.

Rectangle grobj_ext(
        GROBJ       object
        );
    Rectangle cache_grobj_ext(
        GROBJ       object
        );
    Rectangle grobj_ext_abs(
        GROBJ       object
        );
        // The preceeding three functions all return extent information about a grobj.
        // The first two return info in relative terms, i.e. grobj origin is at 0,0
        // The third one returns the absolute extent in the picture //-------------------------------DUMP, ETC. FUNCTIONS-------------------------------
    void dump(
        const char *const name_p = NULL,    // pointer to object name
        const int         tabs = 0,         // nesting level
        ostream           &out = cout       // output stream
        );
        // dump internal data representation
//=================================================================================
private:    // functions
    void select_point_cmd(
        const Qpcmd     &cmd
        );
        // Internal handling of this command.
};

#endif
/*
 * HEADER
 *    pcsheet.h - Declare class Pcsheet
 *
 * COPYRIGHT
 *    Copyright (C) 1988 Mentor Graphics Corporation
 *
 * DESCRIPTION
 *    This is the class that manages and builds the sheet segment of a
 *    Quickpath path context window.
 */
```

```
#ifndef INCLUDED_PCSHEET
define INCLUDED_PCSHEET ifndef INCLUDED_STREAMH
include <stream.h>
endif ifndef INCLUDED_GEOM
include <geom.h>
endif ifndef INCLUDED_QPBASE
include <qpbase.h>
endif ifndef INCLUDED_REFS
include <refs.h>
endif ifndef INCLUDED_QP_SLIST
include <qp_slist.h>
endif ifndef INCLUDED_STRING
include <string.h>
endif ifndef INCLUDED_PCAREA_CONSTS
include <pcarea_consts.h>
endif

// ******************************************************************
// *                                                                 *
// *                        Class Pcsheet_sizes                      *
// *                                                                 *
// ******************************************************************

//-------------------------------------------------------------------
// Declaration of class Pcsheet_sizes
//-------------------------------------------------------------------
class Pcsheet_sizes {
    // This class is basically a struct that accesses by functions so I can
    // control computing the information as requested rather than necessarily
    // all at once.  This would be a performance enhancement if ever done.
    //
    // The extents in this class that are relative to 0,0 are returned as Points
    // and those that of Rectangles are relative to 0,baseline are returned as
    // Rectangles.
private:     // data
    Rectangle    graphics_ext_d;      // Extent of the graphics of this sheet, 0,0
                                      // is x=0, y=baseline.
    Point        sheet_labels_ext_d;  // Extent of the sheet labels for this sheet
    Point        inst_labels_ext_d;   // Maximum extent of the several instance
                                      // labels for this sheet
public:      // functions
    // The following functions return references so they can be lvalues
    Rectangle &graphics_ext()
        // Note that this extent includes both the Pcseg grobj extents plus the
        // hierarchical symbol grobj extent.  The x(0) coordinate is always zero.
        { return graphics_ext_d; }

Point &sheet_labels_ext()
        { return sheet_labels_ext_d; }

Point &inst_labels_ext()
        { return inst_labels_ext_d; } void dump(
        const char *const name_p = NULL,    // pointer to object name
        const int         tabs = 0,         // nesting level
        ostream           &out = cout       // output stream
        );
        // dump internal data representation
};

// ******************************************************************
// *                                                                 *
// *                          Class Pcsheet                          *
// *                                                                 *
// ******************************************************************

//-------------------------------------------------------------------
// Declaration of class Pcsheet
//-------------------------------------------------------------------
class Pcnet;
class Pcinst;
```

```
class Pcarea;
class Pcsheet_list;
class Cihier;
class Detail_scanner;         // declared in detail.h
class Pcseg;
class Pcseg_list;
class Pcseg_scanner;

class Pcsheet {
    // Pcsheets manage the sheet segments of a path context.  A sheet segment
    // is the space between two sheet separators.  A Pcsheet contains a Pcseg_list
    // that contains one or more Pcinst/Pcnet pairs plus an entering Pcnet.
    //
    // Pcsheets are responsible for constructing their Pcseg_list, including
    // the Pcnets/Pcinsts on it, for computing and returning the extent of the
    // sheet segment (in isolation, the actual extent may be bigger so it
    // lines up with the tallest sheet segment in the path context), and for
    // building the graphics for the sheet segment.

private:     // data
    Pcarea              *area_p;            // parent Pcarea
    String              sheetname;          // of the sheet this is
    Cihier              *parent_inst;       // Cihier this is a sheet of
    Pcseg_list          *segs;              // list of nets/insts on this sheet
    Pcseg_scanner       *seg_scan;          // Scanner that points to the current
                                            // Pcseg being built
    Pc_sheet_sep_type   type;               // type of heirarchical sheet this is
    Pcsheet_sizes       sizes_d;            // the size info.
    coord               left_x;             // left edge of this sheet.  This is not
                                            // valid until the sheet has been built,
                                            // not just ext().
    coord               segs_bottom;        // bottom y of the segments on the sheet
    GROBJ               sheet_sep_grobj;    // sheet separator object
    GROBJ               sheet_label_grobj;  // sheet labels grobj
    GROBJ               symbol_grobj;       // for the symbol for my parent
    GROBJ               exit_stub;          // grobj for the net that completes the
                                            // width of the sheet if the segments
                                            // on it are too short.
    static Point        stub[10];           // Some space to use for creating
                                            // polylines public:      // functions
//-----------------------------------------------------------------------------
    // Storage management of Pcsheets.
    // Pcsheets are not created as automatic variables, are never assigned,
    // copied or arrayed.  They are freely created and destroyed, and care
    // is taken that all secondary store is created on the parent's heap.

Pcsheet(
        Pcarea          *parent_area,
        Detail_scanner  &detail_scan
    );
    // Create this Pcsheet.
    // The scanner is expected to point at the input pin of the first instance
    // on this sheet.  (Note that this implies the first pin of every path
    // should be an input pin; e.g. the source clk def or the source clock
    // pin or the dest clock def.
    //
    // On exit from this routine the scanner is left pointing at the first
    // pin that is not on this sheet, or !valid() if this one consumed them
    // all.

~Pcsheet();
    // The destructor for Pcsheet deletes secondary store.  It does not
    // delete graphical objects, since it is assumed that the picture will
    // disappear when the Pcsheet does.  !!This assumption needs to be
    // checked when moved under Ogre.

//------------------------------DATA INQUIRY-----------------------------------
    coord desired_exit(:
        Pcseg   *seg
    );
    // Returns the prefered y value for the exit point of the Pcseg indicated.
    // If the seg is NULL then it is the desire of the first Pcseg in the
    // list, otherwise it is the desire of the Pcseg that follows the indicated
    // Pcseg.  (Note that as currently designed, 4/26/88, Pcnets have no
    // preferences and Pcinst's have absolute preferences.  This may be
    // changed, however, so I declared the input parameter a Pcseg instead of
    // a Pcnet.

coord desired_entry();
    // Returns y value of the desired point of exit of the previous sheet.

Pcsheet_sizes &sizes();
    // Returns the graphical extents of various things in this sheet.

coord width();
    // Returns the width of this sheet.
```

```
Cihier *parent()
    // Returns the parent instance of this sheet.
    [ return parent_inst; ]

Net_ref input_net();
    // Returns the input net to this sheet, or !valid() if the first
    // segment on this sheet is an instance.

Boolean select(
    coord          x,
    coord          y
    );
    // Selects the object at x,y (in picture coordinates) if these coordinates
    // should cause selection.  Return TRUE if a) something was selected,
    // or b) x,y is in this sheet but nothing should be selected there.
//-------------------------------DATA INSERTION-------------------------------
    void clear_graphics();
        // Set all the GROBJ's in this Pcsheet to QP__NULL_GROBJ, including
        // those in the Pcnet/Pcinst's below.  Also clears the cached widths
        // of each of the segments.

//-------------------------------CAUSING THINGS TO HAPPEN---------------------
    Point build_seg(
        Point       entry
        );
        // Builds the graphics for this sheet segment.
        // entry is the location of the endpoint of the previous segment, which
        // is where this one should start.  The exit point of this segment is
        // returned (which is used as the entry point for the next segment).
        // Note that the exit is meaningless for the last sheet segment since
        // the path terminates there.

//-------------------------DUMP, ETC. FUNCTIONS-------------------------------
    void dump(
        const char *const name_p = NULL,    // pointer to object name
        const int         tabs = 0,         // nesting level
        ostream           &out = cout       // output stream
        );
        // dump internal data representation
};

// ****************************************************************************
// *                                                                          *
// *              Classes Pcsheet_list and Pcsheet_scanner                    *
// *                                                                          *
// ****************************************************************************

//----------------------------------------------------------------------------
// Declaration of class Pcsheet_list
//---------------------------------------------------------------------------- class Pcsheet;
    // declared in /project/qpath/src/qpath.hm/loop.h class Pcsheet_list : public Qp_slist {

// singly linked list of Pcsheet * items
    // This class is derived from the Qp_slist protocol class.  It provides
    // type checking of arguments and type conversions of return values
    // for the convenience of its clients.

friend class Pcsheet_scanner;

//---------------------------------------------------------------------------- public:     // functions

Pcsheet_list() { }
        // Allocated on misc heap; base class initializes data.
    Pcsheet_list(Heap *heap_p);

void operator=(Pcsheet_list &src)
        { Qp_slist::operator=(src); } void clear();
        // Clears the list and deletes the Pcsheet's on it.

Pcsheet_scanner *new_item_scanner()
        { return (Pcsheet_scanner *) Qp_slist::new_item_scanner(); } void add_item(Pcsheet *item_p)
        { Qp_slist::add_item(item_p); } void append_item(Pcsheet *new_item, Pcsheet_scanner *loc_p = NULL);

void insert_item(Pcsheet *new_item, Pcsheet_scanner *loc_p = NULL);

void append_list(Pcsheet_list &source, Pcsheet_scanner *loc_p = NULL);
```

```
    void insert_list(Pcsheet_list &source, Pcsheet_scanner *loc_p = NULL);

Pcsheet *remove_item(Pcsheet_scanner *loc_p);

void operator+=(Pcsheet_list &src)
        { Qp_slist::operator+=(src); } int find(Pcsheet *item)
        { return(Qp_slist::find(item)); }

Pcsheet *&operator[](int i)
        { return((Pcsheet *&) Qp_slist::operator[](i)); }

Pcsheet *first()
        { return((Pcsheet *) Qp_slist::first()); }

Pcsheet *last()
        { return((Pcsheet *) Qp_slist::last()); }
};

//----------------------------------------------------------------
// Declaration of class Pcsheet_scanner
//---------------------------------------------------------------- class Pcsheet_scanner : public Qp_slist_scanner {

// scanner for singly linked list of Pcsheet * items
    // This class is derived from the Qp_slist_scanner protocol class.  It
    // provides type checking of arguments and type conversions of return
    // values for the convenience of its clients.

friend class    Pcsheet_list;

//---------------------------------------------------------------- public:  // functions

Pcsheet_scanner() []
        // Allocated on misc heap; base class initializes data.
    Pcsheet_scanner(Pcsheet_list &list, Heap *heap_p = NULL);
        // Allocated on misc heap; base class initializes data.
    Pcsheet_scanner(const Pcsheet_scanner &src) : (src) []
        // Allocated on misc heap; base class initializes data.
    Pcsheet_scanner(Heap *heap_p);
    Pcsheet_scanner(const Boolean run_loops);
        // automatically attach to one of the two Pcsheet lists in Results
        // Attach to run list if arg is TRUE, trace list otherwise.

void attach(Pcsheet_list &scan_list)
        { Qp_slist_scanner::attach(scan_list); } void attach(Pcsheet_list *scan_list_p)
        { Qp_slist_scanner::attach(*scan_list_p); }

Pcsheet *&curr_item()
        { return((Pcsheet *&) Qp_slist_scanner::curr_item()); }

Boolean find(Pcsheet *item)
        { return(Qp_slist_scanner::find(item)); }
};

//----------------------------------------------------------------
// Definition of class Pcsheet_list inline functions
//----------------------------------------------------------------

// These inline functions are defined here rather than with the function
// declarations because they depend on the Pcsheet_scanner declaration.

inline void Pcsheet_list::append_item(Pcsheet *new_item, Pcsheet_scanner *loc_p)
    { Qp_slist::append_item(new_item, loc_p); } inline void Pcsheet_list::insert_item(Pcsheet *new_item, Pcsheet_scanner *loc_p)
    { Qp_slist::insert_item(new_item, loc_p); } inline void Pcsheet_list::append_list(Pcsheet_list &source, Pcsheet_scanner *loc_p)
    { Qp_slist::append_list(source, loc_p); } inline void Pcsheet_list::insert_list(Pcsheet_list &source, Pcsheet_scanner *loc_p)
    { Qp_slist::insert_list(source, loc_p); } inline Pcsheet *Pcsheet_list::remove_item(Pcsheet_scanner *loc_p)
    { return((Pcsheet *) Qp_slist::remove_item(loc_p)); } endif
/*
 * HEADER
 *    pcseg.h - Declare class Pcseg, Pcnet, Pcinst
 *
```

```
* COPYRIGHT
*    Copyright (C) 1988 Mentor Graphics Corporation
*
* DESCRIPTION
*    This is the class that manages and builds each net/instance segment
*    for a sheet segment in the Quickpath path context window.
*/ ifndef INCLUDED_PCSEG
define INCLUDED_PCSEG ifndef INCLUDED_GEOM
include <geom.h>
endif ifndef INCLUDED_QPBASE
include <qpbase.h>
endif
ifndef INCLUDED_REFS
include <refs.h>
endif ifndef INCLUDED_STRING
include <string.h>
endif ifndef INCLUDED_QP_SLIST
include <qp_slist.h>
endif ifndef INCLUDED_PCAREA_CONSTS
include <pcarea_consts.h>
endif ifndef INCLUDED_HILITABLE
include <hilitable.h>
endif

// ***************************************************************************
// *                                                                         *
// *                             Class Pcseg                                 *
// *                                                                         *
// ***************************************************************************

//---------------------------------------------------------------------------
// Declaration of class Pcseg
//---------------------------------------------------------------------------
class Pcarea;              // declared in pcarea.h
class Pcsheet;             // declared in pcsheet.h
class Detail_scanner;      // declared in detail.h class Pcseg : public Hilitable {
    // Pcsegs manage the individual segments of a path context.  They know how
    // to layout their own segment of the path context, how to return its
    // extent, and how to recognize selection and do hiliting.

protected:     // data
    Pcarea         *area_p;        // parent Pcarea
    Pcsheet        *sheet_p;       // parent Pcsheet
    Pin_ref         ipin;          // the input pin to this segment
    Pin_ref         opin;          // the output pin from this segment
    coord           left_x;        // left x coord of this seg.  Not valid
                                   // until the segment has been built
                                   // (not after .ext())
    coord           width;         // width of this seg. Not valid until
                                   // ext() is called. -1 if not valid.
    GROBJ           the_grobj;     // grobj of the graphics public:        // functions
//---------------------------------------------------------------------------
    // Storage management of Pcsegs.
    // Pcsegs are not created as automatic variables, are never assigned,
    // copied or arrayed.  They are freely created and destroyed, and care
    // is taken that all secondary store is created on the parent's heap.
    // No instances of Pcseg are created, they only exist in the form of
    // derived objects.  Since there is no secondary store for a Pcseg (we
    // are making the assumption that the graphical objects are deleted at
    // the same time the Pcseg is) no destructor is defined.

Pcseg(
        Pcarea          *parent_area,
        Pcsheet         *parent_sheet,
        Detail_scanner  &scan_point
        );
        // Create this Pcseg.  It assumes that 'this' has been allocated by its
        // derived class.
```

```
//-------------------------------DATA INQUIRY------------------------------------
    virtual coord desired_entry();
        // Returns the prefered y value for the exit point of the Pcseg prior
        // to this one.  This is the point that will make the "prettiest"
        // path context, but may not be the actual exit of the previous Pcseg.
        // The function returns MIN_INT if no entry is expected (which serves
        // as a flag that there is no net to be drawn to this point virtual Rectangle ext();
        // Returns the extent of the graphics of this segment above and below
        // the x axis.  The x(0) is always 0.

virtual Point inst_labels_ext();
        // Returns the extent of the instance labels, if any.  Lower left corner
        // of the extent is assumed to be zero.

virtual Boolean select(
        coord       x,
        coord       y
        );
        // Selects the object at x,y (in picture coordinates) if these coordinates
        // should cause selection.  Return TRUE if a) something was selected,
        // or b) x,y is in this segment but nothing should be selected there.
        // Not implemented in the base class virtual Net_ref input_net();
        // returns the input net to this segment.  !valid() if there is not
        // an input net virtual Net_ref output_net();
        // returns the output net to this segment.  !valid() if there is not
        // an output net //-------------------------------DATA INSERTION----------------------------------
    virtual void clear_graphics();
        // Set all the GROBJ's in this Pcseg to QP_NULL_GROBJ //------------------------CAUSING THINGS TO HAPPEN-------------------------------
    virtual Point build_seg(
        Point     entry
        );
        // Builds the graphics for this segment.
        // entry is the location of the endpoint of the previous segment, which
        // is where this one should start.  The exit point of this segment is
        // returned (which is used as the entry point for the next segment).

//----------------------------DUMP, ETC. FUNCTIONS-------------------------------
    virtual void dump(
        const char *const name_p = NULL,    // pointer to object name
        const int         tabs   = 0,       // nesting level
        ostream           &out   = cout     // output stream
        );
        // dump internal data representation
};

// *****************************************************************************
// *                                                                           *
// *                          Class Pcnet                                      *
// *                                                                           *
// *****************************************************************************

//-------------------------------------------------------------------------------
// Declaration of class Pcnet
//-------------------------------------------------------------------------------
class Ciinst;       // Declared in ciinst.h class Pcnet : public Pcseg {
    // Pcnets manage the net segments of a path context.  They know how
    // to layout their own segment of the path context, how to return its
    // extent, and how to recognize selection and do hiliting.

protected:     // data
    Net_ref     net;
    Boolean     include_text;   // Says whether or not text should be drawn
    String      text;           // Text on the net (other than the name
    GROBJ       text_grobj;
    GROBJ       name_grobj;

public:    // functions
//-------------------------------------------------------------------------------
    // Storage management of Pcnets is the same as Pcsegs, except that it has
    // the responsibility of allocating the space.

Pcnet(
        Pcarea          *parent_area,
        Pcsheet         *parent_sheet,
        Detail_scanner  &scan_point,
        Boolean         include_text = TRUE   // Draw delay text string on this net?
        );
        // Create this Pcnet.
```

```
//-------------------------------DATA INQUIRY-------------------------------
    coord desired_entry();
        // Returns the prefered y value for the exit point of the Pcinst prior
        // to this one.  This simply calls the desired_exit() function of its
        // parent sheet, since a Pcnet has no preference about its entry other
        // than to keep the net straight.

Rectangle ext();
        // Returns the extent of the graphics of this segment above and below
        // the x axis.  The x(0) is always 0.  For a net the x-axis is assumed to
        // be the midpoint of the y dimension, though this is not true in reality.
        // This function should perhaps take an entry in the future, but at this
        // point it seems unnecessary since the y-extent of the net is not
        // going to be greater than the extent of the instances on each side of
        // it.

Net_ref input_net();
        // returns the input net to this segment. Since this is a net segment this
        // will always be returned valid()
    Net_ref output_net();
        // returns the output net to this segment. Since this is a net segment this
        // will always be returned valid()

Boolean select(
        coord           x,
        coord           y
        );
        // Selects the net if x,y is in this segment and should cause selection.
        // Returns TRUE if a) net was selected,
        // or b) x,y is in this segment but nothing should be selected there.

//------------------------CAUSING THINGS TO HAPPEN-------------------------
    Point build_seg(
        Point   entry
        );
        // Builds the graphics for this segment.
        // entry is the location of the endpoint of the previous segment, which
        // is where this one should start.  The exit point of this segment is
        // returned (which is used as the entry point for the next segment).

void clear_graphics();

//-------------------------DUMP, ETC FUNCTIONS-----------------------------
    void dump(
        const char *const name_p = NULL,    // pointer to object name
        const int         tabs = 0,          // nesting level
        ostream           &out = cout        // output stream
        );
        // dump internal data representation
};

// ************************************************************************
// *                                                                      *
// *                          Class Pcinst                                *
// *                                                                      *
// ************************************************************************

//-------------------------------------------------------------------------
// Declaration of class Pcinst
//------------------------------------------------------------------------- class Pcinst : public Pcseg {
    // Pcinsts manage the instance segments of a path context.  They know how
    // to layout their own segment of the path context, how to return its
    // extent, and how to recognize selection and do hiliting.

protected:      // data
    Ciinst          *inst;
    String          arrival_time_text;
    String          setup_time_text;
    GROBJ           labels_grobj;       // grobj of the labels
    GROBJ           entry_stub;         // grobj of entering net
    GROBJ           exit_stub;          // grobj of exiting net
    GROBJ           setup_time_grobj;   // grobj of setup time, if any
    GROBJ           clk_ar_time_grobj;  // grobj of arrival time, if any
    struct loc_stuff {
        Rectangle       extent;             // relative to y baseline, entry.x
        Point           in_pin_loc;
        Point           out_pin_loc;
        coord           in_pin_channel_y;   // y location of input pin routing channel
        coord           out_pin_channel_y;  // y location of output pin routing channel
        Point           origin;
        Boolean         flipped;            // The symbol should be flipped
                                            // when it is displayed
        Boolean         computed;           // information is valid
    }               locs;                   // information about location of symbol in seg,
                                            // relative to xmidpoint, ybaseline.

public:         // functions
//-------------------------------------------------------------------------
```

```
// Storage management of Pcinsts is the same as Pcsegs except they must
// allocate space from the parent_area's heap.

Pcinst(
    Pcarea          *parent_area,
    Pcsheet         *parent_sheet,
    Detail_scanner  &scan_point
    );
    // Create this Pcinst.

//---------------------------DATA INQUIRY---------------------------------
    coord desired_entry();
        // Returns the prefered y value for the exit point of the Pcinst prior
        // to this one.  This is the point that will make the "prettiest"
        // path context, but may not be the actual exit of the previous Pcnet.
        // The function returns MIN_INT if no entry is expected (which serves
        // as a flag that there is no net to be drawn to this point Rectangle ext();
        // Returns the extent of the graphics of this segment above and below
        // the x axis.  The x(0) is always 0.

Point inst_labels_extent();
        // Returns the extent of the instance labels, if any.  Lower left corner
        // of the extent is assumed to be zero.

Point inst_labels_ext();
        // Returns the extent of the instance labels, if any.  Lower left corner
        // of the extent is assumed to be zero.

Net_ref input_net();
        // returns the input net to this segment.  !valid() if there is not
        // an input net Net_ref output_net();
        // returns the output net to this segment.  !valid() if there is not
        // an output net Boolean select(
        coord       x,
        coord       y
        );
        // Selects an object (net or instance) if x,y is in this segment and should
        // cause selection. Returns TRUE if a) something was selected,
        // or b) x,y is in this segment but nothing should be selected there.

//---------------------------DATA INSERTION-------------------------------
    void clear graphics();
        // Set all the GROBJ's in this Pcinst to QP_NULL_GROBJ //-------------------------CAUSING THINGS TO HAPPEN-----------------------
    Point build_seg(
        Point       entry
        );
        // Builds the graphics for this segment.
        // entry is the location of the endpoint of the previous segment, which
        // is where this one should start.  The exit point of this segment is
        // returned (which is used as the entry point for the next segment).

//-------------------------DUMP, ETC. FUNCTIONS---------------------------
    void dump(
        const char *const name_p = NULL,    // pointer to object name
        const int         tabs = 0,         // nesting level
        ostream           &out = cout       // output stream
        );
        // dump internal data representation
};

// ************************************************************************
// *                                                                      *
// *           Classes Pcseg_list and Pcseg_scanner                       *
// *                                                                      *
// ************************************************************************

//------------------------------------------------------------------------
// Declaration of class Pcseg_list
//------------------------------------------------------------------------ class Pcseg;
    // declared in /project/qpath/src/qpath.hm/loop.h class Pcseg_list : public Qp_slist [

// singly linked list of Pcseg * items
    // This class is derived from the Qp_slist protocol class.  It provides
    // type checking of arguments and type conversions of return values
    // for the convenience of its clients.

friend class Pcseg_scanner;

//------------------------------------------------------------------------
```

```cpp
public:    // functions

Pcseg_list() []
        // Allocated on misc heap; base class initializes data.
    Pcseg_list(Heap *heap_p);

void operator=(Pcseg_list &src)
        { Qp_slist::operator=(src); } void clear();
        // Clears the list and deletes the Pcseg's on it.

Pcseg_scanner *new_item_scanner()
        { return (Pcseg_scanner *) Qp_slist::new_item_scanner(); } void add_item(Pcseg *item_p)
        { Qp_slist::add_item(item_p); } void append_item(Pcseg *new_item, Pcseg_scanner *loc_p = NULL);

void insert_item(Pcseg *new_item, Pcseg_scanner *loc_p = NULL);

void append_list(Pcseg_list &source, Pcseg_scanner *loc_p = NULL);

void insert_list(Pcseg_list &source, Pcseg_scanner *loc_p = NULL);

Pcseg *remove_item(Pcseg_scanner *loc_p);

void operator+=(Pcseg_list &src)
        { Qp_slist::operator+=(src); } int find(Pcseg *item)
        { return(Qp_slist::find(item)); }

Pcseg *&operator[](int i)
        { return((Pcseg *&) Qp_slist::operator[](i)); }

Pcseg *first()
        { return((Pcseg *) Qp_slist::first()); }

Pcseg *last()
        { return((Pcseg *) Qp_slist::last()); }
};

//-----------------------------------------------------------------
// Declaration of class Pcseg_scanner
//----------------------------------------------------------------- class Pcseg_scanner : public Qp_slist_scanner {

// scanner for singly linked list of Pcseg * items
        // This class is derived from the Qp_slist_scanner protocol class.  It
        // provides type checking of arguments and type conversions of return
        // values for the convenience of its clients.

friend class   Pcseg_list;
//----------------------------------------------------------------- public:   // functions

Pcseg_scanner() []
        // Allocated on misc heap; base class initializes data.
    Pcseg_scanner(Pcseg_list &list, Heap *heap_p = NULL);
        // Allocated on misc heap; base class initializes data.
    Pcseg_scanner(const Pcseg_scanner &src) : (src) []
        // Allocated on misc heap; base class initializes data.
    Pcseg_scanner(Heap *heap_p);

void attach(Pcseg_list &scan_list)
        { Qp_slist_scanner::attach(scan_list); } void attach(Pcseg_list *scan_list_p)
        { Qp_slist_scanner::attach(*scan_list_p); }

Pcseg *&curr_item()
        { return((Pcseg *&) Qp_slist_scanner::curr_item()); }

Boolean find(Pcseg *item)
        { return(Qp_slist_scanner::find(item)); }
};

//-----------------------------------------------------------------
// Definition of class Pcseg_list inline functions
//-----------------------------------------------------------------

// These inline functions are defined here rather than with the function
// declarations because they depend on the Pcseg_scanner declaration.
```

```c
inline void Pcseg_list::append_item(Pcseg *new_item, Pcseg_scanner *loc_p)
   { Qp_slist::append_item(new_item, loc_p); } inline void Pcseg_list::insert_item(Pcseg *new_item, Pcseg_scanner *loc_p)
   { Qp_slist::insert_item(new_item, loc_p); } inline void Pcseg_list::append_list(Pcseg_list &source, Pcseg_scanner *loc_p)
   { Qp_slist::append_list(source, loc_p); } inline void Pcseg_list::insert_list(Pcseg_list &source, Pcseg_scanner *loc_p)
   { Qp_slist::insert_list(source, loc_p); } inline Pcseg *Pcseg_list::remove_item(Pcseg_scanner *loc_p)
   { return((Pcseg *) Qp_slist::remove_item(loc_p)); } endif
/*
 * MODULE
 *    pcarea.c - Definition of class Pcarea
 *
 * COPYRIGHT
 *    Copyright (C) 1988 Mentor Graphics Corporation
 *
 * DESCRIPTION
 *
 *    This is the file that manages the creation and drawing of path context
 *    areas.
 */ ifndef INCLUDED_PCAREA
include <pcarea.h>
endif ifndef INCLUDED_STATUS
include <status.h>
endif ifndef INCLUDED_STRING
include <string.h>
endif ifndef INCLUDED_GEOM
include <geom.h>
endif ifndef INCLUDED_V1HI
include <v1hi.h>
endif ifndef INCLUDED_QPCMD
include <qpcmd.h>
endif ifndef INCLUDED_CKT_INFO
include <ckt_info.h>
endif ifndef INCLUDED_FE_ENV
include <fe_env.h>
endif ifndef INCLUDED_CMDS
include <$(qpath.cmd).h>
endif ifndef INCLUDED_PCAREA_ERRS
include <$(fe_err).h>
endif ifndef INCLUDED_PCSHEET
include <pcsheet.h>
endif ifndef INCLUDED_PCAREA_CONSTS
include <pcarea_consts.h>
endif ifndef INCLUDED_PATH
include <path.h>
endif ifndef INCLUDED_GENHEAP
include <genheap.h>
endif ifndef INCLUDED_LNGTABLE
include <lngtable.h>
#endif
```

```
#ifndef INCLUDED_BE_TABLES
include <be_tables.h>
endif ifndef INCLUDED_V1
include <v1.h>
endif ifndef INCLUDED_MBASE
include <mbase.h>
endif ifndef INCLUDED_SELMGR
include <selmgr.h>
endif ifndef INCLUDED_HILITABLE
include <hilitable.h>
endif ifndef INCLUDED_DETAIL
include <detail.h>
endif ifndef INCLUDED_WC_DETAIL
include <wc_detail.h>
endif ifndef INCLUDED_FE
include <fe.h>
endif ifndef INCLUDED_SLACK
include <slack.h>
#endif

// ****************************************************************************
// *                                                                          *
// *                         Class Hilite_grobj                               *
// *                                                                          *
// ****************************************************************************

//----------------------------------------------------------------------------
// Declaration of class Hilite_grobj
//---------------------------------------------------------------------------- class Hilite_grobj : public Hilitable {
// This class supports hiliting of a GSS grobj.

private:     // data
    Pcarea           *area_p;
    GROBJ            the_grobj;      // grobj that will be hilited
///void             *hilited_handle; // handle that Gss returns
    Boolean          hilited;

public:      // functions
    Hilite_grobj(
        GROBJ        the_grobj,
        Pcarea       *area,
        Heap         *heap_p         // heap from which to allocate
    );

GROBJ grobj()
        { return the_grobj;}
    Gss_image *gss_image()
        { return area_p->graphic_image();}
    void hilite();
    void unhilite();
    void dump(
        const char *const name_p = NULL,   // pointer to object name
        const int          tabs = 0,       // nesting level
        ostream            &out = cout     // output stream
    );
};

//----------------------------------------------------------------------------
// Implementation of class Hilite_grobj
//----------------------------------------------------------------------------
Hilite_grobj::Hilite_grobj(
    GROBJ        the_grobj,
    Pcarea       *area,
    Heap         *heap_p
    )
{
    this == (this) ? this : (Hilite_grobj *) heap_p->allocate(sizeof(Hilite_grobj));
    area_p = area;
    Hilite_grobj::the_grobj = the_grobj;

hilited = FALSE;
}
```

```
//Hilite_grobj::Hilite_grobj()
// [
//////set_picture(picture);
//////if (hilited)
//////   highlight_object(hilited_handle, the_grobj);
// ]

void Hilite_grobj::hilite()
    {
        if (!hilited) [          // don't do it again...
            set_picture(area_p->graphic_image());
//           highlight_object(hilited_handle, the_grobj);
            set_override(the_grobj, line_color, short(QP_COLOR_SELECT));
            set_override(the_grobj, text_color, short(QP_COLOR_SELECT));
            hilited = TRUE;
        ]
    } void Hilite_grobj::unhilite()
    {
        if (hilited) [    //only do this if we are already hilited.
            set_picture(area_p->graphic_image());
//           highlight_object(hilited_handle, the_grobj);
            set_override(the_grobj, line_color, nil);
            set_override(the_grobj, text_color, nil);
            hilited = FALSE;
        ]
    } void Hilite_grobj::dump(
    const char *const name_p,      // pointer to object name
    const int        tabs,         // nesting level
    ostream          &out          // output stream
    )
    // dump internal data representation
    [
        start_dump("Hilite_grobj", this, name_p, tabs, out);
        indent_dump(tabs, out) << "\tarea_p = " << dump_ptr(area_p)
            << "; grobj = " << the_grobj
            << (hilited ? "; HILITED" : "; NOT HILITED") << "\n";
        end_dump(tabs, out);
    ]

// ****************************************************************************
// *                                                                          *
// *                        Class Undo_pc_config                              *
// *                                                                          *
// ****************************************************************************

//----------------------------------------------------------------------------
// Declaration of class Undo_pc_config
//----------------------------------------------------------------------------
class Undo_pc_config : public Undostate {
    // This class encapsulates the state data required to undo a config change private:     // data
    Pc_config_data   the_config;
    Pcarea           *myarea;     //This is a handle for me to reset the state public:      // functions
//----------------------------------------------------------------------------
Undo_pc_config(
    Pc_config_data   &the_old_config,
    Pcarea           *myarea,
    Heap             *heap_p = NULL
    );
    // Construct a new Undo_pc_config //----------------------------------------------------------------------------
void undo();
    // This is the handler that is called in response to an undo() of the
    // base_qparea.

//----------------------------------------------------------------------------
void redo()
    // This is the handler that is called in response to an redo() of the
    // base_qparea.  Since complete state information is maintained this is
    // simply a call to undo()
    { undo(); }

//----------------------------------------------------------------------------
Boolean dead()
    // Since the state in this Undostate is valid so long as the area is open
    // it will never be dead()
    { return FALSE;}

//----------------------------------------------------------------------------
virtual void dump(
    const char*    const name_p = NULL, // pointer to object name
```

```
     const int      tabs = 0,         // nesting level
     ostream       &out      = cout   // output stream
  );
  // This virtual function is called to dump an Undo_pc_config.  It calls
  // Undostate::dump() and then dumps the Pc_config data.
};
// **************************************************************************
// *                                                                        *
// *                            Class Pcarea                                *
// *                                                                        *
// **************************************************************************

//---------------------------------------------------------------------------
// Implementation of class Pcarea
//---------------------------------------------------------------------------
Pcarea::Pcarea()
   : (PC_WIN_NAME, &(fe_env.fe()), FALSE, 0, 0, 1000)
  // Create the picture and put it in the window.
  {
     heap_p = new Genheap();
     hilite_heap_p = new Genheap(10000, 0, heap_p);
     picture = Qparea::graphic_image();
     sheets = new Pcsheet_list(heap_p);
     origin = cur_path_origin();    // This will be initialized later, as well
     top_d = 0;
     bot_d = 0;
     uplabel_base = 0;
     downlabel_base = 0;
     locked = FALSE;
     prolog_sheet_title_grobj = QP_NULL_GROBJ;
     prolog_inst_title_grobj = QP_NULL_GROBJ;
     prolog_net_stub_grobj = QP_NULL_GROBJ;

// configuration data
     config_d = fe_env.fe().default_pc_config();

// Now go get the selected paths we are going to make a path context for
    // One of the following is guaranteed to be true by Fe.  The detail() function
    // returns the detailed path information that is used to generate the
    // path delay numbers in the display.

Sel_wcpath_scanner selwcscan;
     Sel_dlypath_scanner seldlyscan;
     Detail_scanner detail_scan;
     if (selwcscan.nitems() == 1) {
        selwcscan++;
        detail_scan.attach(selwcscan.curr_item()->detail());
        slack_type_d = selwcscan.curr_item()->slack().slack_type();
     }
     else if (seldlyscan.nitems() == 1) {
        seldlyscan++;
        detail_scan.attach(seldlyscan.curr_item()->detail());
        slack_type_d = QP_INVALID_SLACK;
     }
     else
        assert(FALSE, "Nothing selected to view path context on");

// Next we scan the path and make a Pcsheet for each sheet in it.
    // Note that we insert the sheets on the list in reverse since the path is
    // in reverse order from destination to source.  Also note that the call
    // to the Pcsheet constructor advances the scanner (which is why the
    // while loop does not.
     ++detail_scan;              // point at the first pin in the detail.
     while (detail_scan.valid())
        sheets->insert_item(new Pcsheet(this, detail_scan), NULL);

// Now we build the sheet and show it in the window.
     rebuild_path_context();
  }

Pcarea::~Pcarea()
  // Delete the data structures in addition to the window itself
  {
     delete sheets;    // Which deletes the Pcsheets in it.

// Note the hash tables are all in the heap_p so they are deleted by the
    // delete of the heap.  Also, any Hilite_grobjs are in hilite_heap_p which
    // will also be deleted by this.
     delete heap_p;
  }

//---------------------------------DATA INQUIRY FUNCIONS---------------------
coord Pcarea::sheet_label_baseline()
  // Returns the baseline for the sheet labels.
  {
     return (inst_label_baseline() + inst_labels_ext("dmytext").y
                  + PC_LABEL_SEPARATOR_HT);
  }
```

```
coord Pcarea::inst_label_baseline()
    // Returns the baseline for the inst labels.
    { return top_label_baseline();} coord Pcarea::label_separator_ht()
    { return PC_LABEL_SEPARATOR_HT;}

Point Pcarea::cur_path_origin()
    // This just returns a constant for now (and perhaps forever)
    { return PC_ORIGIN;} coord Pcarea::desired_exit(
    Pcsheet         *sheet
)
    // Returns the coord of the location that the next Pcsheet would like to see
    // this one exit at.
    {
    if (sheet == NULL) {
        return sheets->first()->desired_entry();
    }
    else {  // make a scanner point to this one so we can get the next one
        Pcsheet_scanner next_sheet(*sheets);
        while (++next_sheet)
            if (next_sheet.curr_item() == sheet) break;    // Find it.
        assert (next_sheet.valid(), "Couldn't find sheet on the sheet list");

// Now we can get the next sheet after this one and find its desired entry
        if (next_sheet++)
            return next_sheet.curr_item()->desired_entry();
        else   // This was the lastt one on the list
            return path_origin().y;    // We are all done.
    }
    }

//---------------------------------------------------------------------
//                    'CAUSING THINGS TO HAPPEN' FUNCTIONS
//---------------------------------------------------------------------
void Pcarea::application_cmd(
    const Qpcmd     &cmd
)
{
    // This is stubbed out for now.  More to come!
    Status status;
    status.set_ok();
    long cmd_id = cmd.id();      // This is needed due to a bug in the 1.1 C++ compiler.
    switch (cmd_id) {
        case CMD_SELECT_POINT: select_point_cmd(cmd); break;
        case CMD_TEMPLATE_PATH_CONTEXT: {
            save_undo_state(new Undo_pc_config(config_d, this));
            config_d = fe_env.fe().process_pc_config(config_d, cmd);
            rebuild_path_context();
            break;
        }
        default: unknown_command(cmd_id);
    } if (status.bad())
        fe_env.report(status);
}

//---------------------------------------------------------------------
void Pcarea::rebuild_path_context()
    // Delete and rebuild the picture in the window
{
    lock();     // locks the display in the picture
    // First delete the sheet and get rid of references to objects in it, as
    // well as clearing the hiliting objects.

Pcsheet_scanner scan(*sheets);
    while (++scan) scan.curr_item()->clear_graphics();
    hilite_heap_p->clear();
    clear_hilitables();          // so any existing Hilite_grobjs go away // Now make a new picture and put it into the Window*, then delete the old one
    Gss_image *oldpicture = picture;
    new_picture(picture);
    if (locked) lock_display(picture);
    set_picture_scale(picture, PC_PIC_SCALE, (short) mm);
    if (config().crawl_text)
        set_text_mode(short(continuous_scale));

delete_picture(oldpicture);

// Scan the sheets and find out the max ht above and below the baseline
    // Note that if this function is changed to change the location of the labels
    // then the draw_sheet_labels and draw_inst_labels functions must change as
    // well.
    coord up = 0;          // contains max graphics extent up
    coord down = 0;        // contains max graphics extent down (this is negative)
```

```
    coord upper_labels_ht = 0;  // heights of the labels above and below the path
    coord lower_labels_ht = 0;

scan.reset();
    while (++scan) {
        Pcsheet_sizes sizes = scan.curr_item()->sizes();
        up = max(up, sizes.graphics_ext().y(1));
        down = min(down, sizes.graphics_ext().y(0));
        upper_labels_ht = max(upper_labels_ht, sizes.sheet_labels_ext().y
                              + sizes.inst_labels_ext().y);
    }

// get the height of the upper and lower labels and set the up_height and
    // down_height.  Recall that 'down' is negative.
    origin = cur_path_origin();

uplabel_base = origin.y + up + 2 * label_separator_ht();
    // '2' above is one for inst to sheet labels space and one for graphics to
    // text labels space.
    downlabel_base = origin.y + down - label_separator_ht();
    top_d = uplabel_base + upper_labels_ht;
    bot_d = downlabel_base - lower_labels_ht;

// Now build the prolog segment and then draw each of the sheet segments
    // First find out where we would like to start.
    scan.reset();
    scan++;
    Point next_seg_enter_point(path_origin().x, scan.curr_item()->desired_entry());
    if (next_seg_enter_point.y != MIN_INT)
        next_seg_enter_point = build_prolog(next_seg_enter_point);
    else
        next_seg_enter_point = path_origin();

scan.reset();
    while (++scan)
        next_seg_enter_point = scan.curr_item()->build_seg(next_seg_enter_point);

hilite_all_selections();
    unlock();
}

//-----------------------------------------------------------------
Point Pcarea::build_prolog(
    Point        entry
)
// Build the prolog segment
{
    // Get the extent of the "sheet label" (actually the sheet titles) and
    // fake it into drawing in the correct place (this is actually right justified
    // whereas the sheet labels are generally left justified.
    Point label_extent = sheet_labels_ext(PC_FILENAME_TITLE,
                                PC_SHEETNAME_TITLE, PC_INSTPNAME_TITLE);
    prolog_sheet_title_grobj = build_sheet_label(entry.x - PC_LABEL_SEPARATOR_WID,
                                PC_FILENAME_TITLE, PC_SHEETNAME_TITLE,
                                PC_INSTPNAME_TITLE, TRUE);
    label_extent = inst_labels_ext(PC_INSTNAME_TITLE);
    prolog_inst_title_grobj = build_inst_label(entry.x - PC_LABEL_SEPARATOR_WID,
                                PC_INSTNAME_TITLE, TRUE);

// Now draw the stub net if the first segment in the first sheet is a
    // net.
    Net_ref entry_net = sheets->first()->input_net();
    if (entry_net.valid()) {
        stub[0].x = entry.x - PROLOG_STUB_LENGTH;
        stub[0].y = entry.y;
        stub[1].x = entry.x;
        stub[1].y = entry.y;
        prolog_net_stub_grobj = build_polyline(stub, 2, entry_net);
    } return entry;
}

//-----------------------------------------------------------------
//                          GRAPHICS FUNCTIONS
//-----------------------------------------------------------------
// Note, these functions have been put into Pcarea so that the vl dependencies
// can be isolated to here.  Ideally, these functions (or similar ones) would
// be part of a global library.
void Pcarea::lock()
    // lock the picture
{
    locked = TRUE;
    lock_display(picture);
} void Pcarea::unlock()
    // unlock the picture
{
```

```
        locked = FALSE;
        unlock_display(picture);
    } void Pcarea::hilite(
    Ciinst     *inst
    )
    // Hilite the given instance, if it is in this area.  This function is
    // provided since there is not an Inst_ref for non-primitive instances.
    {
        lock();
        Hilite_qparea::hilite(inst);
        unlock();
    } void Pcarea::hilite(
    Inst_ref    &inst
    )
    // Hilite the given instance, if it is in this area.
    {
        lock();
        Hilite_qparea::hilite(inst);
        unlock();
    } void Pcarea::hilite(
    Net_ref     &net
    )
    // Hilite the given net, if it is in this area.
    {
        lock();
        Hilite_qparea::hilite(net);
        unlock();
    } void Pcarea::unhilite(
    Ciinst     *inst
    )
    // Unhilite the given instance, if it is in this area.  This function is
    // provided since there is not an Inst_ref for non-primitive instances.
    {
        lock();
        Hilite_qparea::unhilite(inst);
        unlock();
    } void Pcarea::unhilite(
    Inst_ref    &inst
    )
    // Unhilite the given instance, if it is in this area.
    {
        lock();
        Hilite_qparea::unhilite(inst);
        unlock();
    } void Pcarea::unhilite(
    Net_ref     &net
    )
    // Unhilite the given net, if it is in this area.
    {
        lock();
        Hilite_qparea::unhilite(net);
        unlock();
    } void Pcarea::unhilite_all(
    Selmgr_type     type
    )
    {
        lock();
        Hilite_qparea::unhilite_all(type);
        unlock();
    }

//----------------------------------------------------------------------
GROBJ Pcarea::build_sheet_separator(
    coord               x_location,
    Pc_sheet_sep_type   type
    )
    // Draw a sheet separator
    {
        short style;
        char  *chars;
        switch (type) {
            case PC_SHEET_UNK:
                style = solid;
                break;
```

```
            case PC_SHEET_UP:
                style = MIN_SHORT; // short_dashes;
                chars = ">>";
                break;
            case PC_SHEET_DOWN:
                style = MIN_SHORT; // long_dashes;
                chars = "<<";
                break;
            case PC_SHEET_SAME:
                style = dotted;
                break;
            case PC_SHEET_PROLOG:
                style = solid;
                break;
            default: assert(FALSE, "Bad sheet separator type supplied");
        } set_picture(picture);
        GROBJ the_grobj = 0;
        long dmystatus = 0;
    // Make the grobj.
        new_object(0, 0, PC_SHEET_SEP_LEVEL, the_grobj);

if (style != MIN_SHORT) {
            set_attribute(line_style, style, dmystatus);
            init_point(x_location, top(), dmystatus);
            terminal_point(x_location, bottom(), dmystatus);
        }
        else {
            int char_count = (top() - bottom()) / PC_SHEET_SEP_CHAR_HT;
            char *sep_string = new char[char_count];
            for (int i = 0; i < char_count; i += 2) {
                sep_string[i] = chars[0];
                sep_string[i+1] = chars[1];
            }

// make the text for the object
            text_t text;
            text.string = NULL;
            copy(sep_string, (short) char_count, text.string);
            delete sep_string;
            text.user_index = 0;
            text.x = x_location;
            text.y = bottom();
            text.char_ht = PC_SHEET_SEP_CHAR_HT;
            text.font = 1;
            text.mirroring = PASCAL_FALSE;
            text.rotation = 90;
            text.justification = cl;
            text.color = 1;

text(text, dmystatus);
        } close_object();

return the_grobj;
    }

//----------------------------------------------------------------
GROBJ Pcarea::copy_cache_grobj(
    GROBJ       cache_grobj,
    Boolean     flip,
    Point       loc,
    Ciinst      *ciinst,
    short       to_level
)
// Copy a grobj from cache into this pcarea.
{
    assert(cache_grobj, "Attempt to copy a NULL graphical object");
    set_picture(picture);
    GROBJ the_grobj = QP_NULL_GROBJ;
    if (cache_grobj != QP_NULL_GROBJ) {
        Gss_image *pic = fe_env.ckt_info().cache_picture();
        copy_move_object(cache_grobj, pic,
                         to_level, loc.x, loc.y, the_grobj);
        if (flip)
            rotate_object(the_grobj, 0, PASCAL_TRUE, PASCAL_FALSE);
    }

// Next make the hiliting grobj for this grobj.  Note that this thing
    // is created in a special heap and so will be deleted when that heap
    // is cleared/deleted at destructor time or at clear_graphics time.
    if (ciinst && the_grobj != QP_NULL_GROBJ)
        add_hilitable(ciinst, new Hilite_grobj(the_grobj, this, hilite_heap_p));

return the_grobj;
}
```

```
GROBJ Pcarea::copy_cache_grobj(
    GROBJ       cache_grobj,
    Boolean     flip,
    Point       loc,
    Inst_ref    iref,
    short       to_level
)
// Copy a grobj from cache into this pcarea.
{
    GROBJ the_grobj = copy_cache_grobj(cache_grobj, flip, loc, NULL, to_level);

// Now make the hiliting grobj for this grobj.  Note that this thing
    // is created in a special heap and so will be deleted when that heap
    // is cleared/deleted at destructor time or at clear_graphics time.
    if (iref.valid() && the_grobj != QP_NULL_GROBJ)
        add_hilitable(iref, new Hilite_grobj(the_grobj, this, hilite_heap_p));

return the_grobj;
}

//--------------------------------------------------------------------
GROBJ Pcarea::build_polyline(
    Point       points[],
    int         npoints,
    Net_ref     nref
)
// Build a multisegment line object.
{
    assert(npoints != 0, "Zero length polyline");
    set_picture(picture);
    GROBJ the_grobj = 0;
    long dmystatus = 0;

// Make the grobj.
    new_object(0, 0, PC_NET_LEVEL, the_grobj);
    init_point(points[0].x, points[0].y, dmystatus);
    for (int i = 1; i < npoints; i++)
        terminal_point(points[i].x, points[i].y, dmystatus);
    close_object();

// Now make the hiliting grobj for this grobj.  Note that this thing
    // is created in a special heap and so will be deleted when that heap
    // is cleared/deleted at destructor time or at clear_graphics time.
    if (nref.valid() && the_grobj != QP_NULL_GROBJ)
        add_hilitable(nref, new Hilite_grobj(the_grobj, this, hilite_heap_p));

return the_grobj;
}

//--------------------------------------------------------------------
GROBJ Pcarea::build_text(
    coord               baseline,
    coord               x_loc,
    const char          *str,
    const Pc_text_info  &info
)
// Build a text object.
{
    if (!str) return QP_NULL_GROBJ; // don't build if it is an empty string set_picture(picture);
    GROBJ the_grobj = 0;
    long dmystatus = 0;

// First fill up the gss text record
    short justification;
    text_t text;
    text.string = NULL;
    copy(str, (short)strlen(str), text.string);
    text.user_index = 0;
    text.x = x_loc;
    text.y = baseline;
    text.char_ht = info.ht;
    text.font = 1;
    text.mirroring = PASCAL_FALSE;
    text.rotation = 0;
    switch (info.align) {
        case PC_BL: justification = bl;
            break;
        case PC_BR: justification = br;
            break;
        case PC_TL: justification = tl;
            break;
        case PC_TR: justification = tr;
            break;
        case PC_BC: justification = bc;
            break;
        case PC_TC: justification = tc;
            break;
```

```
            default: assert(FALSE, "bad text justification");
        }
        text.justification = justification;
        text.color = info.color;

// Make the grobj.
        new_object(0, 0, PC_TEXT_LEVEL, the_grobj);
        text(text, dmystatus);
        close_object();

delete text.string;
        return the_grobj;
    }

GROBJ Pcarea::build_text(
    coord               baseline,
    coord               x_loc,
    const char          *str,
    const Pc_text_info  &info,
    Net_ref             nref
    )
    // Build a text object.
    {
        GROBJ the_grobj = build_text(baseline, x_loc, str, info);

// Now make the hiliting grobj for this grobj.  Note that this thing
    // is created in a special heap and so will be deleted when that heap
    // is cleared/deleted at destructor time or at clear_graphics time.
        if (nref.valid() && the_grobj != QP_NULL_GROBJ)
            add_hilitable(nref, new Hilite_grobj(the_grobj, this, hilite_heap_p));

return the_grobj;
    }

//-----------------------------------------------------------------------
GROBJ Pcarea::build_sheet_label(
    coord           x_loc,
    const char      *filename,
    const char      *sheetname,
    const char      *instpname,
    Boolean         right_justify
    )
    // Build a text object.
    {
        set_picture(picture);
        GROBJ the_grobj = 0;
        long dmystatus = 0;

// First fill up the gss text record
        text_t text;
        text.string = NULL;
        text.x = x_loc + PC_LABEL_SEPARATOR_WID;
        text.y = sheet_label_baseline();
        text.char_ht = PC_SHEET_LABEL_TEXT_HT;
        text.font = 1;
        text.mirroring = PASCAL_FALSE;
        text.rotation = 0;
        if (right_justify)
            text.justification = br;
        else
            text.justification = bl;
        text.color = QP_COLOR_PLAIN_TEXT;
        text.eyt = text.eyb = text.exl = text.exr = 0;

// Make the grobj.
        new_object(0, 0, PC_TEXT_LEVEL, the_grobj);

if (config().inst_labels) {
            copy(instpname, (short) strlen(instpname), text.string);
            text.user_index = 0;
            text(text, dmystatus);
        }

// Sheetname case conversion, if requested.
        String cvtstr;
        if (config().upcase) {
            cvtstr = sheetname;
            cvtstr = cvtstr.upper();
            sheetname = cvtstr.c_string();
        }
        copy(sheetname, (short) strlen(sheetname), text.string);
        text.user_index = 1;
        text.y += (text.eyt - text.eyb + PC_TEXT_LINE_SEPARATOR);
        text(text, dmystatus);

// Filename case conversion, if requested.
        if (config().upcase) {
            cvtstr = filename;
            cvtstr = cvtstr.upper();
            filename = cvtstr.c_string();
        }
```

```
        copy(filename, (short) strlen(filename), text.string);
        text.user_index = 2;
        text.y += (text.eyt - text.eyb + PC_TEXT_LINE_SEPARATOR);
        text(text, dmystatus);

close_object();

delete text.string;
        return the_grobj;
    }
//-----------------------------------------------------------------
GROBJ Pcarea::build_inst_label(
    coord              x_center,
    const char         *instname,
    Boolean            right_justify
    )
    // Build a text object.
    {
        if (!config().inst_labels)
            return QP_NULL_GROBJ;
        set_picture(picture);
        GROBJ the_grobj = 0;
        long dmystatus = 0;

// First fill up the gss text record
        text_t text;
        text.string = NULL;
        copy(instname, (short) strlen(instname), text.string);
        text.user_index = 0;
        text.x = x_center;
        text.y = inst_label_baseline();
        text.char_ht = PC_INST_LABEL_TEXT_HT;
        text.font = 1;
        text.mirroring = PASCAL_FALSE;
        text.rotation = 0;
        if (right_justify)
            text.justification = br;
        else
            text.justification = bc;
        text.color = QP_COLOR_PLAIN_TEXT;

// Make the grobj
        new_object(0, 0, PC_TEXT_LEVEL, the_grobj);
        text(text, dmystatus);
        close_object();

delete text.string;
        return the_grobj;
    }
//-----------------------------------------------------------------
Point Pcarea::text_ext(
    const char         *str,
    const Pc_text_info &info
    )
    // This function is duplicating what Gss does.  I know this is bad, but I
    // have to do it too many times to justify creating some dummy Gss object
    // and putting text into it so I can get the extent back.
    {
        Point pt;
        pt.x = info.ht * strlen(str);      // Forget the blank part of a character at the end
        pt.y = info.ht + (info.ht + 1)/ 2; // Second part of expression is for the descender.

return pt;
    }

Point Pcarea::sheet_labels_ext(
    const char *filename,
    const char *sheetname,
    const char *instpname
    )
    // Returns the extent of the labels
    {
        int len = strlen(filename);
        len = max(len, strlen(sheetname));
        if (config().inst_labels)
            len = max(len, strlen(instpname));

Point pt;
        pt.x = PC_SHEET_LABEL_TEXT_HT * len + PC_LABEL_SEPARATOR_WID;
        pt.y = (PC_SHEET_LABEL_TEXT_HT + (PC_SHEET_LABEL_TEXT_HT + 1) / 2) * 3
             + PC_TEXT_LINE_SEPARATOR * 2;

return pt;
    }

Point Pcarea::inst_labels_ext(
    const char *instname
    )
    {
```

```
        if (config().inst_labels) {
            Pc_text_info info;
            info.ht = PC_INST_LABEL_TEXT_HT;
            return text_ext(instname, info);
        }
        else
            return Point(0,0);
    }

//------------------------------------------------------------------
Rectangle Pcarea::grobj_ext(
    GROBJ         object
    )
    {
        set_picture(picture);

Point pt;
        if (object != QP__NULL_GROBJ)
            get_object_origin(object, pt.x, pt.y);
        return grobj_ext_abs(object).moved_by(Point(0,0) - pt);
    }

Rectangle Pcarea::cache_grobj_ext(
    GROBJ         object
    )
    {
        Gss_image *pic = fe_env.ckt_info().cache_picture();
        set_picture(pic);

Rectangle ext;
        if (object != QP__NULL_GROBJ)
            get_object_extent(object, ext.x(0), ext.y(0), ext.x(1), ext.y(1));

Point pt;
        if (object != QP__NULL_GROBJ)
            get_object_origin(object, pt.x, pt.y);

return ext.moved_by(Point(0,0) - pt);
    }

Rectangle Pcarea::grobj_ext_abs(
    GROBJ         object
    )
    {
        set_picture(picture);

Rectangle ext;
        if (object != QP__NULL_GROBJ)
            get_object_extent(object, ext.x(0), ext.y(0), ext.x(1), ext.y(1));
        return ext;
    }

//------------------------------------------------------------------
//                          DUMP, ETC FUNCTIONS
//------------------------------------------------------------------
void Pcarea::dump(
    const char *const name_p,       // pointer to object name
    const int         tabs,         // nesting level
    ostream           &out          // output stream
    )
    // dump internal data representation
    {
        start_dump("Pcarea", this, name_p, tabs, out);
        Hilite_qparea::dump("", tabs + 1, out);
        indent_dump(tabs, out) << "\theap_p = " << dump_ptr(heap_p)
            << "; Gss_picture = " << dump_ptr(graphic_image()) << "\n";
        if (sheets)
            sheets->dump("sheets", tabs + 1, out);

indent_dump(tabs, out) << "origin = " << path_origin() << "; top = " << top()
            << "; bottom = " << bottom() << "\n";
        indent_dump(tabs, out) << "uplabel_base = " << uplabel_base
            << "; downlabel_base = " << downlabel_base
            << "; " << (locked ? "LOCKED" : "NOT LOCKED") << "\n";
        indent_dump(tabs, out) << "prolog_sheet_title_grobj = " << prolog_sheet_title_grobj
            << "; prolog_inst_title_grobj = " << prolog_inst_title_grobj
            << "; prolog_net_stub_grobj = " << prolog_net_stub_grobj
            << "\n";
        indent_dump(tabs, out) << "slack_type = " << dump_qp__slack_t(slack_type()) << "\n";
        end_dump(tabs, out);
    }

//------------------------------------------------------------------
//                          PRIVATE FUNCTIONS
//------------------------------------------------------------------
void Pcarea::select_point_cmd(
    const Qpcmd         &cmd
    )
    {
```

```
        short one_of_n;
        cmd.one_of_n(1, &one_of_n);
        if (one_of_n == 2) return;     // nothing on SELECT POINT UP long x1;
        long y1;
        cmd.integer(1, &x1);
        cmd.integer(2, &y1);

coord x = x1;
        coord y = y1;
        if (y < top() && y > bottom()) {         // it is in the range of the sheets
            if (x < path_origin().x) {           // select the stub entry net
                Net_ref the_net = sheets->first()->input_net();
                if (the_net.valid())
                    fe_env.selmgr().select(the_net);
            }
            else {                               // try the segments
                Pcsheet_scanner scan(*sheets);
                while (++scan)
                    if (scan.curr_item()->select(x,y)) break;
            }
        }
    }

// ******************************************************************
// *                                                                *
// *                    Class Undo_pc_config                        *
// *                                                                *
// ******************************************************************

//------------------------------------------------------------------
//            Implementation of Class Undo_pc_config
//------------------------------------------------------------------
Undo_pc_config::Undo_pc_config(
    Pc_config_data      &the_old_config,
    Pcarea              *myarea,
    Heap                *heap_p
    ) : (myarea->undo_time())
    // Construct an Undo_pc_config element.  heap_p = NULL => use heap__misc_heap()
    {
        if (heap_p == NULL) heap_p = heap__misc_heap();
        this = (this == NULL) ? (Undo_pc_config *) heap_p->allocate(sizeof(Undo_pc_config)) : this;
        Undo_pc_config::myarea = myarea;
        Undo_pc_config::the_config = the_old_config;
    }

//------------------------------------------------------------------
void Undo_pc_config::undo()
    // Restore myarea to the configuration I contain
    {
        myarea->config_d = the_config;
        myarea->rebuild_path_context();
    }

//------------------------------------------------------------------
void Undo_pc_config::dump(
    const char*     const name_p,   // pointer to object name
    const int       tabs,           // nesting level
    ostream         &out            // output stream
    )
    // This virtual function is called to dump an Undo_pc_config.  It calls
    // Undostate::dump()
    {
        start_dump("Undo_pc_config", this, name_p, tabs, out);
        Undostate::dump("", tabs, out);      // First dump the underlying members
        indent_dump(tabs, out) << "\tmyarea = " << dump_ptr(myarea) << "\n";
        the_config.dump("the_config", tabs + 1, out);
        end_dump(tabs, out);
    }

// ******************************************************************
// *                                                                *
// *                    Class Pc_config_data                        *
// *                                                                *
// ******************************************************************

//------------------------------------------------------------------
// Implementation of class Pc_config_data
//------------------------------------------------------------------
void Pc_config_data::dump(
    const char*     const name_p,   // pointer to object name
    const int       tabs,           // nesting level
    ostream         &out            // output stream
    )
    {
```

```
        start_dump("Pc_config_data", this, name_p, tabs, out);
        indent_dump(tabs, out)
            << ((upcase) ? "UPCASE" : "LEAVE CASE ALONE")
            << ((crawl_text) ? "; DRAW TEXT SLOW" : "; NORMAL TEXT")
            << ((inst_labels) ? "; SHOW INSTANCE LABELS" : "; NO INSTANCE LABELS")
            << ((nonuser_net_names) ? "; SYSTEM NET NAMES" : "; NO SYSTEM NET NAMES")
            << ((hierarchical_symbol) ? "; SHOW HIERARCHICAL SYMBOL" : "; NO HIERARCHICAL SYMBOL")
            << "\n";
        end_dump(tabs, out);
    }
/*
 * MODULE
 *    pcsheet.c - Definition of class Pcsheet
 *
 * COPYRIGHT
 *    Copyright (C) 1988 Mentor Graphics Corporation
 *
 * DESCRIPTION
 *
 *    This is the file that manages the creation and drawing of path context
 *    areas.
 */
#ifndef INCLUDED_PCSHEET
include <pcsheet.h>
endif ifndef INCLUDED_MLIB
include <mlib.h>
endif ifndef INCLUDED_STRING
include <string.h>
endif ifndef INCLUDED_GEOM
include <geom.h>
endif ifndef INCLUDED_REFS
include <refs.h>
endif ifndef INCLUDED_FE_ENV
include <fe_env.h>
endif ifndef INCLUDED_CIINST
include <ciinst.h>
endif ifndef INCLUDED_SHEET
include <sheet.h>
endif ifndef INCLUDED_CKT_INFO
include <ckt_info.h>
endif ifndef INCLUDED_PCAREA
include <pcarea.h>
endif ifndef INCLUDED_PCSEG
include <pcseg.h>
endif ifndef INCLUDED_DETAIL
include <detail.h>
endif ifndef INCLUDED_SELMGR
include <selmgr.h>
endif

// ****************************************************************************
// *                                                                          *
// *                           Class Pcsheet_sizes                            *
// *                                                                          *
// ****************************************************************************

//---------------------------------------------------------------------------
// Implementation of class Pcsheet_sizes
//---------------------------------------------------------------------------
void Pcsheet_sizes::dump(
    const char *const name_p,       // pointer to object name
    const int         tabs,         // nesting level
    ostream           &out          // output stream
    )
    // dump internal data representation
    {
```

```
      start_dump("Pcsheet_sizes", this, name_p, tabs, out);
      indent_dump(tabs, out) << "graphics_ext = " << graphics_ext_d << "\n";
      indent_dump(tabs, out) << "sheet_labels_ext = " << sheet_labels_ext_d << "\n";
      indent_dump(tabs, out) << "inst_labels_ext = " << inst_labels_ext_d << "\n";
      end_dump(tabs, out);
   }

//****************************************************************************
// *                                                                          *
// *                            Class Pcsheet                                 *
// *                                                                          *
//****************************************************************************

//----------------------------------------------------------------------------
// Implementation of class Pcsheet
//----------------------------------------------------------------------------
Pcsheet::Pcsheet(
   Pcarea          *parent_area,       // My parent in whose context I do all my graphics
   Detail_scanner  &detail_scan        // Location in the scan of the path to start
   )
   // Create the Pcsheet
   {
   // Initialize all this stuff
      this = (this == NULL) ? (Pcsheet *) parent_area->heap()->allocate(sizeof(Pcsheet)) : this;
      area_p = parent_area;
      sheet_sep_grobj = QP__NULL_GROBJ;
      sheet_label_grobj = QP__NULL_GROBJ;
      symbol_grobj = QP__NULL_GROBJ;
      exit_stub = QP__NULL_GROBJ;
      type = PC_SHEET_UNK;
      left_x = 0;           // just to initialize it.  It is set in build_seg()
      sizes_d.graphics_ext() = Rectangle(0,0, -1, 0);
      sizes_d.sheet_labels_ext() = Point(0,0);
      sizes_d.inst_labels_ext() = Point(0,0);

segs = new Pcseg_list(area_p->heap());
      seg_scan = new Pcseg_scanner(*segs, area_p->heap());

Inst_ref prim_inst = detail_scan.curr_item().pin().parent();
      Ciinst *ciinst = &(fe_env.ckt_info().cvt_ref(prim_inst));
      parent_inst = ciinst->parent();
      sheetname = ciinst->sheetname();
      long this_sheet = ciinst->sheet_id();

// Now do the setup stuff so we can build the seg list.  Since the terminating
   // (i.e. first one in the Path) pin can be either an input or output
   // we need to get this started correctly.  If the first node is a net then
   // the first pin is an output pin.  If it is not the first pin in the path
   // then we are exiting (remember, the path is backwards) an intermediate
   // Pcsheet, in which case the scanner
   // is pointing at an output pin of an instance and we want to generate its
   // net first.
      Boolean prev_seg_was_net = FALSE;    // So by default a net is built first
      if (detail_scan.position() == 0) {
         // This is the first Pin on the path.  Do we start with a Pcnet
         // or a Pcinst?
         if (detail_scan.curr_item().pin().pin_dir() != FROM) {
            // The first (actually it is the last, remember that the path is
            // in destination to source order) node in the path is a net, so
            // create the Pcinst that it is attached to first.
            prev_seg_was_net = TRUE;   // Though it really doesn't exist.
         }
         else {
            // The first (last) node in the path is an instance, so create the
            // net it drives first
            prev_seg_was_net = FALSE;   // Though it really doesn't exist.
         }
      }

// Now put the Pcsegs into the segs list.  Note that they are inserted at
   // the beginning in order to reverse the order of the Pin_refs in the path,
   // since for this window we want to think right to left (source to destination)
      Pin_ref this_pin = detail_scan.curr_item().pin();
      Boolean same_sheet = TRUE;
      do {
         this_pin = detail_scan.curr_item().pin();

// Check that we are still on the same sheet
         ciinst = &(fe_env.ckt_info().cvt_ref(this_pin.parent()));
         same_sheet = (ciinst->parent() == parent_inst &&
                       ciinst->sheet_id() == this_sheet);

// Note that even if this_pin is not on the same sheet we still want to put in
      // the net that it is connected to.  Also note that we cannot have
      // both !same_sheet and !prev_seg_was_net
         if (prev_seg_was_net) {
            segs->insert_item(new Pcinst(area_p, this, detail_scan), NULL);
            prev_seg_was_net = FALSE;
```

```
        ]
        else {
            // Note that if !same_sheet then this is just a net stub on this sheet
            // to put the net name on.  In order not to duplicate the text string
            // (delay) on the net pass same_sheet to the constructor to determine
            // if it should draw the text or not.
            segs->insert_item(new Pcnet(area_p, this, detail_scan, same_sheet), NULL);
            prev_seg_was_net = TRUE;
        }
        if (!same_sheet) break;    // So we don't increment the scanner again
    } while (++detail_scan);

// Now, if we ran off the end of the scan we need to create the segment
    // at the end (actually the first segment in the displayed path).  Note
    // that we can only run off the end of the scan if the last pin was on this
    // sheet.
    if (!detail_scan.valid()) {
        if (!prev_seg_was_net)
            segs->insert_item(new Pcnet(area_p, this, detail_scan), NULL);
        else
            segs->insert_item(new Pcinst(area_p, this, detail_scan), NULL);
    }

// Now figure out how this sheet relates to the previous one (which will
    // be built next since we are reversing the order.  Oh isn't this easy to
    // understand?
    //
    // Note that at this point ciinst is the first (last) instance of the next
    // (previous) sheet.
    if (detail_scan.valid()) {
        if (ciinst->parent() == parent_inst)
            type = PC_SHEET_SAME;         // Same instance, different sheet
        else if (ciinst->parent()->is_parent(parent_inst))
            type = PC_SHEET_DOWN;
        else if (parent_inst->is_parent(ciinst->parent()))
            type = PC_SHEET_UP;
        else // somehow the path tunnelled through the hierarchy, probably by
             // way of some global net.  For now I am going to flag that
             // as PC_SHEET_UNK unless we need some better description of it
            type = PC_SHEET_UNK;
    }
    else
        type = PC_SHEET_PROLOG;    // First sheet in the path context
}

Pcsheet::~Pcsheet()
    // Delete the data structures in addition to the window itself
{
    delete segs;      // Which deletes the segments on it.
    delete seg_scan;
}

//--------------------------------------------------------------------
//                    !DATA INQUIRY! FUNCTIONS
//--------------------------------------------------------------------
coord Pcsheet::desired_exit(
    Pcseg      *seg
)
    // Returns the entry point that the segment following this one would like
    // to see
{
    if (seg == NULL) {
        return segs->first()->desired_entry();
    }
    else {   // make a scanner point to this one so we can get the next one
        Pcseg_scanner next_seg(*segs, NULL);
        if (seg_scan->valid() && seg_scan->curr_item() == seg) {
            // This is the normal case, the current seg asking for its exit
            next_seg.align_with(*seg_scan);
        }
        else {      // Make a scanner to find it
            next_seg.reset();
            while (++next_seg)
                if (next_seg.curr_item() == seg) break;   // Find it.  It better be there
        }

// Now we can get the next segment after this one and find its desired entry
        if (next_seg++)
            return next_seg.curr_item()->desired_entry();
        else  // This was the last one on the list
            return area_p->desired_exit(this);    // Return desired entry of next sheet
    }
}
//--------------------------------------------------------------------
Pcsheet_sizes &Pcsheet::sizes()
    // Returns some graphical size information about this sheet segment
{
    // First establish the global sheet stuff
    sizes_d.sheet_labels_ext() = area_p->sheet_labels_ext(parent_inst->file_name().c_string(),
                                sheetname.c_string(), parent_inst->name());
```

```
    // Now get the extents from the individual Pcsegs and add them together
    sizes_d.inst_labels_ext() = Point(0,0);
    sizes_d.graphics_ext() = Rectangle(0,0,0,0);
    Pcseg_scanner scan(*segs);
    while (++scan) {
        Rectangle seg_ext = scan.curr_item()->ext();    // compute the segment extent
        sizes_d.graphics_ext().x(1) += seg_ext.width();
        sizes_d.graphics_ext().y(0) = min(seg_ext.y(0), sizes_d.graphics_ext().y(0));
        sizes_d.graphics_ext().y(1) = max(seg_ext.y(1), sizes_d.graphics_ext().y(1));
        sizes_d.inst_labels_ext() = max(scan.curr_item()->inst_labels_ext(),
                                        sizes_d.inst_labels_ext());
    } segs_bottom = sizes_d.graphics_ext().y(0);

// Now add the height of the hierarchical symbol graphics of this sheet,
    // which are currently assumed to be below the path context.
    Rectangle hier_sym_ext;
    if (area_p->config().hierarchical_symbol) {
        hier_sym_ext = area_p->cache_grobj_ext(parent_inst->cache_grobj());
        sizes_d.graphics_ext().y(0) = sizes_d.graphics_ext().y(0)
                                      - hier_sym_ext.height()
                                      - PC_HIER_SYMBOL_SEPARATOR_HT;
    }

// Just in case the path context width is smaller than the hierarchical symbol
    sizes_d.graphics_ext().x(1) = max(sizes_d.graphics_ext().x(1),
                                      hier_sym_ext.width());
    return sizes_d;
}

//------------------------------------------------------------------
coord Pcsheet::desired_entry()
// returns the y coordinate desired as the exit of the previous sheet.
{
    Pcseg_scanner scan(*segs);
    ++scan;
    assert(scan.valid(), NULL);    // make sure something is on segs list
    return scan.curr_item()->desired_entry();
}

//------------------------------------------------------------------
coord Pcsheet::width()
// returns the width of this sheet, computing it if necessary
{
    if (sizes_d.graphics_ext().x(1) < 0)
        sizes();        // Which sets the caches for me and my segs
    assert(sizes_d.graphics_ext().x(1) >= 0, "sizes() set invalid width for Pcsheet");
    return max(sizes_d.graphics_ext().width(),
               sizes_d.sheet_labels_ext().x + PC_LABEL_SEPARATOR_WID);
}
//------------------------------------------------------------------
Net_ref Pcsheet::input_net()
// Returns the Net_ref for the input net
{
    return segs->first()->input_net();
}

//------------------------------------------------------------------
Boolean Pcsheet::select(
    coord    x,
    coord    y
)
// Select the object at x,y if in this sheet.  Returns TRUE if something
// selected or if x,y is in this sheet but nothing should be selected
{
    if (x < left_x || x > left_x + width())
        return FALSE;
    else {                // do something in this sheet
        if (y > area_p->top_label_baseline() || y < segs_bottom)
            // it is in the sheet but outside the range of the segments
            fe_env.selmgr().select(parent_inst);
        else {            // it is within the range of the segments, let them decide what to select
            Pcseg_scanner scan(*segs);
            while (++scan)
                if (scan.curr_item()->select(x, y)) break;

if (!scan.valid() && exit_stub != QP_NULL_GROBJ) { // none of the segments
                                                               // liked it, select the
                                       // exit stub if there is one
                Net_ref nref = segs->last()->output_net();
                if (nref.valid())
                    fe_env.selmgr().select(nref);
            }
        } return TRUE;
    }
}
```

```
//----------------------------------------------------------------
//                    'DATA INSERTION' FUNCTIONS
//----------------------------------------------------------------
void Pcsheet::clear_graphics()
    // Clear out all graphical information
    {
        sizes_d.graphics_ext().x(1) = -1;
        sheet_sep_grobj = sheet_label_grobj = symbol_grobj = exit_stub = QP_NULL_GROBJ;

Pcseg_scanner scan(*segs);
        while (++scan)
            scan.curr_item()->clear_graphics();
    }

//----------------------------------------------------------------
//                    'CAUSING THINGS TO HAPPEN' FUNCTIONS
//----------------------------------------------------------------
Point Pcsheet::build_seg(
    Point       entry
    )
    // Build the graphics for the segment.
    // A sheet segment consists of a sheet separator (and its associated sheet
    // labels and hierarchical symbol), a stub entry net that connects the
    // entry to the segment to the first instance of the segment, and then a
    // series of instance/net pairs that represents the stuff on this sheet.
    {
        left_x = entry.x;

// Sheet separator first.
        String tmp;
        area_p->build_sheet_separator(entry.x, type);
        const char *cname = parent_inst->pathname(&tmp);
        if (!cname || cname[0] == CHAR_NULL)
            cname = PC_ROOT_INSTANCE_NAME;
        area_p->build_sheet_label(entry.x, parent_inst->file_name().c_string(),
                                    sheetname.c_string(), cname);

Point sheet_entry = entry;

// Now do each of the segments that are in the sheet.
        seg_scan->reset();
        while (++(*seg_scan))
            entry = seg_scan->curr_item()->build_seg(entry);

// If the segments were not sufficient to cover the width of the sheet
    // add a net segment to cover the rest of the distance. However, only do
    // this if the previous segment returned a valid exit (i.e. exit.y != MIN_INT)
    // Note that this will happen if the previous seg was the terminating
    // instance.
        if (((entry.x - sheet_entry.x) < sizes_d.sheet_labels_ext().x + PC_LABEL_SEPARATOR_WID)
                && (entry.y != MIN_INT)) {    // Segs were too short
            stub[0] = entry;
            entry.x = sheet_entry.x + width() + PC_LABEL_SEPARATOR_WID;
            stub[1] = entry;
            exit_stub = area_p->build_polyline(stub, 2, segs->last()->output_net());
        };

// The hierarchical symbol.  Locate it such that the bottom extent of
    // the symbol is tangent with the bottom extent of this segment's graphics
    // extent.
        if (parent_inst->cache_grobj() != QP_NULL_GROBJ && area_p->config().hierarchical_symbol) {
            Rectangle sym_extent = area_p->cache_grobj_ext(parent_inst->cache_grobj());

// get the origin offset required to put the center of the symbol at x = 0 and
    // the bottom at y=0
            Point sym_origin_offset = Point(-sym_extent.x(1) / 2 , -sym_extent.y(0));

// Where the origin will go in the path context picture.
            Point sym_loc((sheet_entry.x + entry.x) / 2 + sym_origin_offset.x ,
                            area_p->bottom() + sym_origin_offset.y);

symbol_grobj = area_p->copy_cache_grobj(parent_inst->cache_grobj(),
                                        FALSE, sym_loc, parent_inst);
        } return entry;
    }
//----------------------------------------------------------------
void Pcsheet::dump(
    const char *const name_p,         // pointer to object name
```

```
       const int         tabs,        // nesting level
       ostream           &out         // output stream
       )
       // dump internal data representation
       {
           start_dump("Pcsheet", this, name_p, tabs, out);
           indent_dump(tabs, out) << "Area_p = " << dump_ptr(area_p) << "; sheetname = "
               << sheetname << "; parent_inst = " << dump_ptr(parent_inst) << "\n";
           if (segs != NULL)
               segs->dump("segs", tabs + 1, out);
           indent_dump(tabs, out) << "sheet_type (UNK=0,UP,DOWN,SAME,PROLOG) = "
               << type << "; sheet_sep_grobj = " << sheet_sep_grobj
               << "; sheet_label_grobj = " << sheet_label_grobj
               << "; exit_stub = " << exit_stub << "\n";
           sizes_d.dump("sizes_d", tabs + 1, out);
           end_dump(tabs, out);
       }

//****************************************************************************
// *                                                                         *
// *             Classes Pcsheet_list and Pcsheet_scanner                    *
// *                                                                         *
//****************************************************************************

//---------------------------------------------------------------------------
//    Implementation of  Pcsheet_list
//---------------------------------------------------------------------------

Pcsheet_list::Pcsheet_list(Heap *use_heap_p) : (use_heap_p)
    // create an empty Pcsheet_list and initialize it
    {
        use_heap_p = (use_heap_p) ? use_heap_p : heap__misc_heap();
        this = (this == NULL) ? (Pcsheet_list *) use_heap_p->allocate(sizeof(Pcsheet_list)) : this;
        // remaining initialization done by base class
    } void Pcsheet_list::clear()
    // delete the Pcsheet's and then the list
    {
        Pcsheet_scanner scan(*this);
        while (++scan) delete scan.curr_item();
        Qp_slist::clear();
    }

//---------------------------------------------------------------------------
//    Implementation of  Pcsheet_scanner
//---------------------------------------------------------------------------

Pcsheet_scanner::Pcsheet_scanner(Heap *heap_p) : (heap_p)
    // create unattached scanner
    {
        heap_p = (heap_p) ? heap_p : heap__misc_heap();
        this = (this == NULL) ? (Pcsheet_scanner *) heap_p->allocate(sizeof(Pcsheet_scanner)) : this;
        // remaining initialization done by base class
    }

Pcsheet_scanner::Pcsheet_scanner(Pcsheet_list &list, Heap *heap_p) : (list)
    // create attached scanner
    {
        heap_p = (heap_p) ? heap_p : heap__misc_heap();
        this = (this == NULL) ? (Pcsheet_scanner *) heap_p->allocate(sizeof(Pcsheet_scanner)) : this;
        // remaining initialization done by base class
    }
/*
 * MODULE
 *    pcseg.c - Definition of class Pcseg
 *
 * COPYRIGHT
 *    Copyright (C) 1988 Mentor Graphics Corporation
 *
 * DESCRIPTION
 *
 *    This is the file that manages the creation and drawing of path context
 *    areas.
 */ ifndef INCLUDED_PCSEG
include <pcseg.h>
endif ifndef INCLUDED_GEOM
include <geom.h>
endif ifndef INCLUDED_PCSHEET
include <pcsheet.h>
endif
```

```
// *********************************************************************
// Some statics because I can't initialize them when a static member.
static const Pc_text_info  name_info = { PC_GENERIC_TEXT_HT, PC_BC, QP_COLOR_NET_TEXT };
static const Pc_text_info  text_info = { PC_GENERIC_TEXT_HT, PC_TC, QP_COLOR_NET_TEXT };
static Point points[10];   // Some space to build lines in //-----------------------------------------------------------------
// Implementation of class Pcseg
//-----------------------------------------------------------------
Pcseg::Pcseg(
    Pcarea         *parent_area,
    Pcsheet        *parent_sheet,
    Detail_scanner &scan_point
)
    // Create this Pcseg.  It assumes that 'this' has been allocated by its
    // derived class.  Note that the detail scanner is in reverse order, that is
    // the output pin is the previous pin and the input pin is the current one.
{
    this = (this == NULL) ? (Pcnet *) parent_area->heap()->allocate(sizeof(Pcnet)) : this;
    area_p = parent_area;
    sheet_p = parent_sheet;
    // The scan point should only be !valid() if this segment is being built
    // for the input net to the path.  This will happen if the first node in
    // the path is an instance (actually, the last node in the scanner).  If
    // there is only one pin in the path then we have to ask it what type it
    // is.  Otherwise the curr_item() is the input pin and the prev_item() is
    // the output pin.  (Remember, the scan is backwards down the path)
    if (scan_point.valid() && scan_point.nitems() == 1) {
        // single pin path is special case boundary condition
        DIRECTION pin_dir = scan_point.curr_item().pin().pin_dir();
        ipin = (pin_dir != FROM) ? scan_point.curr_item().pin() : Pin_ref();
        opin = (pin_dir == FROM) ? scan_point.curr_item().pin() : Pin_ref();
    }
    else {
        ipin = (scan_point.valid()) ? scan_point.curr_item().pin() : Pin_ref();
        int position = (scan_point.valid()) ? scan_point.position() : -1;
        opin = (position != 0) ? scan_point.prev_item().pin() : Pin_ref();
        // Note that prev_item() returns last_item() if invalid scanner
    }
    left_x = 0;     // just to get it initialized.
    width = -1;
    the_grobj = QP_NULL_GROBJ;
}

//-----------------------------------------------------------------
//                      'DATA INQUIRY' FUNCTIONS
//-----------------------------------------------------------------
coord Pcseg::desired_entry()
    // Returns the desired entry point of this Pcseg
{
    NOT_TO_BE_IMPLEMENTED;
    return 0;
}

Net_ref Pcseg::input_net()
{
    NOT_TO_BE_IMPLEMENTED;
    return Net_ref();
}

Net_ref Pcseg::output_net()
{
    NOT_TO_BE_IMPLEMENTED;
    return Net_ref();
}

//-----------------------------------------------------------------
Rectangle Pcseg::ext()
    // Returns the extent of this Pcseg
{
    NOT_TO_BE_IMPLEMENTED;
    Rectangle shutup;
    return (shutup);
}

//-----------------------------------------------------------------
Point Pcseg::inst_labels_ext()
{
    return Point(0,0);
}

Boolean Pcseg::select(
    coord   x,
    coord   y
)
    // Selects the object at x,y (in picture coordinates) if these coordinates
    // should cause selection.  Return TRUE if a) something was selected,
    // or b) x,y is in this segment but nothing should be selected there.
{
```

```
        NOT_TO_BE_IMPLEMENTED;
        x = y = 0;      // shutup the compiler
        return FALSE;
    }
//------------------------------------------------------------------------
//                      'DATA INSERTION' FUNCTIONS
//------------------------------------------------------------------------
void Pcseg::clear_graphics()
    // Clear out all graphical information
    {
        the_grobj = QP__NULL_GROBJ;
        width = -1;
    }

//------------------------------------------------------------------------
//                  'CAUSING THINGS TO HAPPEN' FUNCTIONS
//------------------------------------------------------------------------
Point Pcseg::build_seg(
    Point       entry
    )
    // Build the graphics for the segment.
    {
        NOT_TO_BE_IMPLEMENTED;
        return entry;    // to quiet the compiler
    }

//------------------------------------------------------------------------
void Pcseg::dump(
    const char *const name_p,       // pointer to object name
    const int        tabs,          // nesting level
    ostream          &out           // output stream
    )
    // dump internal data representation
    {
        start_dump("Pcseg", this, name_p, tabs, out);
        indent_dump(tabs, out) << "\tarea_p = " << dump_ptr(area_p) << "; sheet_p = "
            << dump_ptr(sheet_p) << "; the_grobj = " << the_grobj << "; width = "
            << width << "\n";
        ipin.dump("ipin", tabs + 1, out);
        opin.dump("opin", tabs + 1, out);
        end_dump(tabs, out);
    }

// ************************************************************************
// *                                                                      *
// *                          Class Pcnet                                 *
// *                                                                      *
// ************************************************************************

//------------------------------------------------------------------------
// Implementation of class Pcnet
//------------------------------------------------------------------------
Pcnet::Pcnet(
    Pcarea          *parent_area,
    Pcsheet         *parent_sheet,
    Detail_scanner  &scan_point,
    Boolean         include_text
    ) : (parent_area, parent_sheet, scan_point), text("", parent_area->heap())
    // Create this Pcnet.
    {
        this = (this == NULL) ? (Pcnet *) parent_area->heap()->allocate(sizeof(Pcnet)) : this;
        net = (ipin.valid()) ? ipin.net() : opin.net();
        Pcnet::include_text = include_text;

double edge_time;
        if (scan_point.valid())
            edge_time = double(scan_point.curr_item().edge_time().qp_time());
        else    // This is the first net on the path, and the first pin is an input pin.
                // Use its arrival time to display on the net.
            edge_time = double(scan_point.last_item().edge_time().qp_time());
        text = (include_text) ? form("%.1f", edge_time) : "";

clear_graphics();
    }

//------------------------------------------------------------------------
//                      'DATA INQUIRY' FUNCTIONS
//------------------------------------------------------------------------
coord Pcnet::desired_entry()
    // Returns the desired entry point of this Pcnet.  For nets the desired
    // entry is the same as the desired exit of the following instance.
    {
        return sheet_p->desired_exit(this);
    }

//------------------------------------------------------------------------
Rectangle Pcnet::ext()
    // Returns the extent of this Pcnet.  This is not well implemented at this
    // point (in the y direction) because I don't know what my entry and exit
```

```
        // are, so I don't
        // really know the extent of my graphics.  At least for now (if not for
        // always) I will return the extent of my text and assume the net is
        // straight on the x axis.  This will probably be ok forever, since the
        // extent of at least one instance in the path will probably dominate.
        //
        // This always recomputes the extent, even if the width is valid.
    {
        Rectangle extent = Rectangle(0,0,0,0);
        Point textext = Point(0,0);

// Only draw net names if they are user named (or if user wants them all)
        const char *nname = net.name(sheet_p->parent());
        if ((!(nname && nname[0] == 'N' && nname[1] == '$'))
            || area_p->config().nonuser_net_names) {
            textext = area_p->text_ext(nname, name_info);
            textext.x += 2 * PC_NET_NAME_SEPARATOR_X;
        }
        textext.y += PC_NET_NAME_SEPARATOR_Y;
        extent = extent.mbb(textext);

textext = area_p->text_ext(text.c_string(), text_info);
        if (textext.x != 0)
            textext.x += 2 * PC_NET_NAME_SEPARATOR_X;
        textext.y = -(textext.y + PC_NET_NAME_SEPARATOR_Y);
        extent = extent.mbb(textext);

width = extent.x(1);
        return extent;
    }

//----------------------------------------------------------------------
Net_ref Pcnet::input_net()
    // Returns the net_ref for the input net to this segment, if there is one.
    // since this is a net segment there must always be one...
    { return net; }

Net_ref Pcnet::output_net()
    // Returns the net_ref for the output net to this segment, if there is one.
    // since this is a net segment there must always be one...
    { return net; }

//----------------------------------------------------------------------
Boolean Pcnet::select(
    coord           x,
    coord           y
    )
    // Selects the net if x,y is in this segment and should cause selection.
    // Returns TRUE if a) net was selected,
    // or b) x,y is in this segment but nothing should be selected there.
    {
        // Select the net in this segment if the point is within the bounding
        // box of the segment
        if ( y < area_p->top_label_baseline()
            && y > area_p->bottom_label_baseline()
            && x > left_x
            && x < left_x + width) {           //select it
            fe_env.selmgr().select(net);
            return TRUE;
        }
        else
            return FALSE;
    }

//----------------------------------------------------------------------
//                  'DATA INSERTION' FUNCTIONS
//----------------------------------------------------------------------
void Pcnet::clear_graphics()
    // Clear out all graphical information
    {
    text_grobj = QP_NULL_GROBJ;
    name_grobj = QP_NULL_GROBJ;
    }

//----------------------------------------------------------------------
//                  'CAUSING THINGS TO HAPPEN' FUNCTIONS
//----------------------------------------------------------------------
Point Pcnet::build_seg(
    Point           entry
    )
    // Build the graphics for the segment.  Remember that one of the pins
    // can be !valid().
    {
    left_x = entry.x;

// Find out where we will leave this segment

Point exit = entry;
    if (width < 0) ext();           // compute the width if not known yet.  This is
```

```
                                    // a saftey catch.  I don't think ext() will
                                    // ever get called from here
        exit.x += width;
        exit.y = sheet_p->desired_exit(this);

// Draw the net segment itself
        coord midx = entry.x + width / 2;
        points[0] = entry;
        int npts = 1;              // start out with the entry
        if (entry.y != exit.y) {   // need to jog it.
            points[npts++] = Point(midx,entry.y);
            points[npts++] = Point(midx,exit.y);
        }
        points[npts++] = exit;
        the_grobj = area_p->build_polyline(points, npts, net);

// Now draw the net name and text. Remember that build_text() justifies at
    // bottom center of the string
        const char *nname = net.name(sheet_p->parent());
        if ((nname && nname[0] == 'N' && nname[1] == '$')
            && !area_p->config().nonuser_net_names)
            nname = NULL;
        name_grobj = area_p->build_text(max(entry.y, exit.y) + PC_NET_NAME_SEPARATOR_Y,
                                       midx, nname, name_info, net);
        text_grobj = area_p->build_text(min(entry.y, exit.y) - PC_NET_NAME_SEPARATOR_Y,
                                       midx, text.c_string(), text_info, net);
        return exit;
    }

//----------------------------------------------------------------------
void Pcnet::dump(
    const char *const   name_p,    // pointer to object name
    const int           tabs,      // nesting level
    ostream             &out       // output stream
    )
    // dump internal data representation
    {
        start_dump("Pcnet", this, name_p, tabs, out);
        Pcseg::dump("(base)", tabs + 1, out);
        net.dump("net_ref", tabs + 1, out);
        indent_dump(tabs, out) << "\tname_grobj = " << name_grobj << "; text_grobj = "
                               << text_grobj << "; text = " << text << "\n";
        end_dump(tabs, out);
    }

// *********************************************************************
// *                                                                   *
// *                         Class Pcinst                              *
// *                                                                   *
// *********************************************************************

//----------------------------------------------------------------------
// Implementation of class Pcinst
//----------------------------------------------------------------------
Pcinst::Pcinst(
    Pcarea          *parent_area,
    Pcsheet         *parent_sheet,
    Detail_scanner  &scan_point
    ) : (parent_area, parent_sheet, scan_point)
    // Create this Pcinst.
    {
        this = (this == NULL) ? (Pcinst *) parent_area->heap()->allocate(sizeof(Pcinst)) : this;
        if (ipin.valid())
            inst = &(fe_env.ckt_info().cvt_ref(ipin.parent()));
        else
            inst = &(fe_env.ckt_info().cvt_ref(opin.parent()));

if (!opin.valid() && area_p->slack_type() != QP__INVALID_SLACK) {
            // last one in the path and it is a wc path setup_time_text = form("tPATH=%.1f", scan_point.total_path_time());
            arrival_time_text = form("tCLK=%.1f", scan_point.arrival_time());
        }
        clear_graphics();
    }

//----------------------------------------------------------------------
//                      'DATA INQUIRY' FUNCTIONS
//----------------------------------------------------------------------
coord Pcinst::desired_entry()
    // Returns the desired entry point of this Pcinst.
    //     MIN_INT is returned if there is no input net expected.
    {
        if (width < 0 || !locs.computed)
            ext();        // I don't think this will happen, but in case...
        if (ipin.valid())
            return locs.in_pin_channel_y + area_p->path_origin().y;
        else
            return MIN_INT;
    }
```

```
//-------------------------------------------------------------------------
Rectangle Pcinst::ext()
    // Returns the extent of this Pcinst graphics.  It computes the actual width
    // of this pcseg and the location of the graphics relative to the entry.x,
    // y-baseline of the segment (i.e. the result has to be translated by
    // (entry.x, y-baseline) prior to actually drawing it.
    {
        locs.extent = area_p->cache_grobj_ext(inst->cache_grobj());

if (!opin.valid()) { //This is the last one, allow room for the
                             // setup time and clock arrival time labels
            locs.extent.y(0) -= (PC_GENERIC_TEXT_HT + PC_NET_NAME_SEPARATOR_Y);
            locs.extent.y(1) += (PC_GENERIC_TEXT_HT + PC_NET_NAME_SEPARATOR_Y);
        }

// Now we want to center the center of the symbol on the baseline and at
        // the x midpoint.  Compute the translation required to the origin of the
        // grobj to cause that to happen, and translate the extent and the location
        // of the symbol's pins by that amount.
        locs.origin = Point(-locs.extent.width() / 2 , -(locs.extent.height() / 2 + locs.extent.y(0)));
        locs.extent.moved_by(locs.origin);
        locs.in_pin_loc  = (ipin.valid()) ? inst->pin_offset(ipin.pin_id()) + locs.origin : Point(0,0);
        locs.out_pin_loc = (opin.valid()) ? inst->pin_offset(opin.pin_id()) + locs.origin : Point(0,0);

// Now decide whether to flip the symbol about the vertical axis or not.
        if (locs.in_pin_loc.x > locs.out_pin_loc.x) {
            locs.flipped = TRUE;
            locs.in_pin_loc.x  = -locs.in_pin_loc.x;
            locs.out_pin_loc.x = -locs.out_pin_loc.x;
            locs.origin.x = -locs.origin.x;
        }
        else
            locs.flipped = FALSE;

// Compute and cache width and fill out rest of locs data.  Note that after this
        // locs.extent is the extent of the entire segment, whereas up until now
        // it has been just the extent of the symbol.
        width = max(locs.extent.width(), inst_labels_ext().x) + 2 * PC_INST_SEPARATOR;
        coord delta = (width - locs.extent.width()) / 2;
        locs.extent.x(1) += delta;
        locs.extent.x(0) -= delta;

// Finally, figure out whether we need a y-channel for the pins that jogs
        // vertically before it leaves the seg (i.e. pins on top/bottom.)  ***As of
        // this writing I don't know how to do this without looking deep into the
        // graphics of the symbol, so I am stubbing it for now***
        locs.in_pin_channel_y  = locs.in_pin_loc.y;
        locs.out_pin_channel_y = locs.out_pin_loc.y;

locs.computed = TRUE;
        return locs.extent;
    }

//-------------------------------------------------------------------------
Net_ref Pcinst::input_net()
    // Returns the net_ref for the input net to this segment, if there is one.
    { return (ipin.valid()) ? ipin.net() : Net_ref(); }

Net_ref Pcinst::output_net()
    // Returns the net_ref for the output net to this segment, if there is one.
    { return (opin.valid()) ? opin.net() : Net_ref(); }

//-------------------------------------------------------------------------
Boolean Pcinst::select(
    coord    x,
    coord    y
    )
    // Selects an object (net or instance) if x,y is in this segment and should
    // cause selection. Returns TRUE if a) something was selected,
    // or b) x,y is in this segment but nothing should be selected there.
    {
        // Select in this segment if the point is within the bounding
        // box of the segment
        if (   y < area_p->top_label_baseline()
            && y > area_p->bottom_label_baseline()
            && x > left_x
            && x < left_x + width) {      //select it Rectangle inst_ext = area_p->grobj_ext_abs(the_grobj);
            if (inst_ext.x(0) > x) {  // select the input net
                if (ipin.valid())
                    fe_env.selmgr().select(ipin.net());
            }
            else if (inst_ext.x(1) > x)  // select the instance itself
                fe_env.selmgr().select(inst);
            else                     // it must be the output net
                if (opin.valid()) {
                    fe_env.selmgr().select(opin.net());
```

```
            }
            return TRUE;
        }
        else
            return FALSE;
    }

//-----------------------------------------------------------------------
Point Pcinst::inst_labels_ext()
    {
        return area_p->inst_labels_ext(inst->name());
    }

//-----------------------------------------------------------------------
//                          'DATA INSERTION' FUNCTIONS
//-----------------------------------------------------------------------
void Pcinst::clear_graphics()
    // Clear out all graphical information
    {
        Pcseg::clear_graphics();
        labels_grobj = QP__NULL_GROBJ;
        entry_stub = QP__NULL_GROBJ;
        exit_stub = QP__NULL_GROBJ;
        clk_ar_time_grobj = QP__NULL_GROBJ;
        setup_time_grobj = QP__NULL_GROBJ;
        locs.extent.make_degenerate();
        locs.computed = FALSE;
    }

//-----------------------------------------------------------------------
//                      'CAUSING THINGS TO HAPPEN' FUNCTIONS
//-----------------------------------------------------------------------
Point Pcinst::build_seg(
    Point       entry
    )
    // Build the graphics for the segment.
    {
        left_x = entry.x;

// First compute an origin for the symbol that will center it in the segment
        Point center = Point(entry.x + width / 2, area_p->path_origin().y);
        Point exit = Point(entry.x + width , locs.out_pin_channel_y + area_p->path_origin().y);

// Copy the symbol graphics where they belong.
        if (inst->cache_grobj() != QP__NULL_GROBJ)   // If we found it successfully
            the_grobj = area_p->copy_cache_grobj(inst->cache_grobj(), locs.flipped, locs.origin +
                center, inst);

// The inst labels
        labels_grobj = area_p->build_inst_label(center.x, inst->name());

// Now route the entering and exiting nets.
        if (ipin.valid()) {
            points[0] = entry;
            points[1] = locs.in_pin_loc + center;
            entry_stub = area_p->build_polyline(points, 2, ipin.net());
        } if (opin.valid()) {
            points[0] = locs.out_pin_loc + center;
            points[1] = exit;
            exit_stub = area_p->build_polyline(points, 2, opin.net());
        }
        else {            // If the output pin is not valid this is the end of the
                          // path, so return a bad exit to flag whoever called me.
                          // also, draw the clock arrival and setup text info since
                          // this is the end of the path.
            exit.y = MIN_INT;

// get the symbol extent so we can locate the text
        Rectangle sym_ext = area_p->grobj_ext_abs(the_grobj);
        Pc_text_info info = text_info;

// clock arrival time label
        info.align = PC_TL;
        if (arrival_time_text.length() != 0)
            clk_ar_time_grobj = area_p->build_text(sym_ext.y(0) - PC_NET_NAME_SEPARATOR_Y,
                                sym_ext.x(0), arrival_time_text.c_string(), info);
        // setup/hold time label
        info.align = PC_BL;
        if (setup_time_text.length() != 0)
            setup_time_grobj = area_p->build_text(sym_ext.y(1) + PC_NET_NAME_SEPARATOR_Y,
                                sym_ext.x(0), setup_time_text.c_string(), info);
        }
        return exit;
    }

//-----------------------------------------------------------------------
```

```cpp
void Pcinst::dump(
    const char *const name_p,      // pointer to object name
    const int        tabs,         // nesting level
#ifndef INCLUDED_PCAREA
include <pcarea.h>
endif ifndef INCLUDED_PCAREA_CONSTS
include <pcarea_consts.h>
endif ifndef INCLUDED_CIINST
include <ciinst.h>
endif ifndef INCLUDED_FE_ENV
include <fe_env.h>
endif ifndef INCLUDED_CKT_INFO
include <ckt_info.h>
endif ifndef INCLUDED_SELMGR
include <selmgr.h>
endif ifndef INCLUDED_DETAIL
include <detail.h>
endif

//********************************************************************
// *                                                                  *
// *                        Class Pcseg                               *
// *                                                                  *
    ostream           &out              // output stream
    )
    // dump internal data representation
    {
        start_dump("Pcinst", this, name_p, tabs, out);
        Pcseg::dump("(base)", tabs + 1, out);
        inst->dump("inst", tabs + 1, out);
        // dump the locs stuff
        indent_dump(tabs, out) << "\torigin = " << locs.origin << "; extent = "
            << locs.extent << "\n";
        indent_dump(tabs, out) << "\tin_pin_loc = " << locs.in_pin_loc
            << "\tout_pin_loc = " << locs.out_pin_loc << "\n";
        indent_dump(tabs, out) << "\tin_pin_channel_y = " << locs.in_pin_channel_y
            << "\tout_pin_channel_y = " << locs.out_pin_channel_y
            << ((locs.flipped) ? " FLIPPED" : "")
            << ((locs.computed) ? "" : " NOT COMPUTED!") << "\n";

indent_dump(tabs, out) << "\tlabels_grobj = " << labels_grobj
                    << "; entry_stub = " << entry_stub
                    << "; exit_stub = " << exit_stub << "\n";
        end_dump(tabs, out);
    }

//********************************************************************
// *                                                                  *
// *           Classes Pcseg_list and Pcseg_scanner                   *
// *                                                                  *
//********************************************************************

//------------------------------------------------------------------
//      Implementation of Pcseg_list
//------------------------------------------------------------------

Pcseg_list::Pcseg_list(Heap *use_heap_p) : (use_heap_p)
    // create an empty Pcseg_list and initialize it
    {
        use_heap_p = (use_heap_p) ? use_heap_p : heap__misc_heap();
        this = (this == NULL) ? (Pcseg_list *) use_heap_p->allocate(sizeof(Pcseg_list)): this;
        // remaining initialization done by base class
    } void Pcseg_list::clear()
    // delete the Pcseg's and then the list
    {
        Pcseg_scanner scan(*this, NULL);
        while (++scan) delete scan.curr_item();
        Qp_slist::clear();
    }

//------------------------------------------------------------------
//      Implementation of Pcseg_scanner
//------------------------------------------------------------------

Pcseg_scanner::Pcseg_scanner(Heap *heap_p) : (heap_p)
    // create unattached scanner
    {
```

```
    heap_p = (heap_p) ? heap_p : heap__misc_heap();
    this = (this == NULL) ? (Pcseg_scanner *) heap_p->allocate(sizeof(Pcseg_scanner)): this;
    // remaining initialization done by base class
}
Pcseg_scanner::Pcseg_scanner(Pcseg_list &list, Heap *heap_p) : (list)
    // create attached scanner
{
    heap_p = (heap_p) ? heap_p : heap__misc_heap();
    this = (this == NULL) ? (Pcseg_scanner *) heap_p->allocate(sizeof(Pcseg_scanner)): this;
    // remaining initialization done by base class
}
/*
 * HEADER
 *     lstarea.h - Declare class Lstarea
 *
 * COPYRIGHT
 *     Copyright (C) 1988 Mentor Graphics Corporation
 *
 * DESCRIPTION
 *     This class is a generic list area in QuickPath.  It knows how to build
 *     a text area that contains lines of hilitable fields.  Most other text
 *     areas in QuickPath are derived from this one.
 *
 */ ifndef INCLUDED_LSTAREA
define INCLUDED_LSTAREA ifndef INCLUDED_STREAM
include <stream.h>
endif ifndef INCLUDED_HILITE_QPAREA
include <hilite_qparea.h>
endif ifndef INCLUDED_QPBASE
include <qpbase.h>
endif

// ***********************************************************************
// *                                                                     *
// *                          Class Lstarea                              *
// *                                                                     *
// ***********************************************************************

//-----------------------------------------------------------------------
// Declaration of class Lstarea
//-----------------------------------------------------------------------
class Assoc_obj_tbl;

class Lstarea : public Hilite_qparea {
    // This is the definition of a List area.  It is the base class for a
    // variety of hiliting text windows in quickpath.  I don't expect many
    // instances of this class to be created, but rather it will be derived
    // from private:    // data
    Heap            *heap_p;        // the heap this one is made in
    Heap            *hilite_heap_p; // contains the hilitable fields
    Tss_image       *image;         // The image in this window
    Boolean         locked;         // image is locked
    long            last_line;
    Assoc_obj_tbl   *assoc_objs;    // table used to associate objects
                                    // with lines,fields in the display public:     // functions
//-----------------------------------------------------------------------
    // Storage management of Lstareas.
    // Lstareas are a highlevel class, and as such are
    // not passed around by copy, are not assigned, and are not initialized
    // from another Lstarea.  Hence the construct by copy, and assignment
    // constructors are not provided.

Lstarea(
        const char      *name       // name for the window
    );
    // This constructor creates Lstareas.

~Lstarea();
    // The destructor for Lstarea deletes the window and the image
    // as well as the internal data structures.

//----------------------------DATA INQUIRY FUNCTIONS---------------------
    Tss_image *text_image()
    { return image; }

Heap *heap()
```

```
    [ return heap_p;]

int max_line()
       { return last_line;} virtual long associated_object(
        long            line,
        short           field,
        short           chr,
        Selmgr_type     *type            // ignored on input, filled with correct type
    );
    // Returns the object that was associated with a given text position
    // with add_text_line().

//---------------------------DATA INSERTION FUNCTIONS---------------------------
    void clear();
        // Clear out this lstarea and prepare for a new image.  This clears the
        // tss image and all fields and lines in it.

//-------------------------------SERVICE FUNCTIONS------------------------------
    void application_cmd(
        const Qpcmd     &cmd
    );
        // This function is called (by Qp_ui) to execute a command that belongs to
        // this area.

//--------------------------------TEXT FUNCTIONS--------------------------------
    void lock();
    void unlock();
        // While the lock is set the area will not be updated on the display
        // (to prevent flashing, etc) unless a debug function specifies otherwise void add_text_line(
        String          &str
    );

void add_text_line(
        String          &str,
        long            object,
        Selmgr_type     type
    );
    // Adds a string at the end of this text image as a single field line, and
    // associates the provided object with it for selection purposes.

//----------------------------DUMP, ETC. FUNCTIONS------------------------------
    void dump(
        const char *const name_p = NULL,    // pointer to object name
        const int         tabs = 0,         // nesting level
        ostream           &out = cout       // output stream
    );
        // dump internal data representation //-------------------------------PRIVATE FUNCTIONS------------------------------
protected:     // functions
    virtual void select_point_cmd(
        const Qpcmd     &cmd
    );
        // An internal function that handles the SELECT POINT command.  This
        // is a generic function that can select the object associated with a
        // line,field in the add_text_line, etc. functions
};

#endif
/*
 * HEADER.
 *    path_lstarea.h - Declare class Path_lstarea
 *
 * COPYRIGHT.
 *    Copyright (C) 1988 Mentor Graphics Corporation
 *
 * DESCRIPTION
 *    The area defined and managed by this is the Path List area of
 *    Quickpath.
 */ ifndef INCLUDED_PATH_LSTAREA
define INCLUDED_PATH_LSTAREA ifndef INCLUDED_STREAM
include <stream.h>
endif ifndef INCLUDED_LSTAREA
include <lstarea.h>
endif ifndef INCLUDED_STRING
include <string.h>
endif
```

```
// ****************************************************************************
// *                                                                          *
// *                          Class Path_lstarea                              
// *                                                                          *
// ****************************************************************************

//----------------------------------------------------------------------------
// Declaration of class Path_lstarea
//----------------------------------------------------------------------------
class Wcpath_scanner;
class Dlypath_scanner;
class Status;
class Qpcmd;
class Path_lstarea : public Lstarea {
    // This is the definition of a Path Context area.  Path_lstarea's are constructed
    // in response to a command from Fe.  The constructor takes a (Wc|Dly)path_scanner
    // and builds and draws the Path_lstarea from that.  This class also forms
    // the base class for more specialized path lists, e.g. loop lists.

protected:      // data
    Wcpath_scanner          *wcscan;        // path this is a path context of
    Dlypath_scanner         *dlyscan;       // path this is a path context of
                                            // These two variables are mutually
                                            // exclusive.  One is always NULL.

// field widths of various things.
    int                     lineno_fw;
    int                     slack_fw;
    int                     slack_type_fw;
    int                     total_delay_fw;
    int                     total_insts_fw;
    int                     src_clk_name_fw;
    int                     dest_clk_name_fw;
    int                     dest_pinname_fw;
    int                     src_pinname_fw;

public:     // functions
//----------------------------------------------------------------------------
    // Storage management of Path_lstareas.
    // When Path_lstarea's are constructed they create a window and the image to
    // put in them, draw the path list, and are prepared for selection and
    // hiliting in themselves.  They are a highlevel class, and as such are
    // not passed around by copy, are not assigned, and are not initialized
    // from another Path_lstarea.  Hence the construct by copy, and assignment
    // constructors are not provided.

Path_lstarea(
        const Wcpath_scanner    *scanner    // and what to put in it
        );

Path_lstarea(
        const Dlypath_scanner   *scanner    // and what to put in it
        );
        // These constructors create Path_lstareas, including drawing the area on the
        // screen.  After the constructor exits the area is available for the
        // user.

private:    // function
    void init();
        // This function is used by the constructors.
public:     // functions ~Path_lstarea();
        // The destructor for Path_lstarea deletes the window and the picture
        // as well as the internal data structures.

//------------------------------DATA INQUIRY---------------------------------
    Boolean wc()
        // Is this a worst case path list or a delay path list?
        { return (wcscan != NULL);}

//------------------------------SERVICE FUNCTIONS----------------------------
    virtual String format(
        int                     lineno,
        const Wcpath_scanner    *wcpath
        );

virtual String format(
        int                     lineno,
        const Dlypath_scanner   *dlypath
        );
        // These two functions format the line to be displayed for the path at the
        // provided scanner position and line number.

virtual String format_header();
        // return the header line for this path list window void compute_field_widths(
        const Wcpath_scanner        *wcpath
```

```
    );
    void compute_field_widths(
        const Dlypath_scanner     *dlypath
    );
        // These two functions determine the field widths required to list the
        // fields in the path at the current position of the scanner.  The
        // various field width variables are set if the field width computed
        // here exceeds the current width in the variable //----------------------------CAUSING THINGS TO HAPPEN------------------------
    void execute_cmd(
        const Qpcmd    &cmd,
        Status         *status
    );
        // This function is called (by Fe) to execute a command that belongs to
        // the Path_lstarea and that may fail.

virtual void rebuild_path_list();
        // Rebuild the image in this area
        // The current image is deleted and rebuilt.  This is not simply a
        // redraw().

//-------------------------DUMP, ETC. FUNCTIONS-------------------------------
    void dump(
        const char *const name_p = NULL,      // pointer to object name
        const int         tabs = 0,           // nesting level
        ostream           &out = cout         // output stream
    );
        // dump internal data representation

};

#endif
/*
 * MODULE
 *     lstarea.c - Definition of class Lstarea
 *
 * COPYRIGHT
 *     Copyright (C) 1988 Mentor Graphics Corporation
 *
 * DESCRIPTION
 *
 *     This is the file that manages the creation and drawing of text list
 *     areas in QuickPath
 */ ifndef INCLUDED_LSTAREA
include <lstarea.h>
endif ifndef INCLUDED_V1HI
include <v1hi.h>
endif ifndef INCLUDED_GENHEAP
include <genheap.h>
endif ifndef INCLUDED_HILITABLE
include <hilitable.h>
endif ifndef INCLUDED_QPCMD
include <qpcmd.h>
endif ifndef INCLUDED_FE_ENV
include <fe_env.h>
endif ifndef INCLUDED_FE
include <fe.h>
endif ifndef INCLUDED_SELMGR
include <selmgr.h>
endif ifndef INCLUDED_TABLE
include <table.h>
endif ifndef INCLUDED_CMDS
include <$(qpath.cmd).h>
endif ifndef INCLUDED_BE_TABLES
include <be_tables.h>
```

```cpp
#endif
// **************************************************************************
// *                                                                        *
// *                           Class Hilite_field                           
// *                                                                        *
// **************************************************************************

//--------------------------------------------------------------------------
// Declaration of class Hilite_field
//-------------------------------------------------------------------------- class Hilite_field : public Hilitable {
// This class encapsulates a Tss field in a Hilitable
private:    // data
    Tss_image               *image;
    Tss_field               *field;
    long                    lineno;       // This and the next one are because tss is so dumb
    short                   fieldno;
    Boolean                 hilited;

public:     // functions
    Hilite_field(
        String              &str,         // what is in it
        long                line_num,
        short               field_num,
        Heap                *heap_p       // heap from which to allocate
    );
    ~Hilite_field();

Tss_field *tss_field()
        { return field; }
    Tss_image *tss_image()
        { return image; }
    void hilite();
    void unhilite();
    void dump(
        const char *const   name_p = NULL,  // pointer to object name
        const int           tabs = 0,       // nesting level
        ostream             &out = cout     // output stream
    );
};

//--------------------------------------------------------------------------
// Implementation of class Hilite_field
//--------------------------------------------------------------------------
extern Tss_image *current_text_image;      // yecchhhh, but it is the only
                                           // way I know to get it.
Hilite_field::Hilite_field(
    String          &str,
    long            line_num,
    short           field_num,
    Heap            *heap_p
    )
{
    this == (this) ? this : (Hilite_field *) heap_p->allocate(sizeof(Hilite_field));
    create_text_field(short(str.length()), str.c_string(), field);
    image = current_text_image;
    lineno = line_num;
    fieldno = field_num;

// Set a tss text field attribute to refer back to this Hilite_field so that
    // we can find it from a screen position later.
    set_field_attrib(short(1), field, (long) this);

hilited = FALSE;
}

Hilite_field::~Hilite_field()
{
    set_current_text_image(image);
    delete_field(field);
}
void Hilite_field::hilite()
{
    long dmystatus;
    set_current_text_image(image);
    locate(lineno, fieldno, short(1), dmystatus);
    set_field_attrib(field_hilite, field, hilite_select);
    hilited = TRUE;
} void Hilite_field::unhilite()
{
    long dmystatus;
    set_current_text_image(image);
    locate(lineno, fieldno, short(1), dmystatus);
    set_field_attrib(field_hilite, field, no_hilite);
    hilited = FALSE;
```

```
]
void Hilite_field::dump(
    const char *const name_p,        // pointer to object name
    const int       tabs,            // nesting level
    ostream         &out             // output stream
    )
    // dump internal data representation
    {
        start_dump("Hilite_field", this, name_p, tabs, out);
        indent_dump(tabs, out) << "\tfield = " << dump_ptr(field) << "; image = " << dump_ptr(image)
            << (hilited ? "HILITED" : "NOT HILITED") << "\n";
        end_dump(tabs, out);
    }

// *********************************************************************
// *                                                                   *
// *                       Class Assoc_obj                             *
// *                                                                   *
// *********************************************************************

//---------------------------------------------------------------------
// Declaration of class Assoc_obj
//--------------------------------------------------------------------- struct Assoc_obj {
    // This class keeps information about selectable objects associated with
    // a given line, field in the lstarea area.  It is arrayed into an
    // Assoc_obj_tbl, see below.

long            object;          // The object (which can later be selected)
    Selmgr_type     type;            // The object type Assoc_obj(
        long             assoc_object,
        Selmgr_type object_type
        )
        { object = assoc_object; type = object_type;}
    Assoc_obj()
        { object = 0; type = SEL_NULL_TYPE;} void dump(
        const char *const name_p = NULL,    // pointer to object name
        const int       tabs = 0,           // nesting level
        ostream         &out = cout         // output stream
        );
        // Dump full data representation
};

void Assoc_obj::dump(
    const char *const name_p,        // pointer to object name
    const int       tabs,            // nesting level
    ostream         &out             // output stream
    )
    // Dump full data representation
    {
        indent_dump(tabs, out) << "\t" << name_p << ": object = " << object << ", type = " << type << "\n"
    }

// *********************************************************************
// *                                                                   *
// *                       Class Assoc_obj_tbl                         *
// *                                                                   *
// *********************************************************************

//---------------------------------------------------------------------
// Declaration of class Assoc_obj_tbl
//---------------------------------------------------------------------
const Assoc_obj NULL_ASSOC_OBJ;
const OBJS_PER_SEG = 32;

class Assoc_obj_tbl : public Table {
    // This class declares a table that keeps the line to selected object
    // information.  Note that this may not be sufficient when multiple fields
    // are accomodated with this area, and may need reimplmentation.

public:    // Functions

Assoc_obj_tbl() : (sizeof(Assoc_obj), OBJS_PER_SEG, &NULL_ASSOC_OBJ) []

Assoc_obj &operator[](
        long            index              // index of the object in question
        )
        { return( *(Assoc_obj *) get_entry(index));} void dump_item(
        long            index,
        const int       tabs = 0,
```

```
        ostream                 &out = cout
    )
    // Dump one object in the table
    { (*this)[index].dump("", tabs, out);}
};

// ****************************************************************
// *                                                              *
// *                   Class Assoc_obj_tbl_scanner                *
// *                                                              *
// ****************************************************************

//----------------------------------------------------------------
// Declaration of class Assoc_obj_tbl_scanner
//---------------------------------------------------------------- class Assoc_obj_tbl_scanner : public Table_scanner {
private:       // Functions
    Boolean find()
        { assert(FALSE, "Find not defined for Assoc_obj_tbl_scanner"); return(FALSE);}
public:        // Functions
    Assoc_obj_tbl_scanner(Assoc_obj_tbl &table) : (table) { }
    Assoc_obj_tbl_scanner(const Assoc_obj_tbl_scanner &src) : (src) { }
    void attach(Assoc_obj_tbl &table)
        { Table_scanner::attach(table);}
    Assoc_obj &curr_item()
        // Get item at the current scanner position
        { assert(valid(), "Scanner not valid"); return( *(Assoc_obj *) item_p );}
};

// ****************************************************************
// *                                                              *
// *                   Class Assoc_obj_tbl                        *
// *                                                              *
// ****************************************************************

//----------------------------------------------------------------
// Implementation of class Assoc_obj_tbl
//----------------------------------------------------------------

// ****************************************************************
// *                                                              *
// *                   Class Lstarea                              *
// *                                                              *
// ****************************************************************

//----------------------------------------------------------------
// Implementation of class Lstarea
//----------------------------------------------------------------
Lstarea::Lstarea(
    const char           *name        // root name
    ) : (name, &(fe_env.fe()), TRUE)
    // Create the image and put it in the window.
    {
    heap_p = new Genheap();
    hilite_heap_p = new Genheap(HEAP__DEFAULT_SIZE, 0, heap_p);
    image = Qparea::text_image();
    locked = FALSE;
    last_line = 0;
    assoc_objs = new Assoc_obj_tbl;
    }

Lstarea::~Lstarea()
    // Delete the data structures in addition to the window itself
    {
    delete heap_p;
    delete assoc_objs;
    }

//----------------------------------------------------------------
//                       DATA INQUIRY FUNCTIONS
//----------------------------------------------------------------
long Lstarea::associated_object(
    long            line,
    short           field,
    short           chr,
    Selmgr_type     *type
    )
    {
    short shutup = field;    // Not used for now, at least
    shutup = chr;
    Assoc_obj &obj = (*assoc_objs)[line];
    *type = obj.type;
    return obj.object;
    }

//----------------------------------------------------------------
//                       DATA INSERTION FUNCTIONS
//----------------------------------------------------------------
```

```
void Lstarea::clear()
   // clear all memory for this area and clear the image
   {
   // Make a new image and put it into the Window*, then delete the old one
      Tss_image *oldimage = image;
      create_text_image(long(32000), image);
      if (locked) lock();

delete_text_image(oldimage);
      clear_hilitables();
      hilite_heap_p->clear();
      assoc_objs->clear();
   }

//-----------------------------------------------------------------------
//                          SERVICE FUNCTIONS
//-----------------------------------------------------------------------
void Lstarea::application_cmd(
   const Qpcmd    &cmd
   )
   {
      long id = cmd.id();
      switch (id) {
         case CMD_SELECT_POINT:
            select_point_cmd(cmd);
            break;
         default: Hilite_qparea::application_cmd(cmd);    // pass it to my parent
      }
   }

//-----------------------------------------------------------------------
//                          TEXT IMAGE FUNCTIONS
//-----------------------------------------------------------------------
// Note, these functions have been put into Lstarea so that the v1 dependencies
// can be isolated to here.  Ideally, these functions (or similar ones) would
// be part of a global library.

void Lstarea::lock()
   // lock the image
   {
      locked = TRUE;
      set_current_text_image(image);
      lock_text();
   }
void Lstarea::unlock()
   // unlock the image
   {
      locked = FALSE;
      set_current_text_image(image);
      unlock_text();
   }

// The following functions Add a string at the end of this text image as a single
// field line, and associates the provided object with it for selection purposes.

void Lstarea::add_text_line(
      String          &str
   )
   {
      add_text_line(str, 0, SEL_NULL_TYPE);
   } void Lstarea::add_text_line(
      String          &str,
      long            object,
      Selmgr_type     type
   )
   {
      long v1status;
      last_line++;
      set_current_text_image(image);

short fieldno = 1;      // for now, at least
      Hilite_field *field = new Hilite_field(str, last_line, fieldno, hilite_heap_p);
      insert_line(last_line, v1status);
      insert_field(last_line, fieldno, field->tss_field(), PASCAL_TRUE, v1status);

// The object, as identified for hiliting, is the _ref, even though the
   // selectable entity is a scanner for some objects.  This sucks, but I don't
   // have a better solution at the moment.  If this is a wcpath or dlypath
   // then make a copy of the scanner so the list doesn't go away until the
   // lstarea does.
      switch (type) {
         case SEL_NULL_TYPE:    // no hilitable for this one
            break;
         case SEL_WCPATH: {
            Wcpath_scanner *wcscan = new Wcpath_scanner(*(Wcpath_scanner *)object);
            object = long(wcscan);
```

```
            add_hilitable(type, wcscan->curr_item(), field);
            break;
        }
        case SEL_DLYPATH: {
            Dlypath_scanner *dlyscan = new Dlypath_scanner(*(Dlypath_scanner *)object);
            object = long(dlyscan);
            add_hilitable(type, dlyscan->curr_item(), field);
            break;
        }
        default:
            add_hilitable(type, object, field);
    }
    (*assoc_objs)[last_line] = Assoc_obj(object, type);    // used to select later
}
//-----------------------------DUMP, ETC, FUNCTIONS-----------------------------
void Lstarea::dump(
    const char *const name_p,     // pointer to object name
    const int       tabs,         // nesting level
    ostream         &out          // output stream
)
// dump internal data representation
{
    start_dump("Lstarea", this, name_p, tabs, out);
    Hilite_qparea::dump("", tabs + 1, out);
    indent_dump(tabs, out) << "\theap_p = " << dump_ptr(heap_p)
        << "; Tss image = " << dump_ptr(text_image());

indent_dump(tabs, out) << (locked ? "LOCKED" : "NOT LOCKED") << "\n";
    end_dump(tabs, out);
}

//-------------------------PRIVATE FUNCTIONS-----------------------------------
void Lstarea::select_point_cmd(
    const Qpcmd     &cmd
)
// handles the SELECT_POINT command in this area.
{
// First grab the args.  Note that we already know we are in this area, so
// we don't need to get the window name. (Fe did that for us already)
    short one_of_n = 0;
    cmd.one_of_n(short(1), &one_of_n);
    Boolean mouse_down = (one_of_n == 2);

if (!mouse_down) return;    // for now we select on mouse_down, nothing on up long x_points = 0;
    cmd.integer(1, &x_points);
    long y_points = 0;
    cmd.integer(2, &y_points);

long vlstatus;
    set_current_text_image(image);
    locate_point(y_points, short(x_points), vlstatus);
    if (vlstatus == 0) {         // did so ok
        // find out where we are.
        long line = 0;
        short field = 0;
        short chr = 0;
        inquire_position(line, field, chr);

// now get the thing that is pointed to, and select it.
        Selmgr_type type;
        long sel_obj = associated_object(line, field, chr, &type);
        if (type == SEL_WCPATH)
            fe_env.selmgr().select((Wcpath_scanner *)sel_obj);
        else if (type == SEL_DLYPATH)
            fe_env.selmgr().select((Dlypath_scanner *)sel_obj);
        else if (type != SEL_NULL_TYPE)
            fe_env.selmgr().select(type, sel_obj);
    }
    // else do nothing, unsuccessful locate => no selection intended
}
/*
 * MODULE
 *     path_lstarea.c - Definition of class Path_lstarea
 *
 * COPYRIGHT
 *     Copyright (C) 1988 Mentor Graphics Corporation
 *
 * DESCRIPTION
 *
 *     This is the file that manages the creation and drawing of path context
 *     areas.
 */ ifndef INCLUDED_LIST
include <list.h>
#endif
```

```c
#ifndef INCLUDED_PATH_LSTAREA
#include <path_lstarea.h>
endif ifndef INCLUDED_STATUS
include <status.h>
endif ifndef INCLUDED_QPCMD
include <qpcmd.h>
endif ifndef INCLUDED_REFS
include <refs.h>
endif ifndef INCLUDED_CKT_INFO
include <ckt_info.h>
endif ifndef INCLUDED_FE_ENV
include <fe_env.h>
endif ifndef INCLUDED_CMDS
include <$(qpath_cmd).h>
endif ifndef INCLUDED_PATH
include <path.h>
endif ifndef INCLUDED_BE_TABLES
include <be_tables.h>
endif ifndef INCLUDED_DELAY
include <delay.h>
endif ifndef INCLUDED_QP_TIME
include <qp_time.h>
endif ifndef INCLUDED_LSTAREA_CONSTS
include <lstarea_consts.h>
endif ifndef INCLUDED_V1HI
include <v1hi.h>
endif ifndef INCLUDED_SLACK
include <slack.h>
#endif

// ****************************************************************************
// *                                                                          *
// *                          Class Path_lstarea
// *                                                                          *
// ****************************************************************************

//----------------------------------------------------------------------------
// Implementation of class Path_lstarea
//----------------------------------------------------------------------------
Path_lstarea::Path_lstarea(
    Wcpath_scanner        *scanner    // what goes in it
    ) : (PL_WIN_NAME)
    // Create the image and put it in the window.
    {
        dlyscan = NULL;
        wcscan = new Wcpath_scanner(*scanner);
        init();
    }

Path_lstarea::Path_lstarea(
    Dlypath_scanner       *scanner    // what goes in it
    ) : (PL_WIN_NAME)
    // Create the image and put it in the window.
    {
        wcscan = NULL;
        dlyscan = new Dlypath_scanner(*scanner);
        init();
    } void Path_lstarea::init()
    // Initialize the path list, assuming that the scanner is already set.
    {
        lineno_fw = 3;
        slack_fw = strlen(PL_SLACK_TITLE) + 2;
```

```
        slack_type_fw = strlen(PL_SLACK_TYPE_TITLE);
        total_delay_fw = strlen(PL_TOTAL_DELAY_TITLE) + 2;
        total_insts_fw = strlen(PL_TOTAL_INSTS_TITLE);
        src_clk_name_fw = strlen(PL_SRC_CLK_NAME_TITLE) + 1;
        dest_clk_name_fw = strlen(PL_DEST_CLK_NAME_TITLE);
        dest_pinname_fw = 10;
        src_pinname_fw = 10;

// Now we build the sheet and show it in the window.
        rebuild_path_list();
    }

Path_lstarea::~Path_lstarea()
    // Delete the data structures in addition to the window itself
    {
        if (wcscan)
            delete wcscan;
        if (dlyscan)
            delete dlyscan;    // note that only one of these is non-NULL
    }

//------------------------------------------------------------------------
//                      'CAUSING THINGS TO HAPPEN' FUNCTIONS
//------------------------------------------------------------------------
void Path_lstarea::execute_cmd(
    const Qpcmd     &cmd,
    Status          *status
    )
    {
    // This is stubbed out for now.  More to come!
        status->set_ok();
        long cmd_id = cmd.id();      // This is needed due to a bug in the 1.2 C++ compiler.
        switch (cmd_id) {
            case CMD_SELECT_POINT: select_point_cmd(cmd);
                break;
            case CMD_DUMP: ;
                break;
            default: unknown_command(cmd_id);
        }
    }

//------------------------------------------------------------------------
void Path_lstarea::rebuild_path_list()
    // Delete and rebuild the picture in the window
    {
        lock();     // locks the display in the picture
        clear();    // clear the old image // Scan the scanner and build the image.
        int lineno = 0;
        if (wc()) {
            wcscan->reset();
            while (++(*wcscan))    // Find the maximum field width for the pin names
                compute_field_widths(wcscan);

add_text_line(format_header());
            wcscan->reset();
            while (++(*wcscan)) {
                lineno++;
                add_text_line(format(lineno, wcscan), long(wcscan), SEL_WCPATH);
            }
        }
        else {
            dlyscan->reset();
            while (++(*dlyscan))    // Find the maximum field width for the pin names
                compute_field_widths(dlyscan);

add_text_line(format_header());
            dlyscan->reset();
            while (++(*dlyscan)) {
                lineno++;
                add_text_line(format(lineno, dlyscan), long(dlyscan), SEL_DLYPATH);
            }
        } hilite_all_selections();
        unlock();
    }

//----------------------------------SERVICE FUNCTIONS---------------------
String Path_lstarea::format(
    int                     lineno,
    const Wcpath_scanner    *path
    )
    // Format a line for display in this window
    {
        double slack = path->slack().slack_val();

const char *slack_type;
```

```
        switch (path->slack().slack_type()) {
            case QP__SETUP_H : slack_type = "S(H)"; break;
            case QP__SETUP_L : slack_type = "S(L)"; break;
            case QP__HOLD_H  : slack_type = "H(H)"; break;
            case QP__HOLD_L  : slack_type = "H(L)"; break;
            case QP__INVALID_SLACK: ; // fall through to theassert
            default: assert(FALSE, "Bad Qp__slack_t supplied");
        } double total_delay = double(path->delay().qp_time());
        int total_insts = path->datapath().ninstances();

// The following are not right and are stubbed to the name of the pin for
    // demo purposes.
        const char *src_clk_name  = path->sclk_last().name();
        const char *dest_clk_name = path->dclk_last().name();

String dest_pinname;
        path->datapath()[0].parent().pathname(&dest_pinname);
        dest_pinname += "/";
        dest_pinname += path->datapath()[0].name();

String src_pinname;
        path->datapath().term_pin().parent().pathname(&src_pinname);
        src_pinname += "/";
        src_pinname += path->datapath().term_pin().name();

char buf[256];
        sprintf(buf, "%*d %*.2f %*s %*.2f %*d %*s %*s %*s %*s",
                        lineno_fw, lineno,
                        slack_fw, slack,
                        slack_type_fw, slack_type,
                        total_delay_fw, total_delay,
                        total_insts_fw, total_insts,
                        src_clk_name_fw, src_clk_name,
                        dest_clk_name_fw, dest_clk_name,
                        dest_pinname_fw, dest_pinname.c_string(),
                        src_pinname_fw, src_pinname.c_string());
        String str = buf;
        return str;
    }

String Path_lstarea::format(
    int                       lineno,
    const Dlypath_scanner    *dlypath
    )
{
    // TBSL
};

String Path_lstarea::format_header()
{
    String str;
    char buf[256];

if (wc()) {
        sprintf(buf, "%*s|%*s|%*s|%*s|%*s|%*s|%*s|%*s|%*s",
                        lineno_fw,         PL_LINENO_TITLE,
                        slack_fw,          PL_SLACK_TITLE,
                        slack_type_fw,     PL_SLACK_TYPE_TITLE,
                        total_delay_fw,    PL_TOTAL_DELAY_TITLE,
                        total_insts_fw,    PL_TOTAL_INSTS_TITLE,
                        src_clk_name_fw,   PL_SRC_CLK_NAME_TITLE,
                        dest_clk_name_fw,  PL_DEST_CLK_NAME_TITLE,
                        dest_pinname_fw,   PL_DEST_PINNAME_TITLE,
                        src_pinname_fw,    PL_SRC_PINNAME_TITLE);
        str = buf;
    }
    else {
        // TBSL
    }
    return str;
} void Path_lstarea::compute_field_widths(
    const Wcpath_scanner    *path
    )
    // Compute some field widths and max them against the currently widest field
{
    // The following are not right and are stubbed to the name of the pin for
    // demo purposes.
        const char *src_clk_name  = path->sclk_last().name();
        const char *dest_clk_name = path->dclk_last().name();

String dest_pinname;
        path->datapath()[0].parent().pathname(&dest_pinname);
        dest_pinname += "/";
        dest_pinname += path->datapath()[0].name();
```

```
    String src_pinname;
    path->datapath().term_pin().parent().pathname(&src_pinname);
    src_pinname += "/";
    src_pinname += path->datapath().term_pin().name();

src_clk_name_fw = max(src_clk_name_fw, strlen(src_clk_name));
    dest_clk_name_fw = max(dest_clk_name_fw, strlen(dest_clk_name));
    dest_pinname_fw = max(dest_pinname_fw, int(dest_pinname.length()));
    src_pinname_fw = max(src_pinname_fw, int(src_pinname.length()));
    } void Path_lstarea::compute_field_widths(
    const Dlypath_scanner  *dlypath
    )
    {
    // TBSL
    };

//--------------------------DUMP, ETC, FUNCTIONS-----------------------------
void Path_lstarea::dump(
    const char *const name_p,       // pointer to object name
    const int         tabs,         // nesting level
    ostream           &out          // output stream
    )
    {
    // dump internal data representation
    start_dump("Path_lstarea", this, name_p, tabs, out);
    Lstarea::dump("", tabs + 1, out);
    if (wcscan)
        wcscan->dump("wcscan", tabs + 1, out);
    if (dlyscan)
        dlyscan->dump("dlyscan", tabs + 1, out);

indent_dump(tabs, out)
         << "; lineno_fw = " << lineno_fw
         << "; slack_fw = " << slack_fw
         << "; slack_type_fw = " << slack_type_fw
         << "; total_delay_fw = " << total_delay_fw
         << "; total_insts_fw = " << total_insts_fw
         << "; src_clk_name_fw = " << src_clk_name_fw
         << "; dest_clk_name_fw = " << dest_clk_name_fw
         << "; dest_pinname_fw = " << dest_pinname_fw
         << "; src_pinname_fw = " << src_pinname_fw
         << "\n";
    end_dump(tabs, out);
    }
/*
 * HEADER
 *     base_qparea.h - Declare class Base_qparea, Base_qparea_list,
 *                     Base_qparea_scanner
 *
 * COPYRIGHT
 *     Copyright (C) 1988 Mentor Graphics Corporation
 *
 * DESCRIPTION
 *     This class is the definition of the lowest "area" in quickpath.  It is
 *     not visible on the screen, but knows how to handle application_cmd()s
 *     and undo/redo etc.  This file also defines the Undostate class
 *     from which undo state entries need to be derived.
 */
#ifndef INCLUDED_BASE_QPAREA
define INCLUDED_BASE_QPAREA ifndef INCLUDED_MLIB
include <mlib.h>
endif ifndef INCLUDED_STREAMH
include <stream.h>
endif ifndef INCLUDED_STRING
include <string.h>
endif ifndef INCLUDED_OLIST
include <olist.h>
endif ifndef INCLUDED_QP_SLIST
include <qp_slist.h>
endif class Qpcmd;
class Undo_list;
class Undostate;
class Status;
```

```
//----------------------------------------------------------------
//                 Class Undostate;
//---------------------------------------------------------------- class Undostate : public Olink {
    // This class is the root from which "state" items that are to be maintained
    // on the Base_qparea undo lists should be derived.  It provides for
    // a virtual destructor (by way of being derived from Olink) that allows
    // Base_qparea to get rid of the state itself (when it falls off the
    // history list), rather than having to  explicitly pass it back to the
    // original client to delete it.

friend class Undo_list;

private:     // data
    long                    undotime;     // time it was put on the undo list
public:      // functions Undostate(
        long                    time,
        Heap                    *heap_p = NULL
        );

virtual void undo();
        // This virtual function undoes the state.  It is unimplemented in the
        // base class, and will crash if called.

virtual void redo();
        // This virtual function redoes the state.  It is unimplemented in the
        // base class, and will crash if called.

virtual Boolean dead();
        // This virtual function is called when Base_qparea.cleanup_undo() is
        // called.  It is unimplemented in the base class, and will crash
        // if called.  It should return TRUE if this Undostate is invalid and
        // should be removed from the undo list.
        // A (derived) instance of Undostate is 'dead' when the thing it is a
        // 'state' of has gone away: e.g. an undoable Olist has been deleted.

void dump(
        const char*     const name_p = NULL,   // pointer to object name
        const int       tabs = 0,              // nesting level
        ostream         &out = cout            // output stream
        );
        // Dumps this Undostate.  start_dump() and end_dump() are not called
        // because it is assumed that this is called from a higher class long undo_time() { return undotime;}
        // Used by derived classes in the clone() function of Olink
        // as well as Qpbase_area for determining what is to be undone.

protected:  // functions void set_undo_time(
        long        time
        )
        // Used by derived classes in the clone() function of Olink
        { undotime = time;}
};

//----------------------------------------------------------------
//                 Class Base_qparea
//---------------------------------------------------------------- class Base_qparea {
    // Class Base_qparea contains root functions that both visible and invisible
    // "areas" need to know how to do.

protected:  // data
    int         undo_level_d;       // the number of levels of undo state to keep
    long        undo_time_d;        // the undo "time" counter
    Undo_list   *undo_list_d;       // The history list of states to undo
    Undo_list   *redo_list_d;       // The future list of states to redo.  This
                                    // list is empty except between a call to
                                    // undo() and a call to either begin_undo()
                                    // or save_undo().
    Boolean     dont_add_undos;     // Flag says not to add anything to the undo list
                                    // This is TRUE during undo() and redo().
    Boolean     destroying_redo;    // Flag says that an Undostate destructor for
                                    // an Undostate on the redo list is in progress public:    // functions
//----------------------------------------------------------------
    Base_qparea(
        int         undo_level = 1,
        Heap        *hp = NULL
        );
        // This constructor makes a Base_qparea.
```

```
//------------------------------------------------------------------
    virtual ~Base_qparea();
        // destructor that kills off the area.
//------------------------------------------------------------------
    virtual void application_cmd(
        const Qpcmd        &cmd
        );
        // This function is called (by Qp_ui) to execute a command that belongs to
        // this area.

virtual Boolean item_available(
        short              assertion_id
        );
        // This function is called to test the validity of an assertion
        // from the qpath.int file.  The base class implementation always
        // returns TRUE.  For more information see item_available.h void execute_cmd(
        const Qpcmd    &cmd,
        Status         *status
        )
        // This non-virtual function is called (by Fe) to execute a command that
        // belongs to this area.  Since Fe knows the type of whom he is
        // calling this does not need to be virtual.
    {
        assert(FALSE, "execute_cmd() not implemented in base class");
        status = NULL;          // Keep compiler quiet
        const Qpcmd &shutup = cmd;   //    ditto
    }
//------------------------------------------------------------------
    virtual void post_message (
        const String   message
        );
        //      This posts a message that is made visible to the user.
        //      The default implementation is to pass it up to the parent area.
        //      The hope is that some ancestor area will display this message
        //      either in a message line, or will pop it up.
//------------------------------------------------------------------
    virtual Boolean undo();
        // Undo to the previous begin_undo() function call. Returns TRUE if the
        // undo was done, FALSE otherwise
//------------------------------------------------------------------
    virtual Boolean redo();
        // Redo the previous undo.  Returns TRUE if redo was done, FALSE otherwise.
//------------------------------------------------------------------
    virtual void set_undo_level(
        const int          undo_level
        );
        // Establishes the depth of state to maintain for undo.
//------------------------------------------------------------------
    virtual void begin_undo();
        // Marks the current state as the state that should be restored on a
        // subsequent undo().  This is the point at which the "undo_time"
        // counter is incremented and old saved state that falls off the end
        // of the undo_level is deleted.
//------------------------------------------------------------------
    void save_undo_state(
        Undostate                  *state
        );
        // This function puts a "state" onto the undo list.
        // The states are called in the REVERSE order in which they were
        // placed on the list when Qpbase_area::undo() is called.  If this
        // function is called while a redo() or undo() is in process then
        // it is ignored (since in reality the state is already on the undo
        // or redo list.  This is to facilitate undo_handlers that want to
        // use "normal" operations to manipulate their state; those "normal"
        // operations may well ask that undo state to be placed on the lists.)
//------------------------------------------------------------------
    long undo_time()
        { return undo_time_d; }
//------------------------------------------------------------------
    int undo_level()
        { return undo_level_d; }
//------------------------------------------------------------------
    Boolean redo_clear()
        // This function is used by (derived) Undostate virtual destructors
        // to determine whether secondary store should be deallocated or not.
        // If a delete of an Undostate is currently happening because of
        // deleting from the redo_list then this function will return TRUE.
        { return destroying_redo; }
//------------------------------------------------------------------
    void cleanup_undo(
        );
        // This function is called to remove all items on the undo
        // and redo lists that result in the undo_handler returning TRUE in
        // the CLEANUP_MODE.  The main usage of this is to
        // remove undostate's that no longer are valid; e.g. remove all the
        // undostate for an Olist when the Olist is destroyed.
//------------------------------------------------------------------
```

```
   void dump(
      const char *const name_p = NULL,    // pointer to object name
      const int       tabs = 0,           // nesting level
      ostream         &out = cout         // output stream
      );
      // dump internal data representation
//---------------------------------------------------------------------- private:  // functions void cleanup_undo_list();
      // cleans up old history from the undo list
};

// *********************************************************************
// *                                                                   *
// *          Classes Base_qparea_list and Base_qparea_scanner          *
// *                                                                   *
// *********************************************************************

//----------------------------------------------------------------------
// Declaration of class Base_qparea_list
//---------------------------------------------------------------------- class Base_qparea;
   // declared in /project/qpath/src/qpath.hm/loop.h class Base_qparea_list : public Qp_slist {

// singly linked list of Base_qparea * items
   // This class is derived from the Qp_slist protocol class. It provides
   // type checking of arguments and type conversions of return values
   // for the convenience of its clients.

friend class Base_qparea_scanner;

//---------------------------------------------------------------------- public:   // functions

Base_qparea_list() {}
      // Allocated on misc heap; base class initializes data.
   Base_qparea_list(Heap *heap_p);

void operator=(Base_qparea_list &src)
      { Qp_slist::operator=(src); }

Base_qparea_scanner *new_item_scanner()
      { return((Base_qparea_scanner *) Qp_slist::new_item_scanner()); } void add_item(Base_qparea *item_p)
      { Qp_slist::add_item(item_p); } void append_item(Base_qparea *new_item, Base_qparea_scanner *loc_p = NULL);

void insert_item(Base_qparea *new_item, Base_qparea_scanner *loc_p = NULL);

void append_list(Base_qparea_list &source, Base_qparea_scanner *loc_p = NULL);

void insert_list(Base_qparea_list &source, Base_qparea_scanner *loc_p = NULL);

Base_qparea *remove_item(Base_qparea_scanner *loc_p);

void operator+=(Base_qparea_list &src)
      { Qp_slist::operator+=(src); } int find(Base_qparea *item)
      { return(Qp_slist::find(item)); }

Base_qparea *&operator[](int i)
      { return((Base_qparea *&) Qp_slist::operator[](i)); }

Base_qparea *first()
      { return((Base_qparea *) Qp_slist::first()); }

Base_qparea *last()
      { return((Base_qparea *) Qp_slist::last()); }
};
//----------------------------------------------------------------------
// Declaration of class Base_qparea_scanner
//---------------------------------------------------------------------- class Base_qparea_scanner : public Qp_slist_scanner {

// scanner for singly linked list of Base_qparea * items
   // This class is derived from the Qp_slist_scanner protocol class. It
   // provides type checking of arguments and type conversions of return
   // values for the convenience of its clients.

friend class Base_qparea_list;

//---------------------------------------------------------------------- public:   // functions

Base_qparea_scanner() {}
      // Allocated on misc heap; base class initializes data.
```

```
    Base_qparea_scanner(Base_qparea_list &list) : (list) [];
        // Allocated on misc heap; base class initializes data.

void attach(Base_qparea_list &scan_list)
        [ Qp_slist_scanner::attach(scan_list); ]

void attach(Base_qparea_list *scan_list_p)
        [ Qp_slist_scanner::attach(*scan_list_p); ]

Base_qparea *&curr_item()
        [ return((Base_qparea *&) Qp_slist_scanner::curr_item()); ]

Boolean find(Base_qparea *item)
        [ return(Qp_slist_scanner::find(item)); ]
};

//-----------------------------------------------------------------------
// Definition of class Base_qparea_list inline functions
//-----------------------------------------------------------------------

// These inline functions are defined here rather than with the function
// declarations because they depend on the Base_qparea_scanner declaration.

inline void Base_qparea_list::append_item(Base_qparea *new_item, Base_qparea_scanner *loc_p)
    [ Qp_slist::append_item(new_item, loc_p); ]

inline void Base_qparea_list::insert_item(Base_qparea *new_item, Base_qparea_scanner *loc_p)
    [ Qp_slist::insert_item(new_item, loc_p); ]

inline void Base_qparea_list::append_list(Base_qparea_list &source, Base_qparea_scanner *loc_p)
    [ Qp_slist::append_list(source, loc_p); ]

inline void Base_qparea_list::insert_list(Base_qparea_list &source, Base_qparea_scanner *loc_p)
    [ Qp_slist::insert_list(source, loc_p); ]

inline Base_qparea *Base_qparea_list::remove_item(Base_qparea_scanner *loc_p)
    [ return((Base_qparea *) Qp_slist::remove_item(loc_p)); ]

#endif
/*
 * HEADER
 *     qparea.h - Declare class Qparea
 *
 * COPYRIGHT
 *     Copyright (C) 1988 Mentor Graphics Corporation
 *
 * DESCRIPTION
 *     This class is a (quite) abreviated version of the falcon area
 */ ifndef INCLUDED_QPAREA
define INCLUDED_QPAREA ifndef INCLUDED_STREAMH
include <stream.h>
endif ifndef INCLUDED_BASE_QPAREA
include <base_qparea.h>
endif ifndef INCLUDED_QP_SLIST
include <qp_slist.h>
endif ifndef INCLUDED_GEOM
include <geom.h>
endif ifndef INCLUDED_STRING
include <string.h>
endif class Window;        // declared (sort of) in vlhi.h
class Tss_image;     // declared (sort of) in vlhi.h
class Gss_image;     // declared (sort of) in vlhi.h
class Qparea;        // declared herein // ************************************************************************
// *                                                                      *
// *          Classes Qparea_list and Qparea_scanner                      *
// *                                                                      *
// ************************************************************************

//-----------------------------------------------------------------------
// Declaration of class Qparea_list
//-----------------------------------------------------------------------
```

```cpp
class Qparea;
    // declared in /project/qpath/src/qpath.hm/loop.h class Qparea_list : public Qp_slist {

// singly linked list of Qparea * items
        // This class is derived from the Qp_slist protocol class.  It provides
        // type checking of arguments and type conversions of return values
        // for the convenience of its clients.

friend class    Qparea_scanner;
//----------------------------------------------------------------------------- public:      // functions

Qparea_list() []
        // Allocated on misc heap; base class initializes data.
    Qparea_list(Heap *heap_p);

void operator=(Qparea_list &src)
        [ Qp_slist::operator=(src); ]

Qparea_scanner *new_item_scanner()
        [ return (Qparea_scanner *) Qp_slist::new_item_scanner(); ]

void add_item(Qparea *item_p)
        [ Qp_slist::add_item(item_p); ]

void append_item(Qparea *new_item, Qparea_scanner *loc_p = NULL);

void insert_item(Qparea *new_item, Qparea_scanner *loc_p = NULL);

void append_list(Qparea_list &source, Qparea_scanner *loc_p = NULL);

void insert_list(Qparea_list &source, Qparea_scanner *loc_p = NULL);

Qparea *remove_item(Qparea_scanner *loc_p);

void operator+=(Qparea_list &src)
        [ Qp_slist::operator+=(src); ]

int find(Qparea *item)
        [ return(Qp_slist::find(item)); ]

Qparea *&operator[](int i)
        [ return((Qparea *&) Qp_slist::operator[](i)); ]

Qparea *first()
        [ return((Qparea *) Qp_slist::first()); ]

Qparea *last()
        [ return((Qparea *) Qp_slist::last()); ]
};

//-----------------------------------------------------------------------------
// Declaration of class Qparea_scanner
//----------------------------------------------------------------------------- class Qparea_scanner : public Qp_slist_scanner {

// scanner for singly linked list of Qparea * items
        // This class is derived from the Qp_slist_scanner protocol class.  It
        // provides type checking of arguments and type conversions of return
        // values for the convenience of its clients.

friend class    Qparea_list;
//----------------------------------------------------------------------------- public:  // functions
    Qparea_scanner() []
        // Allocated on misc heap; base class initializes data.
    Qparea_scanner(Qparea_list &list) : (list) [];
        // Allocated on misc heap; base class initializes data.

void attach(Qparea_list &scan_list)
        [ Qp_slist_scanner::attach(scan_list); ]

void attach(Qparea_list *scan_list_p)
        [ Qp_slist_scanner::attach(*scan_list_p); ]

Qparea *&curr_item()
        [ return((Qparea *&) Qp_slist_scanner::curr_item()); ]

Boolean find(Qparea *item)
        [ return(Qp_slist_scanner::find(item)); ]
};
```

```
//----------------------------------------------------------------------
// Definition of class Qparea_list inline functions
//----------------------------------------------------------------------

// These inline functions are defined here rather than with the function
// declarations because they depend on the Qparea_scanner declaration.

inline void Qparea_list::append_item(Qparea *new_item, Qparea_scanner *loc_p)
    { Qp_slist::append_item(new_item, loc_p); } inline void Qparea_list::insert_item(Qparea *new_item, Qparea_scanner *loc_p)
    { Qp_slist::insert_item(new_item, loc_p); } inline void Qparea_list::append_list(Qparea_list &source, Qparea_scanner *loc_p)
    { Qp_slist::append_list(source, loc_p); } inline void Qparea_list::insert_list(Qparea_list &source, Qparea_scanner *loc_p)
    { Qp_slist::insert_list(source, loc_p); } inline Qparea *Qparea_list::remove_item(Qparea_scanner *loc_p)
    { return((Qparea *) Qp_slist::remove_item(loc_p)); }

// ************************************************************************
// *                                                                      *
// *                           Class Qparea                                *
// *                                                                      *
// ************************************************************************

//----------------------------------------------------------------------
// Declaration of class Qparea
//----------------------------------------------------------------------
class Border_list;

class Qparea : public Base_qparea { protected:       // data
    Window        *win_ptr;
    Boolean        graphic;         // TRUE if this is a graphics window, else FALSE.
    Qparea        *parent_p;        // My parent in the area hierarchy
    Qparea_list    sub_areas;       // My children areas
    Border_list   *borders;         // list of borders for my children areas.
public:     // functions
//----------------------------------------------------------------------
    Qparea(
        const String      &name,            // the name for this window
        const Qparea      *parent,          // parent for this one.  NULL is ok,
                                            // but means that you are the session
                                            // area...
        Boolean           text = TRUE,      // If true create a text area,
                                            // otherwise a graphics area.
        long              x0 = 0,           // initial left x pos of image
        long              y0 = 0,           // initial top y of image in window
        long              scale = 1         // initial scale of the picture in window
                                            // ignore if text window
        );
        // Constructs a new Qparea.  Creates the window and image and displays
        // it.  The location of the window is managed by the area_border list,
        // which can be manipulated with READ WINDOW or set_default_border.
        // If a window by 'name' already exists a name will be constructed that
        // makes it unique (in v1 by appending '#n')
//----------------------------------------------------------------------
    virtual ~Qparea();
        // destructor that kills off the window and the area.
        // This also deletes the image in the area!

//----------------------------DATA INQUIRY FUNCTIONS----------------------
    operator Window*()
        { return win_ptr; }

Window *win()
        // Returns the window pointer
        { return win_ptr; }

Boolean text_area()
        // Returns TRUE if this is a text area
        { return !graphic; } virtual Tss_image *text_image();
    virtual Gss_image *graphic_image();
        // These two functions return the image that is in the
        // underlying window.  In the base class implementation
        // it is asserted that the type of area is appropriate
        // for the type of function being called.

Rectangle exterior();
        // Returns the exterior border of this area.
```

```cpp
    String instance_name();
        // Returns name of this area.

Qparea *parent_area()
        { return parent_p; }

Boolean has_sub_areas()
        { return (sub_areas.nitems() > 0);}

Qparea_scanner subarea_scanner()
        { return Qparea_scanner(sub_areas);}

Qparea     *find_area(
        String      area_name
        );
        //  Find the area with the specified name
        //  This returns either this area or one of its descendent areas.
        //  If there is no such area, NULL is returned.

Qparea      *find_area(
        Window              *win_ptr
        );
        // Find the area with the window in it.  Please don't use the horrible
        // vl-ism unless you have an awfully good reason (e.g. performance in
        // the LPX and LPY system function handlers)
//-------------------------------DATA INSERTION FUNCTIONS------------------------
    void add_sub_area(
        Qparea          *sub_area_p
        );
        // Add a sub area to this one's list.  This is normally only used by the
        // constructor of an area.

void remove_sub_area(
        Qparea          *sub_area_p
        );
        // Revove this subarea from my list.  This is normally only used by the
        // destructor of an area.

Boolean set_border(
        const String            &area_name,
        const Rectangle     &border
        );
        // Establish a border for the given area name.  The borders are managed
        // on a LIFO basis, so only the root name of the area is significant.
        // Returns TRUE if this was one of my children areas and I successfully
        // established the border, or FALSE if I don't recognize this one
        // This is a hierarchical function.

void set_default_border(
        const String            &area_type_name,
        const Rectangle     &border
        );
        // This sets the default border for a type of area. (The type being
        // determined by the name).  The default border is used when no further
        // borders exist on the LIFO buffer of borders.
        // set_default_border() should only be called once for each area_type_name.
        // area_type_name should be the root name for the area (e.g. Pathlist,
        // Context) and not an instance name (e.g. Pathlist#1, etc.)
//----------------------------------SERVICE FUNCTIONS----------------------------
    void application_cmd(
        const Qpcmd             &cmd
        );
        // Overloads the Base_qparea:: function to dispatch to my parent if the
        // derived class does not overload it.

void post_message(
        const String            message
        );
        // Overloads the Base_qparea:: function to dispatch to my parent if the
        // derived class does not overload it.
//----------------------------------DUMP, ETC, FUNCTIONS-------------------------
    virtual void dump(
        const char *const name_p = NULL,    // pointer to object name
        const int           tabs = 0,        // nesting level
        ostream             &out = cout      // output stream
        );
        // dump internal data representation
};

#endif
/*
* HEADER
*    hilite_qparea.h - Declare class Hilite_qparea
*
* COPYRIGHT
*    Copyright (C) 1988 Mentor Graphics Corporation
*
```

```
* DESCRIPTION
*    This class declares an area that knows how to hilite design objects
*
*/ ifndef INCLUDED_HILITE_QPAREA
define INCLUDED_HILITE_QPAREA ifndef INCLUDED_STREAMH
include <stream.h>
endif ifndef INCLUDED_QPAREA
include <qparea.h>
endif ifndef INCLUDED_QPBASE
include <qpbase.h>
endif
// ******************************************************************************
// *                                                                            *
// *                          Class Hilite_qparea                               *
// *                                                                            *
// ******************************************************************************

//------------------------------------------------------------------------------
// Declaration of class Hilite_qparea
//------------------------------------------------------------------------------
class Ciinst;
class Cinet;
class Inst_ref;
class Net_ref;
class Pin_ref;
class Wcpath_ref;
class Dlypath_ref;
class Lngtable;
class Hilitable;

class Hilite_qparea : public Qparea {
    // Class Hilite_qparea defines the interface to areas that are capable of
    // hiliting selected objects.
private:     // data
    Lngtable*       hash_tables[SEL_NULL_TYPE];

public:      // functions
//------------------------------------------------------------------------------
    Hilite_qparea(
        const String       &name,            // the name for this window
        const Qparea       *parent,          // parent area for this area
        Boolean            text,             // If true create a text area,
                                             // otherwise a graphics area.
        long               x0 = 0,           // initial left x pos of image
        long               y0 = 0,           // initial top y of image in window
        long               scale = 1         // initial scale of the picture in window
                                             // ignore if text window
    );
    // Constructs a new Hilite_qparea.  Creates the window and image and displays
    // it at the indicated coordinates/scale.  If a window by 'name' already
    // exists a name will be constructed that makes it unique (in v1 by
    // appending '#n'.
    //
    // Note that this is the same constructor as the base class.

virtual ~Hilite_qparea();
    // Destructor

//------------------------------DATA INSERTION FUNCTIONS------------------------

// These functions add and remove from the hash table of hilitables.  Objects
// which are derived from class Hilitable can put themselves in this hash
// table and will have their hilite() functions called whenever the corresponding
// design object is to be hilited.  These services will eliminate the need for
// relatively simple hilitable areas to overload the hilite() and unhilite()
// functions, below.
//
// Note that more than one Hilitable can be associated with the same design
// object, but that only one design object of a given type can be associated
// with a given hilitable.  A hilitable can hilite both an (e.g.) net and a pin,
// however.

void add_hilitable(
        Ciinst     *inst,
        Hilitable  *object
    );

void add_hilitable(
        Inst_ref   &inst,
        Hilitable  *object
```

```
    );
void add_hilitable(
    Net_ref     &net,
    Hilitable   *object
    );

void add_hilitable(
    Pin_ref     &pin,
    Hilitable   *object
    );

Dlypath_ref    &dlypath
    );
    // Unhilite the given path, if it is in this area.

virtual void unhilite(
    Selmgr_type    type,
    long           key
    );

//--- Functions for all hiliting virtual void finish_hilites();
    // This function is called when all calls to the (un)hilite() functions above
    // have been made.  It can be used as an optimization to queue up the
    // hilites rather than doing them one at a time.  In the
    // base class it does nothing.

virtual void hilite_all_selections();
    // hilite all selected objects.  This is used when the area is constructed
    // to initialize its hilite state.  This function is implemented in terms
    // of the other hiliting functions in the base class.

virtual void unhilite_all(
    Selmgr_type        type = SEL_NULL_TYPE
    );
    // Clear all hilites on objects of the specified type.  If type is
    // SEL_NULL_TYPE then unhilite everything.
    // This function is implemented in terms of the other unhiliting
    // functions in the base class.

//----------------------------------------------------------------------
void dump(
    const char *const name_p = NULL,   // pointer to object name
    const int         tabs = 0,        // nesting level
    ostream           &out = cout      // output stream
    );
    // dump internal data representation
//--------------------------PRIVATE FUNCTIONS---------------------------
protected:    // Functions void add_hilitable(
    Selmgr_type    type,
    long           key,
    Hilitable      *object
    );

void remove_hilitable(
    Selmgr_type    type,
    long           key,
    Hilitable      *object
    );

// The following are the base class hiliting functions.
void hilite_base(
    Selmgr_type    type,
    long           key
    );

void unhilite_base(
    Selmgr_type    type,
    // provided since there is not an Inst_ref for non-primitive instances.

virtual void hilite(
    Inst_ref    &inst
    );
    // Hilite the given instance, if it is in this area.

virtual void hilite(
    Net_ref    &net
    );
    // Hilite the given net, if it is in this area.

virtual void hilite(
    Pin_ref    &pin
    );
    // Hilite the given pin, if it is in this area.
```

```
    virtual void hilite(
        Wcpath_ref     &wcpath
    );
    // Hilite the given path, if it is in this area.

virtual void hilite(
        Dlypath_ref    &dlypath
    );
    // Hilite the given path, if it is in this area.

virtual void hilite(
        Selmgr_type    type,
        long           key
    );

//----------- unhiliting functions virtual void unhilite(
        Ciinst    *inst
    );
    // Unhilite the given instance, if it is in this area.

virtual void unhilite(
        Inst_ref    &inst
    );
    // Unhilite the given instance, if it is in this area.

virtual void unhilite(
        Net_ref    &net
    );
    // Unhilite the given net, if it is in this area.

virtual void unhilite(
        Pin_ref    &pin
    );
    // Unhilite the given pin, if it is in this area.

virtual void unhilite(
        Wcpath_ref    &wcpath
    );
    // Ununhilite the given path, if it is in this area.

virtual void unhilite(
    void add_hilitable(
        Wcpath_ref &wcpath,
        Hilitable  *object
    );

void add_hilitable(
        Dlypath_ref &dlypath,
        Hilitable   *object
    );

//---- Removing Hilitables void remove_hilitable(
        Ciinst     *inst,
        Hilitable  *object
    );

void remove_hilitable(
        Inst_ref   &inst,
        Hilitable  *object
    );

void remove_hilitable(
        Net_ref    &net,
        Hilitable  *object
    );

void remove_hilitable(
        Pin_ref    &pin,
        Hilitable  *object
    );

void remove_hilitable(
        Wcpath_ref &wcpath,
        Hilitable  *object
    );

void remove_hilitable(
        Dlypath_ref &dlypath,
        Hilitable   *object
    );

void clear_hilitables();
    // Clear the hash tables.  This would normally only be called when the
    // derived area was deleting an entire image and rebuilding it.
```

```
//-----------------------HILITING FUNCTIONS-----------------------------

// The hiliting functions are called to (un)hilite an object in the area.  There
// are separate functions for each of the types of object.  In a typical
// (un)selection operation several calls will be made to these functions, but
// they will always be followed by a call to finish_hilites().
//
// All these functions are implemented in the base class using the hash tables
// in this class.    Clients may choose to overload them for efficiency, however.

virtual void hilite(
        Ciinst      *inst
    );
        // Hilite the given instance, if it is in this area.  This function is
        long              key
    );

//-----------------------------------------------------------------------
};

#endif
```

1. A screen display for displaying a signal path through a circuit, the signal path having multiple portions that appear on separate schematic sheets of the circuit, comprising:
   a first display portion for graphically displaying a path portion apart from a schematic sheet of the circuit; and
   at least a second portion for graphically displaying a path portion apart from another schematic sheet of the circuit,
   the multiple display portions arranged adjacent to each other to display the signal path in its entirety apart from the schematic sheets.

2. The screen display of claim 1 including sheet identifiers in each display portion for identifying the schematic sheet for each portion of the displayed signal path.

3. The screen display of claim 1 including a schematic sheet display for displaying the schematic sheet of a path portion in response to a selection of the path portion from the displayed signal path.

4. The screen display of claim 1 including a path list display for displaying a list of the signal paths for selection of a critical path.

5. The screen display of claim 1 in which the displayed signal path appears in contrasting indicia to the display background for highlighting the displayed path.

6. The screen display of claim 1 including a component symbol displayed adjacent each path portion that travels through a path component having a separate schematic sheet.

7. A screen display for displaying a signal path through a circuit, the signal path having multiple portions that appear on separate schematic sheets of the circuit, comprising:
   a first display portion for graphically displaying a path portion appearing on a schematic sheet of the circuit;
   at least a second portion for graphically displaying a path portion appearing on another schematic sheet of the circuit; and
   separators appearing between each portion of the displayed signal path indicating a transition from one schematic sheet to another,
   the multiple display portions arranged adjacent to each other to display the signal path in its entirety apart from the schematic sheets.

8. The screen display of claim 7 in which the schematic sheets are arranged in a hierarchy of circuit design levels and the separators are constructed to indicate a transition to another sheet at the same design level or another sheet at a different design level for each portion of the signal path.

9. Apparatus for displaying a signal path through a circuit, the signal path having multiple portions that appear on separate schematic sheets of the circuit, comprising:
   path means for accepting data defining at least one signal path in the circuit; and
   display generator means in communication with the path means for producing a display of the signal path entirely in a path context window apart from the schematic sheets of the circuit.

10. The apparatus of claim 9 including means for generating sheet indentifiers for identifying in the screen display the schematic sheet for each portion of the displayed signal path.

11. The apparatus of claim 9 including schematic sheet generator means responsive to a selection of a portion of the displayed signal path for producing in the screen display the schematic sheet of the selected path portion.

12. The apparatus of claim 9 including analyzing means for determining from the path means which of the defined signal paths are considered critical, the display generator means being responsive to the selection of a critical path for producing a display of the selected critical path.

13. The apparatus of claim 9 including path list generating means for producing in the screen display a list of the signal paths for selection of a critical path.

14. The apparatus of claim 9 including indicia means for displaying the selected signal path in contrasting indicia to the single display for highlighting the selected path.

15. The apparatus of claim 9 including symbol generating means means for producing a component symbol in the single display adjacent to each path portion that travels through a component having a separate schematic sheet.

16. Apparatus for displaying a signal path through a circuit, the signal path having multiple portions that appear on separate schematic sheets of the circuit, comprising:
   path means for accepting data defining at least one signal path in the circuit;
   display generator means in communication with the path means for producing a display of the signal path entirely in a screen display apart from the schematic sheets of the circuit; and separator generator means for producing separators in the screen display appearing between each portion of the displayed signal path for indicating a transition from one schematic sheet to another.

17. Apparatus for analyzing the timing of signals propagated along signal paths through a circuit, each signal path having portions that appear on separate schematic sheets of the circuit, comprising:
- path means for accepting data defining signal paths in the circuit;
- analyzing means for determining from the path means which of the defined signal paths are considered critical for timing;
- display generator means responsive to selection of a critical path for producing a display of the signal path entirely in a screen display apart from the schematic sheets of the circuit.

18. Apparatus for analyzing the timing of signals propagated along signal paths through a circuit, each signal path having portions that appear on separate schematic sheets of the circuit, comprising:
- path means for accepting data defining signal paths in the circuit;
- analyzing means for determining from the path means which of the defined signal paths are considered critical for timing;
- display generator means responsive to selection of a critical path for producing a display of the signal path entirely in a screen display apart from the schematic sheets of the circuit of the circuit; and
- path list generator means for producing in the screen display a list of the critical signal paths for selection of a critical path.

19. A method of displaying a signal path through a circuit, the signal path having multiple portions that appear on separate schematic sheets of the circuit, comprising:
- displaying a path portion apart from a first schematic sheet;
- simultaneously displaying another path portion apart from another schematic sheet of the circuit; and
- positioning the path portions adjacent to each other to display the signal path in its entirety apart from the schematic sheets.

20. The method of claim 19 including displaying separators between each path portion of the displayed signal path for indicating a transition from one schematic sheet to another.

21. The method of claim 20 in which the schematic sheets are arranged in a hierarchy of circuit design levels, the method including displaying separators to indicate a transition to another sheet at the same design level or another sheet at a different design level for each path portion of the displayed signal path.

22. The method of claim 19 including displaying a schematic sheet of a path portion in response to a selection of the path portion from the displayed signal path.

23. The method of claim 19 including displaying a path list of the signal paths for selection.

24. The method of claim 19 including displaying the signal path in contrasting indicia to the display background to highlight the path.

25. The method of claim 19 including displaying a component symbol adjacent to each path portion that travels through a component having a separate schematic sheet.

26. A method of displaying a signal path through a circuit, the signal path having multiple portions that appear on separate schematic sheets of the circuit, comprising:
- displaying a portion from a first schematic sheet;
- simultaneously displaying another portion from another schematic sheet of the circuit;
- positioning the path portions adjacent to each other to display the signal path in its entirety; and
- displaying sheet identifiers adjacent to each path portion of the displayed signal path for identifying the schematic sheet for each path portion.

27. A method of analyzing the timing of signals propagated along signal paths through a circuit, each signal path having portions that appear on separate schematic sheets of the circuit, comprising:
- accepting data defining signal paths in the circuit;
- determining from the data which of the defined signal paths are considered critical for timing;
- displaying in response to the selection of a critical path a display of the signal path entirely in a screen display apart from the schematic sheets of the circuit.

28. A method of analyzing the timing of signals propagated signal paths through a circuit, each signal path having portions that appear on separate schematic sheets of the circuit, comprising:
- accepting data defining signal paths in the circuit;
- determining from the data which of the defined signal paths are considered critical for timing;
- displaying in response to the selection of a critical path a display of the signal path entirely in a screen display apart from the schematic sheets of the circuit; and
- displaying in the screen display a list of the critical paths for selection of a critical path.

* * * * *

UNITED STATES PATENT AND TRADEMARK OFFICE
CERTIFICATE OF CORRECTION

PATENT NO. : 4,970,664

DATED : November 13, 1990

INVENTOR(S) : Richard B. Kaiser, et al

It is certified that error appears in the above-identified patent and that said Letters Patent is hereby corrected as shown below:

Columns 9-10 and 143-144; missing copyright language--©1988 Mentor Graphics Corporation--.

Column 144, line 56; delete second "means".

Column 145, line 30; delete second "of the circuit".

Signed and Sealed this

Thirteenth Day of October, 1992

Attest:

DOUGLAS B. COMER

Attesting Officer

Acting Commissioner of Patents and Trademarks